(12) United States Patent
Nosaka

(10) Patent No.: US 11,139,798 B2
(45) Date of Patent: *Oct. 5, 2021

(54) RADIO-FREQUENCY FILTER, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/727,679

(22) Filed: Dec. 26, 2019

(65) Prior Publication Data

US 2020/0136590 A1 Apr. 30, 2020

Related U.S. Application Data

(63) Continuation of application No. PCT/JP2018/021907, filed on Jun. 7, 2018.

(30) Foreign Application Priority Data

Jun. 28, 2017 (JP) .............................. JP2017-126815

(51) Int. Cl.
*H03H 9/64* (2006.01)
*H03H 9/205* (2006.01)

(52) U.S. Cl.
CPC .......... *H03H 9/6403* (2013.01); *H03H 9/205* (2013.01); *H03H 9/6479* (2013.01); *H03H 9/6483* (2013.01)

(58) Field of Classification Search
CPC . H03H 9/64; H03H 9/54; H03H 11/04; H03H 7/01
See application file for complete search history.

(56) References Cited

U.S. PATENT DOCUMENTS 10,911,027 B2 * 2/2021 Nosaka ................. H03H 11/04
2009/0251235 A1 10/2009 Belot et al.

FOREIGN PATENT DOCUMENTS

JP 1998-336000 A 12/1998
JP 11-340783 A 12/1999
(Continued)

OTHER PUBLICATIONS

English Translation of the Written Opinion of the International Search Authority dated Aug. 21, 2018 for PCT/JP2018/021907.
(Continued)

*Primary Examiner* — Dean O Takaoka
(74) *Attorney, Agent, or Firm* — Xsensus LLP

(57) ABSTRACT

A filter includes: a series-arm circuit; a first parallel-arm circuit connected to a ground and a node; and a second parallel-arm circuit connected to the ground and a node. The first parallel-arm circuit includes a parallel-arm resonator, and a first switch circuit. The second parallel-arm circuit includes a parallel-arm resonator, and a second switch circuit. The first switch circuit includes a first switch. The second switch circuit includes a second switch. A voltage across the first switch is lower than a voltage across the second switch. A stack count of the first switch is lower than a stack count of the second switch.

20 Claims, 28 Drawing Sheets

(56) References Cited

FOREIGN PATENT DOCUMENTS

| JP | 2008-181911 A | 8/2008 |
| JP | 2008-288741 A | 11/2008 |
| JP | 2008-306359 A | 12/2008 |
| JP | 2010-062816 A | 3/2010 |
| JP | 2011-249466 A | 12/2011 |
| WO | 2016/190216 A1 | 12/2016 |

OTHER PUBLICATIONS

International Search Report and Written Opinion dated Aug. 21, 2018 for PCT/JP2018/021907 filed on Jun. 7, 2018, 9 pages including English Translation of the International Search Report.

* cited by examiner

Comparative Example 1

[When B27Rx is used]
　　SW1a: On
　　SW2a: On
　　SW3a: On
　　SW4a: On

[When B26Rx is used]
　　SW1a: Off
　　SW2a: Off
　　SW3a: Off
　　SW4a: Off

Example 1

[When B27Rx is used]
SW1a: On
SW2a: On
SW3a: On
SW4a: On

[When B26Rx is used]
SW1a: Off
SW2a: Off
SW3a: Off
SW4a: Off

Comparative Example 4

[When B11Rx is used]
SW1a: On
SW2a: On
SW3a: On
SW4a: On

[When B21Rx is used]
SW1a: Off
SW2a: Off
SW3a: Off
SW4a: Off

Comparative Example 5

[When B28aTx is used]
 SW1a: On
 SW2a: On
 SW3a: On
 SW4a: On

[When B28bTx is used]
 SW1a: Off
 SW2a: Off
 SW3a: Off
 SW4a: Off

Example 5

[When B28aTx is used]
SW1a: On
SW2a: On
SW3a: On
SW4a: On

[When B28bTx is used]
SW1a: Off
SW2a: Off
SW3a: Off
SW4a: Off

RADIO-FREQUENCY FILTER, MULTIPLEXER, RADIO-FREQUENCY FRONT-END CIRCUIT, AND COMMUNICATION DEVICE

CROSS REFERENCE TO RELATED APPLICATIONS

This is a continuation application of PCT International Application No. PCT/JP2018/021907, filed on Jun. 7, 2018, designating the United States of America, which is based on and claims priority of Japanese Patent Application No. 2017-126815, filed on Jun. 28, 2017. The entire disclosures of the above-identified applications, including the specifications, drawings and claims are incorporated herein by reference in their entirety.

FIELD

The present disclosure relates to a high-frequency filter that includes a resonator, a multiplexer, a high-frequency front-end circuit, and a communication device.

BACKGROUND

Conventionally, a frequency-tunable high-frequency filter (tunable filter) is proposed as a high-frequency filter that supports multiband communication.

Such a frequency-tunable high-frequency filter includes a ladder circuit that includes a plurality of series-arm circuits and a plurality of parallel-arm circuits. A known configuration of such a parallel-arm circuit includes a parallel-arm resonator connected in series to a circuit constituted by a capacitor and a switch element connected in parallel (for example, see Patent Literature (PTL) 1.

According to the above conventional configuration, switching between a conducting state (on) and a non-conducting state (off) of a switch changes a resonant frequency that is a singular point at which impedance of the parallel-arm circuit has a local minimum value, and thus the frequency of the attenuation pole according to the resonant frequency can be changed.

CITATION LIST

Patent Literature

PTL 1: U.S. Unexamined Patent Application Publication No. 2009/0251235.

SUMMARY

Technical Problem

When the high-frequency filter described above is applied as, for example, a transmission filter, the high-frequency filter is required to have power durability. In order to improve power durability of a high-frequency filter, power durability of a parallel-arm circuit needs to be improved. In improving power durability of a parallel-arm circuit, it is important to improve not only power durability of a parallel-arm resonator, but also power durability of a switch included in the parallel-arm circuit.

However, conventionally, when such a high-frequency filter is applied to a multiband system, reduction in size of the switch and loss when the switch is conducting are priority issues, and a configuration that improves power durability, which is in a trade-off relationship with the reduction in size of the switch and loss, has not been examined.

In view of this, the present disclosure is directed to a high-frequency filter for which power durability is ensured, a multiplexer, a high frequency front-end circuit, and a communication device, while achieving reduction in size of a switch and loss when the switch of a parallel-arm circuit is conducting.

Solution to Problem

In order to provide such a filter, a high-frequency filter according to an aspect of the present disclosure includes: a series-arm circuit disposed on a path that connects a first input/output terminal and a second input/output terminal; a first parallel-arm circuit connected to a ground and a first node on the path, between the first input/output terminal and the series-arm circuit; and a second parallel-arm circuit connected to the ground and a second node on the path, between the series-arm circuit and the second input/output terminal. The first parallel-arm circuit includes a first parallel-arm resonator, and a first switch circuit connected in series to the first parallel-arm resonator. The second parallel-arm circuit includes a second parallel-arm resonator, and a second switch circuit connected in series to the second parallel-arm resonator. The first switch circuit includes a first switch element that includes one or more semiconductor elements connected in series. The second switch circuit includes a second switch element that includes one or more semiconductor elements connected in series. A voltage across the first switch element is lower than a voltage across the second switch element. A first stack count that is a total number of the one or more semiconductor elements connected in series and included in the first switch element is lower than a second stack count that is a total number of the one or more semiconductor elements connected in series and included in the second switch.

In the frequency-tunable high-frequency filter having the above circuit configuration, in order to ensure power durability against high-frequency input power, the stack count of the first switch element is made lower than the stack count of the second switch element, as compared with a conventional configuration in which all the switch elements are equally configured, that is, are given the same stack count. Accordingly, reducing the stack count of the first switch element makes the high-frequency filter smaller than the conventional frequency-tunable high-frequency filter. In addition, resistance of the first switch element in the on state can be decreased by relatively reducing the stack count of the first switch element, and thus passband insertion loss of the high-frequency filter when the first switch element is on can be reduced. Thus, power durability properties can be ensured while achieving reduction in size of the filter and loss when the switches of the first parallel-arm circuit and the second parallel-arm circuit are conducting.

The voltage across the first switch element may be dependent on a resonant frequency of the first parallel-arm resonator, and a high-frequency power application direction that indicates which of the first input/output terminal and the second input/output terminal high-frequency power is applied through, and the voltage across the second switch element may be dependent on a resonant frequency of the second parallel-arm resonator and the high-frequency power application direction.

For example, when high-frequency power is applied through the second input/output terminal, a high-frequency voltage due to the application of the high-frequency power is higher as closer to the second input/output terminal. Stated differently, when high-frequency power is applied through the second input/output terminal, the high-frequency voltage applied to the second parallel-arm circuit is higher than the high-frequency voltage applied to the first parallel-arm circuit. Further, the high-frequency voltage applied to the second parallel-arm circuit is divided by the second parallel-arm resonator and the second switch circuit, yet the ratio at which the voltage is divided depends on the impedance of the second parallel-arm resonator and the second switch circuit. Impedance of the second parallel-arm resonator greatly changes due to the resonant frequency and the antiresonant frequency, and thus out of the high-frequency voltage applied to the second parallel-arm circuit, a divided high-frequency voltage applied to the second switch circuit changes according to resonance characteristics of the second parallel-arm resonator. Thus, the magnitude of a voltage across a switch element is dependent on which of the first input/output terminal and the second input/output terminal high-frequency power is applied through (high-frequency power application direction), and the resonant frequency of a parallel-arm resonator.

Power durability properties can be ensured while achieving reduction in size of the filter and loss when the switches of the first parallel-arm circuit and the second parallel-arm circuit are conducting, by determining the stack count of a switch element according to a voltage across the switch element that is dependent on the high-frequency power application direction and the resonant frequency of the parallel arm resonator.

The one or more semiconductor elements included in the first switch element may be one or more transistors, the one or more semiconductor elements included in the second switch element may be one or more transistors, and a gate width of each of the one or more transistors included in the second switch element may be greater than a gate width of at least one of the one or more transistors included in the first switch element.

According to this, when the gate width of the first switch element and the gate width of the second switch element are the same, the second switch element having a higher stack count has high resistance in the conducting state, and thus the resistance of the second switch element in the conducting state can be reduced by making the gate width of the second switch element greater than that of the first switch element. Accordingly, passband insertion loss of the high-frequency filter when the switch element is conducting can be reduced.

High-frequency power may be applied to the high-frequency filter through the second input/output terminal.

Accordingly, a total stack count of semiconductor elements of a switch element used for the high-frequency filter can be decreased, and thus reduction in size of the filter and passband insertion loss when the switch element is conducting can be achieved.

The first switch circuit may further include a first capacitor connected in parallel to the first switch element, and the second switch circuit may further include a second capacitor connected in parallel to the second switch element.

Accordingly, switching between conducting and non-conducting states of a switch element can switch (change) the frequency of the attenuation pole on a passband low-frequency side to another frequency.

The first switch circuit may further include: a first inductor connected in series to the first switch element; and a first capacitor connected in parallel to a circuit constituted by the first inductor and the first switch element connected in series. The second switch circuit may further include: a second inductor connected in series to the second switch element; and a second capacitor connected in parallel to a circuit constituted by the second inductor and the second switch element connected in series.

Accordingly, this increases a range in which the frequency of the attenuation pole on the passband low-frequency side can be changed.

The first switch circuit may include a plurality of circuits each of which is the circuit constituted by the first inductor and the first switch element connected in series, and the second switch circuit may include a plurality of circuits each of which is the circuit constituted by the second inductor and the second switch element connected in series.

Accordingly, the frequency of the attenuation pole on the passband low-frequency side can be changed finely.

A resonant frequency of the first parallel-arm circuit when the first switch element is non-conducting may be lower than a resonant frequency of the second parallel-arm circuit when the second switch element is non-conducting.

Accordingly, the lower the resonant frequency of a parallel-arm circuit when a switch element is non-conducting, the lower a voltage applied to the switch element of the parallel-arm circuit is. Thus, the stack count of semiconductor elements in the first switch element of the first parallel-arm circuit having a lower resonant frequency can be decreased, and reduction in size of the filter and passband insertion loss when the switch element is conducting can be achieved.

The first parallel-arm circuit may further include a third parallel-arm resonator connected in parallel to a circuit constituted by the first parallel-arm resonator and the first switch circuit connected in series. The second parallel-arm circuit may further include a fourth parallel-arm resonator connected in parallel to a circuit constituted by the second parallel-arm resonator and the second switch circuit connected in series. A resonant frequency of the first parallel-arm resonator may be lower than a resonant frequency of the third parallel-arm resonator. An antiresonant frequency of the first parallel-arm resonator may be lower than an antiresonant frequency of the third parallel-arm resonator. A resonant frequency of the second parallel-arm resonator may be lower than a resonant frequency of the fourth parallel-arm resonator. An antiresonant frequency of the second parallel-arm resonator may be lower than an antiresonant frequency of the fourth parallel-arm resonator.

Power durability properties that the high-frequency filter is to have are ensured, and also reduction in size and passband insertion loss when a switch element is conducting can be achieved. Furthermore, the frequency of the attenuation pole on the passband low-frequency side can be changed without increasing insertion loss at a passband low-frequency edge.

A resonant frequency of the first parallel-arm circuit when the first switch element is non-conducting may be lower than a resonant frequency of the second parallel-arm circuit when the second switch element is non-conducting.

Accordingly, the lower the resonant frequency of a parallel-arm circuit when a switch element is non-conducting, the lower a voltage applied to the switch element of the parallel-arm circuit is. Thus, the stack count of semiconductor elements in the switch element in the parallel-arm circuit having a lower resonant frequency when the switch element is non-conducting can be decreased, and reduction in size of the filter and passband insertion loss when the switch element is conducting can be achieved.

The first parallel-arm circuit may further include a third parallel-arm resonator connected in parallel to a circuit constituted by the first parallel-arm resonator and the first switch circuit connected in series. The second parallel-arm circuit may further include a fourth parallel-arm resonator connected in parallel to a circuit constituted by the second parallel-arm resonator and the second switch circuit connected in series. A resonant frequency of the first parallel-arm resonator may be higher than a resonant frequency of the third parallel-arm resonator. An antiresonant frequency of the first parallel-arm resonator may be higher than an antiresonant frequency of the third parallel-arm resonator. A resonant frequency of the second parallel-arm resonator may be higher than a resonant frequency of the fourth parallel-arm resonator. An antiresonant frequency of the second parallel-arm resonator may be higher than an antiresonant frequency of the fourth parallel-arm resonator.

Accordingly, power durability properties that the high-frequency filter is to have are ensured, and also reduction in size of the filter and passband insertion loss when a switch element is conducting can be achieved. Furthermore, the frequency of the attenuation pole on a passband high-frequency side can be changed without increasing insertion loss at a passband high-frequency edge.

A resonant frequency of the first parallel-arm circuit when the first switch element is non-conducting may be higher than a resonant frequency of the second parallel-arm circuit when the second switch element is non-conducting.

Accordingly, the higher a higher resonant frequency of a parallel-arm circuit when a switch element is non-conducting, the lower a voltage applied to the switch element of the parallel-arm circuit is. Thus, the stack count of semiconductor elements in the switch element in the parallel-arm circuit whose higher resonant frequency is high when the switch element is non-conducting can be decreased, and reduction in size of the filter and passband insertion loss when the switch element is conducting can be achieved.

The first parallel-arm circuit may further include: a third parallel-arm resonator; and a third switch circuit connected in series to the third parallel-arm resonator. The second parallel-arm circuit may further include: a fourth parallel-arm resonator; and a fourth switch circuit connected in series to the fourth parallel-arm resonator. The third switch circuit may include: a third capacitor; and a third switch element that is connected to the third capacitor, and includes one or more semiconductor elements connected in series. The fourth switch circuit may include: a fourth capacitor; and a fourth switch element that is connected to the fourth capacitor, and includes one or more semiconductor elements connected in series. An impedance of the third switch circuit may be changed by switching between a conducting state and a non-conducting state of the third switch element. An impedance of the fourth switch circuit may be changed by switching between a conducting state and a non-conducting state of the fourth switch element. A circuit constituted by the first parallel-arm resonator and the first switch circuit connected in series and a circuit constituted by the third parallel-arm resonator and the third switch circuit connected in series may be connected in parallel. A circuit constituted by the second parallel-arm resonator and the second switch circuit connected in series and a circuit constituted by the fourth parallel-arm resonator and the fourth switch circuit connected in series may be connected in parallel.

Accordingly, power durability properties that the high-frequency filter is to have are ensured, and also reduction in size and passband insertion loss when a switch element is conducting can be achieved. Furthermore, the frequencies of the attenuation poles on the passband low-frequency side and the passband high-frequency side can be changed without increasing insertion loss at the passband edges.

A lower one of resonant frequencies of the first parallel-arm circuit when the first switch element is non-conducting may be lower than a higher one of resonant frequencies of the second parallel-arm circuit when the second switch element is non-conducting. A resonant frequency of the first parallel-arm resonator may be lower than a resonant frequency of the third parallel-arm resonator. An antiresonant frequency of the first parallel-arm resonator may be lower than an antiresonant frequency of the third parallel-arm resonator. A resonant frequency of the second parallel-arm resonator may be lower than a resonant frequency of the fourth parallel-arm resonator. An antiresonant frequency of the second parallel-arm resonator may be lower than an antiresonant frequency of the fourth parallel-arm resonator. A higher one of resonant frequencies of the first parallel-arm circuit when the third switch element is non-conducting may be lower than a higher one of resonant frequencies of the second parallel-arm circuit when the fourth switch element is non-conducting. A third stack count that is a total number of the one or more semiconductor elements connected in series and included in the third switch element may be lower than a fourth stack count that is a total number of the one or more semiconductor elements connected in series and included in the fourth switch element.

According to this, the lower a lower resonant frequency and a higher resonant frequency of a parallel-arm circuit when a switch element is non-conducting are, the lower a voltage applied to the switch element of the parallel-arm circuit is. Accordingly, the stack count of semiconductor elements in the switch element in the parallel-arm circuit whose lower resonant frequency and higher resonant frequency are low when the switch element is non-conducting can be decreased, and reduction in size and passband insertion loss when the switch element is conducting can be achieved.

The one or more semiconductor elements included in the third switch element may be one or more transistors, the one or more semiconductor elements included in the fourth switch element may be one or more transistors, and a gate width of each of the one or more transistors included in the fourth switch element may be greater than a gate width of at least one of the one or more transistors included in the third switch element.

According to this, the fourth switch element having a higher stack count than the third switch element has higher resistance in the conducting state, yet the resistance in the conducting state can be reduced by increasing the gate width. Accordingly, passband insertion loss of the high-frequency filter when the switch element is conducting can be reduced.

The high-frequency filter may have a ladder filter structure that includes: two or more series-arm circuits each of which is the series-arm circuit; and three or more parallel-arm circuits that include the first parallel-arm circuit and the second parallel-arm circuit. Each of the three or more parallel-arm circuits may include: a parallel-arm resonator; and a switch circuit that includes a switch element.

Accordingly, three or more parallel-arm circuits each including a switch element are included, and thus the amount of attenuation increases.

A multiplexer according to an aspect of the present disclosure includes: a plurality of filters that include the high-frequency filter described above. Input terminals or output terminals of the plurality of filters are directly or indirectly connected to a common terminal.

Accordingly, this provides a multiplexer for which power durability properties are ensured while achieving reduction in size of the multiplexer and loss when a switch of a parallel-arm circuit is conducting.

A high frequency front-end circuit according to an aspect of the present disclosure includes: the high-frequency filter described above or the multiplexer described above; and an amplifier circuit directly or indirectly connected to the high-frequency filter or the multiplexer.

Accordingly, this provides a high-frequency front-end circuit for which power durability properties are ensured while achieving reduction in size of the front-end circuit and loss when a switch of a parallel-arm circuit is conducting.

The amplifier circuit may be a power amplifier that amplifies a high-frequency signal to be transmitted, and the high-frequency signal amplified by the power amplifier may be input through an input terminal of the high-frequency filter or the input terminals of the plurality of filters.

Accordingly, this provides a transmitter high-frequency front-end circuit for which power durability properties are ensured while achieving reduction in size of the front-end circuit and loss when a switch of a parallel-arm circuit is conducting.

A communication device according to an aspect of the present disclosure includes: a radio-frequency (RF) signal processing circuit that processes a high-frequency signal to be transmitted by an antenna element, and a high-frequency signal received by the antenna element; and the above-described high frequency front-end circuit that conveys the high-frequency signals between the antenna element and the RF signal processing circuit.

Accordingly, this provides a communication device for which power durability properties are ensured while achieving reduction in size of the front-end circuit and loss when a switch of a parallel-arm circuit is conducting.

Advantageous Effects

The high-frequency filter, for instance, according to the present disclosure can ensure power durability properties while achieving reduction in the loss when a switch of a parallel-arm circuit is conducting and reduction in size of the filter.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1A is a circuit block diagram illustrating a filter according to Embodiment 1.

DESCRIPTION OF EMBODIMENTS

Figure 1B:
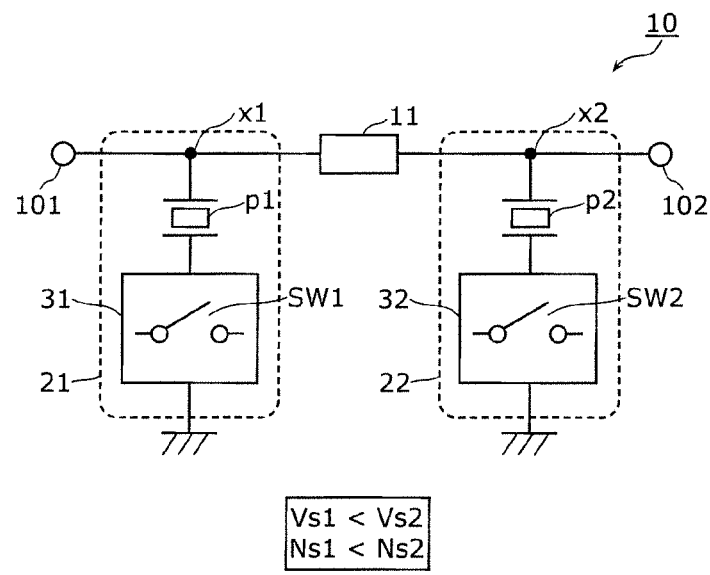
FIG. 1B illustrates a circuit configuration of a filter according to Embodiment 1.
Figure 1B:
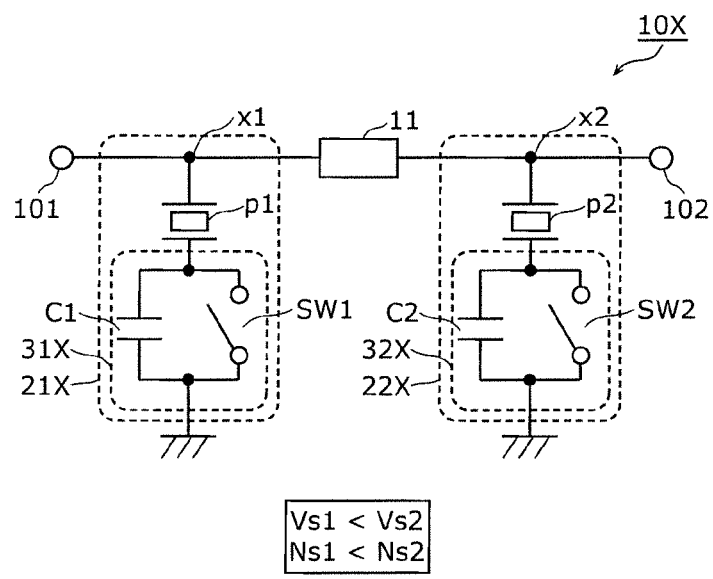

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any independent claim are described as arbitrary elements. In addition, the sizes of elements and the ratios of the sizes illustrated in the drawings are not necessarily accurate. Throughout the drawings, the same numeral is given to substantially the same element, and redundant description is omitted or simplified.

A resonant frequency of a resonator or a circuit is for forming an attenuation pole in or near a passband of a filter that includes the resonator or the circuit, and is a frequency at a "resonance point" that is a singular point at which impedance of the resonator or the circuit has a local minimum value (a point at which the impedance is ideally 0), unless otherwise stated.

An antiresonant frequency of a resonator or a circuit is for forming an attenuation pole in or near a passband of a filter that includes the resonator or the circuit, and is a frequency at an "antiresonance point" that is a singular point at which impedance of the resonator or the circuit has a local maximum value (a point at which the impedance is ideally infinite), unless otherwise stated.

Note that a series-arm circuit and a parallel-arm circuit in the following embodiments are defined as follows.

A parallel-arm circuit is disposed between the ground and a node on a path that connects a first input/output terminal and a second input/output terminal.

A series-arm circuit is disposed between the node on the path connected with the parallel-arm circuit and the first input/output terminal or the second input/output terminal, or is disposed between a node on the path connected with a parallel-arm circuit and another node on the path connected with another parallel-arm circuit.

In the following, a "passband low-frequency edge" means "the lowest frequency in a passband". A "passband high-frequency edge" means "the highest frequency in a passband". In the following, a "passband low-frequency side" means "a lower-frequency side relative to a passband, which is outside the passband". A "passband high-frequency side" means "a higher-frequency side relative to a passband, which is outside the passband".

Embodiment 1

[1. Basic Configuration of High-Frequency Filter According to Embodiment 1]

FIG. 1A is a circuit block diagram of filter 10 according to Embodiment 1. Filter 10 illustrated in FIG. 1A includes series-arm circuit 11, parallel-arm circuits 21 and 22, and input/output terminals 101 and 102.

Series-arm circuit 11 is connected between input/output terminal 101 (first input/output terminal) and input/output terminal 102 (second input/output terminal). A series-arm circuit may include a series-arm resonator that is an elastic wave resonator, for example, or may be a resonant circuit that includes a plurality of resonators such as longitudinally coupled resonators. A series-arm circuit may be an LC resonant circuit, or may be an impedance element such as an inductor or a capacitor, rather than being limited to a resonant circuit.

Parallel-arm circuit 21 is a first parallel-arm circuit connected to the ground and node x1 (first node) on a path between input/output terminal 101 and series-arm circuit 11. Parallel-arm circuit 22 is a second parallel-arm circuit connected to the ground and node x2 (second node) on a path between input/output terminal 102 and series-arm circuit 11.

Parallel-arm circuit 21 includes parallel-arm resonator p1 (first parallel-arm resonator), and switch circuit 31 connected in series to parallel-arm resonator p1. Parallel-arm circuit 22 includes parallel-arm resonator p2 (second parallel-arm resonator), and switch circuit 32 connected in series to parallel-arm resonator p2.

Switch circuit 31 is a first switch circuit that includes switch SW1. Switch SW1 is a first switch element that includes one or more semiconductor elements connected in series.

Switch circuit 32 is a second switch circuit that includes switch SW2. Switch SW2 is a second switch element that includes one or more semiconductor elements connected in series.

Switches SW1 and SW2 are, for example, single pole single throw (SPST) switch elements each having one terminal connected to a connection node of the parallel-arm resonator and the capacitor, and another terminal connected to the ground. Switches SW1 and SW2 are switched between a conducting state (on) and a non-conducting state (off) according to control signals from a controller (a radio frequency integrated circuit (RFIC) described below, for example), thus connecting the connection nodes and the ground or disconnecting the connection nodes from the ground.

Examples of switches SW1 and SW2 include field effect transistor (FET) switches made of GaAs semiconductors or complementary metal oxide semiconductors. Such switches made of semiconductors are small, and thus filter 10 can be miniaturized.

In the present embodiment, parallel-arm resonators p1 and p2 included in filter 10 are elastic wave resonators that use elastic waves, and are, for example, resonators that use surface acoustic waves (SAWs), resonators that use bulk acoustic waves (BAWs), or film bulk acoustic resonators (FBARs), for instance. Note that SAWs include not only surface waves, but also boundary waves. Furthermore, parallel-arm resonators p1 and p2 may be resonators or circuits represented by equivalent circuit models (such as Butterworth Van-Dyke (BVD) models, for example) that include inductance components and capacitance components, and may be resonators or circuits having resonant and antiresonant frequencies.

FIG. 1B illustrates a circuit configuration of filter 10X according to Embodiment 1. Filter 10X illustrated in FIG. 1B is a specific example of a circuit configuration of filter 10. Filter 10X includes series-arm circuit 11, parallel-arm circuits 21X and 22X, and input/output terminals 101 and 102. In the following, description of the configuration of filter 10X same as the configuration of filter 10 is omitted, and a configuration of filter 10X different therefrom is mainly described.

Parallel-arm circuit 21X is a first parallel-arm circuit connected to the ground and node x1 on a path between input/output terminal 101 and series-arm circuit 11. Parallel-arm circuit 22X is a second parallel-arms circuit connected to the ground and node x2 on a path between input/output terminal 102 and series-arm circuit 11.

Parallel-arm circuit 21X includes parallel-arm resonator p1 (first parallel-arm resonator) and switch circuit 31X connected in series to parallel-arm resonator p1. Parallel-arm circuit 22X includes parallel-arm resonator p2 (second parallel-arm resonator) and switch circuit 32X connected in series to parallel-arm resonator p2.

Switch circuit 31X is a first switch circuit that includes capacitor C1 (first capacitor) and switch SW1. Switch SW1 is a first switch element connected in parallel to capacitor C1, and including one or more semiconductor elements connected in series.

Switch circuit 32X is a second switch circuit that includes capacitor C2 (second capacitor) and switch SW2. Switch SW2 is a second switch element connected in parallel to capacitor C2, and including one or more semiconductor elements connected in series. Note that when switch SW2 includes one semiconductor element, the semiconductor element and capacitor C2 are connected in parallel.

The attenuation pole on the passband low-frequency side of filter 10X is formed by the resonant frequencies of parallel-arm circuits 21X and 22X. The range in which a frequency of the attenuation pole on the passband low-frequency side of filter 10X can be changed is dependent on the element values of capacitors C1 and C2, and for example, the smaller the element values of capacitors C1 and C2 are, the greater the range in which the frequency is changed is. Accordingly, the element values of capacitors C1 and C2 may be determined as appropriate according to the frequency specification that filter 10X is to have. Capacitors C1 and C2 may be variable capacitors, such as variable capacitance diodes and digitally tunable capacitors (DTCs).

The above circuit configuration switches between the conducting and non-conducting states of switch SW1, thus changing the impedance of switch circuit 31X. Accordingly, this changes at least one of a resonant frequency at which impedance |Z| of parallel-arm circuit 21X has a local minimum value or an antiresonant frequency at which impedance |Z| has a local maximum value. Further, the above circuit configuration switches between the conducting and non-conducting states of switch SW2, thus changing the impedance of switch circuit 32X, so that the resonant frequency of parallel-arm circuit 22X is changed.

More specifically, parallel-arm circuit 21X has a resonant frequency and an antiresonant frequency, and according to on (conducting state) and off (non-conducting state) of switch SW1, at least one of the resonant frequency and the antiresonant frequency is switched to a lower or higher frequency. Parallel-arm circuit 22X has a resonant frequency and an antiresonant frequency, and the resonant frequency is switched to a lower or higher frequency according to on (conducting state) and off (non-conducting state) of switch SW2.

In filter 10X according to the present embodiment, switch circuit 31X includes capacitor C1 and switch SW1 connected in parallel, and thus the resonant frequency of parallel-arm circuit 21X is switched to a higher frequency by switching switch SW1 from on to off. Switch circuit 32X includes a circuit in which capacitor C2 and switch SW2 are connected in parallel, and thus the resonant frequency of parallel-arm circuit 22X is switched to a higher frequency by switching switch SW2 from on to off. A passband and an attenuation band of filter 10X are determined by the resonant frequencies and the antiresonant frequencies of series-arm circuit 11 and parallel-arm circuits 21X and 22X, and thus the frequency ranges of the passband and the attenuation band of filter 10X can be changed by switching switches SW1 and SW2 between on and off.

Note that filter 10 according to the present embodiment may not have a configuration in which a switch circuit includes a capacitor, as filter 10X does.

Figure 1C:
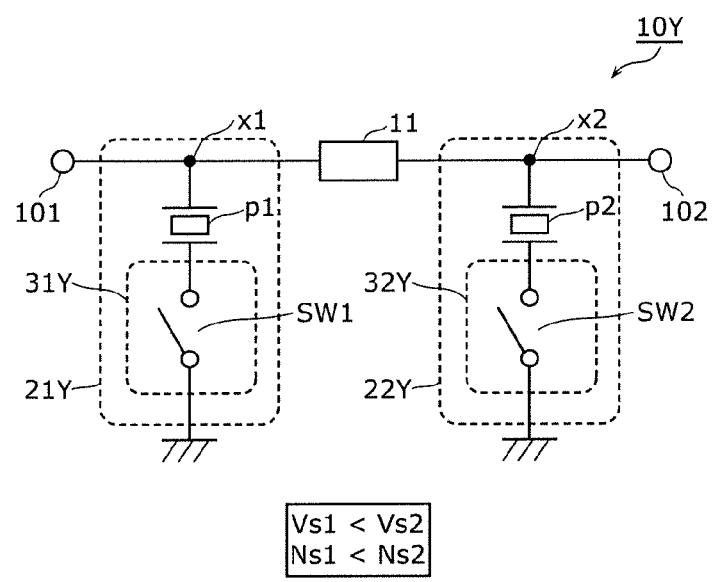
FIG. 1C illustrates a circuit configuration of a filter according to a variation of Embodiment 1.

FIG. 1C illustrates a circuit configuration of filter 10Y according to a variation of Embodiment 1. Filter 10Y illustrated in FIG. 1C is a specific example of a circuit configuration of filter 10. Filter 10Y includes series-arm circuit 11, parallel-arm circuits 21Y and 22Y, and input/output terminals 101 and 102. In the following, description of the same configuration of filter 10Y as the configurations of filters 10 and 10X is omitted, and a configuration of filter 10Y different therefrom is mainly described.

Parallel-arm circuit 21Y includes parallel-arm resonator p1 (first parallel-arm resonator), and switch circuit 31Y connected in series to parallel-arm resonator p1. Parallel-arm circuit 22Y includes parallel-arm resonator p2 (second parallel-arm resonator), and switch circuit 32Y connected in series to parallel-arm resonator p2.

Switch circuit 31Y is a first switch circuit that includes switch SW1. Switch SW1 is a first switch element that includes one or more semiconductor elements connected in series.

Switch circuit 32Y is a second switch circuit that includes switch SW2. Switch SW2 is a second switch element that includes one or more semiconductor elements connected in series.

The above circuit configuration switches between the conducting and non-conducting states of switch SW1, thus changing the impedance of switch circuit 31Y. Further, the above circuit configuration switches between the conducting and non-conducting states of switch SW2, thus changing the impedance of switch circuit 32Y. More specifically, when switches SW1 and SW2 are non-conducting, the passing characteristics of filter 10Y are characteristics that only series-arm circuit 11 contributes (for example, trapping characteristics achieved by series-arm circuit 11). On the other hand, when switches SW1 and SW2 are conducting, the passing characteristics of filter 10Y are characteristics of a ladder filter that includes series-arm circuit 11 and parallel-arm resonators p1 and p2. Specifically, the passband and the attenuation band of filter 10Y can be changed by switching between the conducting and non-conducting states of switches SW1 and SW2.

Here, in filters 10, 10X, and 10Y, voltage Vs1 across switch SW1 is lower than voltage Vs2 across switch SW2, first stack count Ns1 that is the number of the one or more semiconductor elements connected in series and included in switch SW1 is lower than second stack count Ns2 that is the number of the one or more semiconductor elements connected in series and included in switch SW2. Note that a voltage across a switch is a difference between a potential at a terminal of a switch having two terminals and a potential at the other terminal of the switch, and may be expressed as a voltage applied to the switch. The following describes in detail the structures of switches SW1 and SW2 that filters 10, 10X, and 10Y include, using switch IC50.

[2. Structure and Characteristics of Switch Element]

Figure 2A:
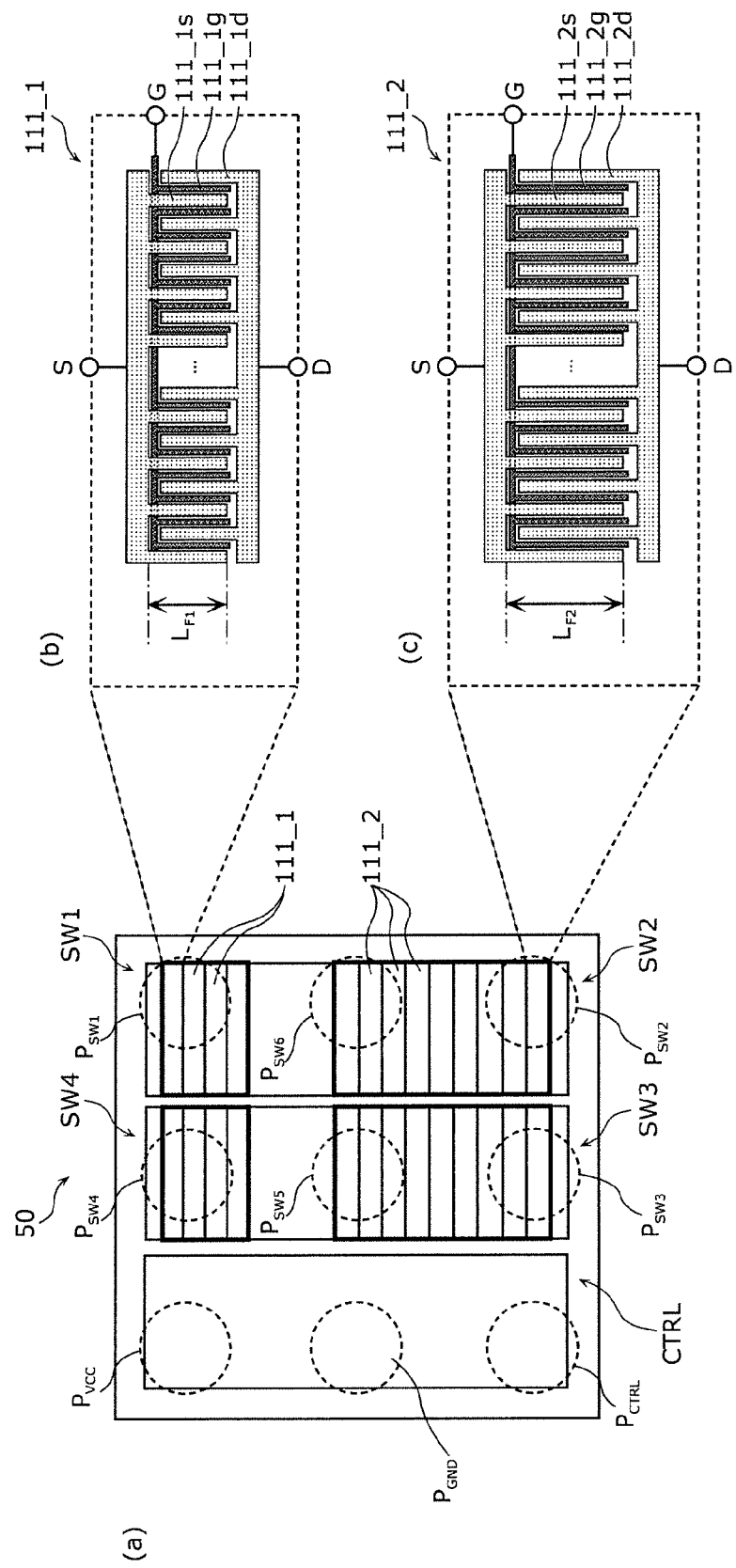
FIG. 2A is a schematic diagram illustrating a configuration of a switch.
Figure 2B:
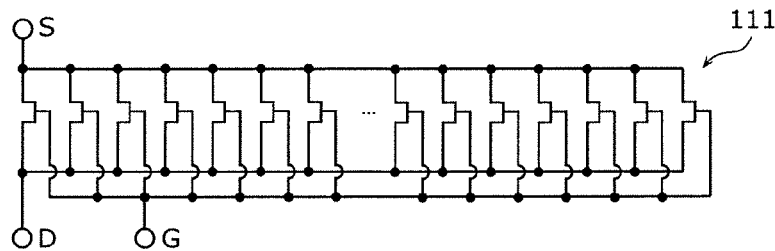
FIG. 2B illustrates a circuit configuration of a semiconductor element included in the switch.

FIG. 2A is a schematic diagram illustrating a configuration of switch IC50 according to Embodiment 1. FIG. 2B illustrates a circuit configuration of semiconductor element 111 included in switch IC50. Part (a) of FIG. 2A illustrates implementation of four switches SW1, SW2, SW3, and SW4 included in a filter according to the embodiments described below. Accordingly, switch IC used in filter 10 in FIG. 1A, filter 10X in FIG. 1B, and filter 10Y in FIG. 1C is assumed to include only switches SW1 and SW2 among switches SW1 to SW4 illustrated in FIG. 2A.

As illustrated in (a) of FIG. 2A, switches SW1 to SW4 are formed on substrate 51. Power supply terminal $P_{VCC}$, control terminal $P_{CTRL}$, ground terminal $P_{GND}$, and switch terminals $P_{SW1}$, $P_{SW2}$, $P_{SW3}$, $P_{SW4}$, $P_{SW5}$, and $P_{SW6}$ are disposed on the back surface of substrate 51. Switch SW1 is connected between switch terminals $P_{SW1}$ and $P_{SW6}$, switch SW2 is connected between switch terminals $P_{SW2}$ and $P_{SW6}$, switch SW3 is connected between switch terminals $P_{SW3}$ and $P_{SW5}$, and switch SW4 is connected between switch terminals $P_{SW4}$ and $P_{SW5}$.

Control circuit CTRL that operates using power supply voltage VCC supplied from a power supply circuit such as, for example, a power management IC, and generates switch driving voltages for turning on and off switches SW1 to SW4 individually according to, for example, control signals input from the RFIC is disposed on substrate 51.

Switches SW1 to SW4 each have a circuit configuration in which semiconductor elements 111 are connected in series. Note that switches SW1 to SW4 may each include single semiconductor element 111. As illustrated in (b) of FIG. 2A, semiconductor element 111_1 included in SW1 is a field effect transistor (FET) that includes, for example, a source electrode that includes a plurality of source electrode fingers 111_1s, a drain electrode that includes a plurality of drain electrode fingers 111_1d, and a gate electrode that includes a plurality of gate electrode fingers 111_1g. As illustrated in (c) of FIG. 2A, semiconductor element 111_2 included in SW2 is an FET that includes, for example, a source electrode that includes a plurality of source electrode fingers 111_2s, a drain electrode that includes a plurality of drain electrode fingers 111_2d, and a gate electrode that includes a plurality of gate electrode fingers 111_2g. In other words, in each of semiconductor elements 111 (111_1 and 111_2), a plurality of unit FETs that each include a source electrode finger, a drain electrode finger, and a gate electrode finger facing one another are disposed in parallel (to be pectinate).

The common length of the electrode fingers included in semiconductor element 111_1 is referred to as finger length $L_{F1}$, and a product of finger length $L_{F1}$ and finger count $N_{F1}$ is referred to as gate width $W_{F1}$. Further, the common length of the electrode fingers included in semiconductor element 111_2 is referred to as finger length $L_{F2}$, and a product of finger length $L_{F2}$ and finger count $N_{F2}$ is referred to as gate width $W_{F2}$. Furthermore, the numbers of semiconductor elements 111 connected in series and included in switches SW1 to SW4 are referred to as stack counts Ns1 to Ns4, respectively.

Figure 3A:
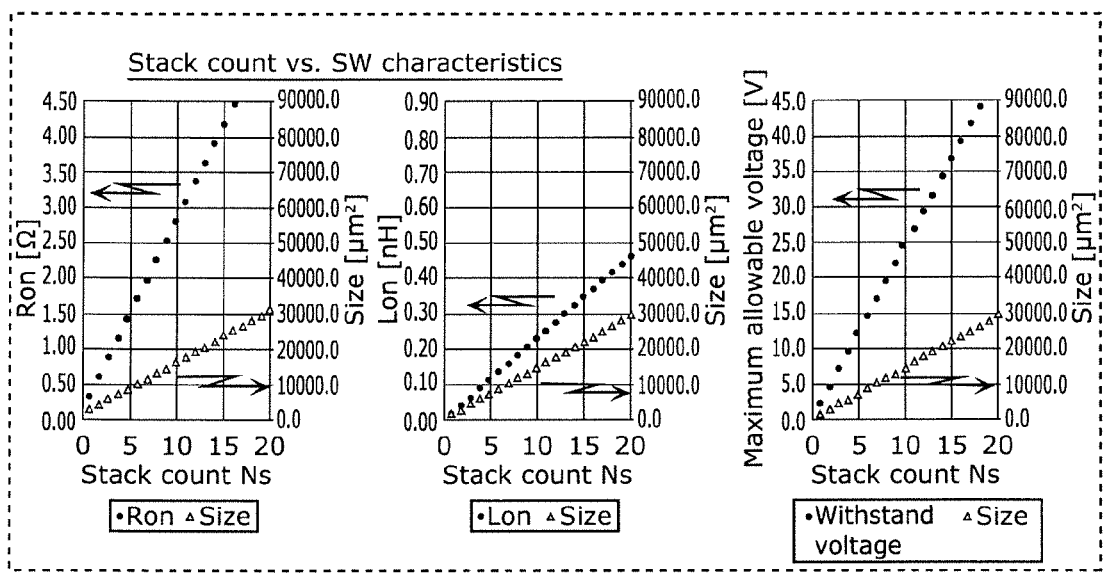
FIG. 3A illustrates graphs showing relations between a stack count and characteristics of the switch according to Embodiment 1.
Figure 3B:
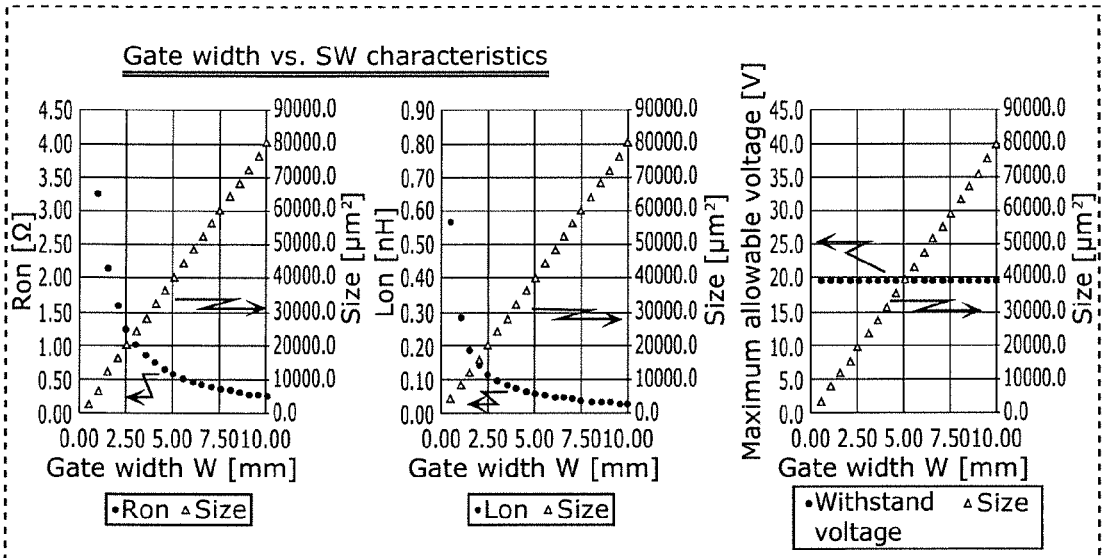
FIG. 3B illustrates graphs showing relations between a gate width and characteristics of the switch according to Embodiment 1.

FIG. 3A illustrates graphs showing relations between stack count Ns and characteristics of switches SW1 and SW2 according to Embodiment 1. FIG. 3B illustrates graphs showing relations between gate width W and characteristics of switches SW1 and SW2 according to Embodiment 1.

As illustrated in the left and center graphs in FIG. 3A, the higher stack count Ns of semiconductor elements 111 is, the higher resistance Ron and inductance Lon of a switch in the on state are. As illustrated in the right graph in FIG. 3A, the higher stack count Ns of semiconductor elements 111 is, the higher the withstand voltage (maximum allowable voltage) is and the greater the size of the switch is. Note that the withstand voltage of semiconductor element 111 in which a plurality of unit FETs are connected in parallel is about 2.5 V, for example, and is determined by the material of the gate electrode, and the gap between a source electrode finger and a drain electrode finger.

As illustrated in the left and center graphs in FIG. 3B, the greater gate width W of semiconductor element 111 (FET) is, the lower resistance Ron and inductance Lon when a switch is on are. As illustrated in the right graph in FIG. 3B, the greater gate width W of semiconductor element 111 (FET) is, the greater the size of the switch is while the withstand voltage (maximum allowable voltage) is constant.

Stated differently, switches SW1 to SW4 are in a trade-off relationship that the withstand voltage increases as stack count Ns of semiconductor elements 111 is increased, yet the resistance in the on state increases and also the size increases. Also, switches SW1 to SW4 are in a trade-off relationship that the resistance in the on state decreases as gate width W of semiconductor element 111 (FET) is increased, yet the size increases.

Note that the resistance of a switch in the on state increases as gate width W is increased, yet even if gate width W has the same value, the resistance of a switch in the on state is decreased as finger length L is shorter and finger count Nf is higher. This is due to a fact that the shorter finger length L is, the smaller the resistance component of an electrode finger in the longitudinal direction is.

[3. Relation Between Voltage Across Switch Element and Structure of Switch Element]

The magnitudes of voltage Vs1 across switch SW1 and voltage Vs2 across switch SW2 are proportional to the magnitude of high-frequency power applied to filters 10, 10X, and 10Y. In particular, when switches SW1 and SW2 are off, the impedance of switches SW1 and SW2 is high, and thus voltages Vs1 and Vs2 are high.

In a typical switch element, one or more semiconductor elements are stacked (connected in series), and the voltage is divided and applied to each semiconductor element. However, the size of the switch element increases if the stack count is increased, and also the resistance of the switch element in the on state increases.

Specifically, if the number of stacked semiconductor elements is increased, the power durability of the filter improves, but nevertheless, the size of the filter increases and also the resistance of the switch element in the on state increases, and thus passband insertion loss when the switch element is on increases. On the other hand, if the number of stacked semiconductor elements is reduced, power durability of the filter decreases, yet the size of the filter can be decreased and also the resistance of the switch element in the on state can be decreased, and thus passband insertion loss when the switch element is on is decreased. Thus, adjusting the number of stacked semiconductor elements included in a switch element is in a relationship of trade-off between (i) power durability and (ii) the size of the switch element and passband insertion loss.

From the above viewpoint, if parallel-arm circuits include switch elements having the same stack count in order to achieve power durability that a frequency-tunable high-frequency filter is to have, this raises a problem that either power durability lowers or the size of the filter and passband insertion loss increase.

In filter 10 according to the present embodiment, the magnitude of voltage Vs1 across switch SW1 is dependent on which of input/output terminals 101 and 102 high-frequency power is applied through (high-frequency power application direction), and the resonant frequency of parallel-arm resonator p1. Further, the magnitude of voltage Vs2 across switch SW2 is dependent on the high-frequency power application direction and the resonant frequency of parallel-arm resonator p2. For example, when high-frequency power is applied through input/output terminal 102, a high-frequency voltage due to the application of the high-frequency power is higher as closer to input/output terminal 102. Stated differently, when high-frequency power is applied through input/output terminal 102, a high-frequency voltage applied to parallel-arm circuit 22 is higher than a high-frequency voltage applied to parallel-arm circuit 21. Further, the high-frequency voltage applied to parallel-arm circuit 22 is divided by parallel-arm resonator p2 and switch circuit 32, yet the ratio at which the voltage is divided depends on the impedance of parallel-arm resonator p2 and switch circuit 32. Impedance of parallel-arm resonator p2 greatly changes due to the resonant frequency and the antiresonant frequency, and thus out of the high-frequency voltage applied to parallel-arm circuit 22, a high-frequency voltage applied to switch circuit 32 changes due to resonance characteristics of parallel-arm resonator p2.

Thus, the magnitudes of voltages Vs1 and Vs2 across switches SW1 and SW2 are dependent on which of input/output terminals 101 and 102 high-frequency power is applied through (high-frequency power application direction), and resonant frequencies of parallel-arm resonators p1 and p2 (parallel-arm resonant circuits 21 and 22).

According to the above configuration, first stack count Ns1 is made lower than second stack count Ns2 in a configuration in which voltage Vs1 across switch SW1 is lower than voltage Vs2 across switch SW2.

In order to ensure a withstand voltage against input high-frequency power, stack count Ns1 of switch SW1 is made lower than stack count Ns2 of switch SW2 in filter 10 having the above circuit configuration, as compared with a conventional configuration in which all the switch elements are equally configured, that is, all the switch elements have the same stack count. Accordingly, as compared with the above conventional high-frequency tunable filter, filter 10 can be miniaturized due to a decrease in stack count Ns1. In addition, stack count Ns1 of switch SW1 is relatively decreased, and thus resistance of switch SW1 in an on state can be decreased, so that passband insertion loss of filter 10 when switch SW1 is on can be reduced. On the other hand, stack count Ns2 of switch SW2 the voltage across which is relatively high is higher than stack count Ns1 of switch SW1 so that power durability of filter 10 is ensured. Thus, power durability properties can be ensured while achieving reduction in size of the filter and loss when the switches in parallel-arm circuits 21 and 22 are conducting.

[4. Analysis of Voltage Applied to Switch]

Here, a result of analyzing what kind of circuit parameter a voltage across a switch included in a parallel-arm circuit as described above influences is to be described.

Figure 4:
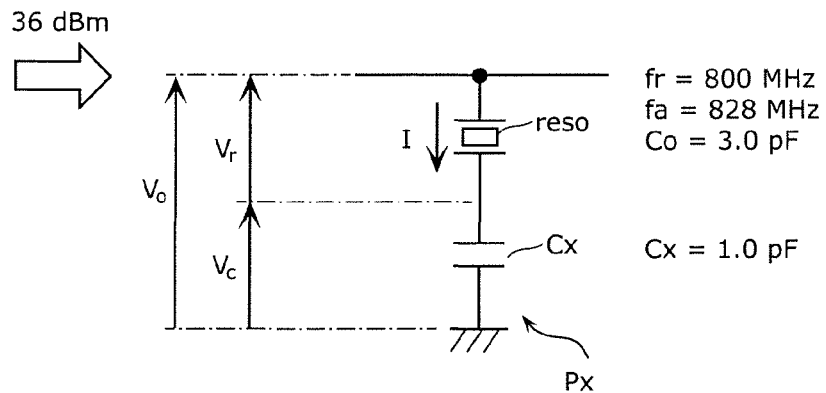
FIG. 4 illustrates an equivalent circuit of a parallel-arm circuit.
Figure 5:
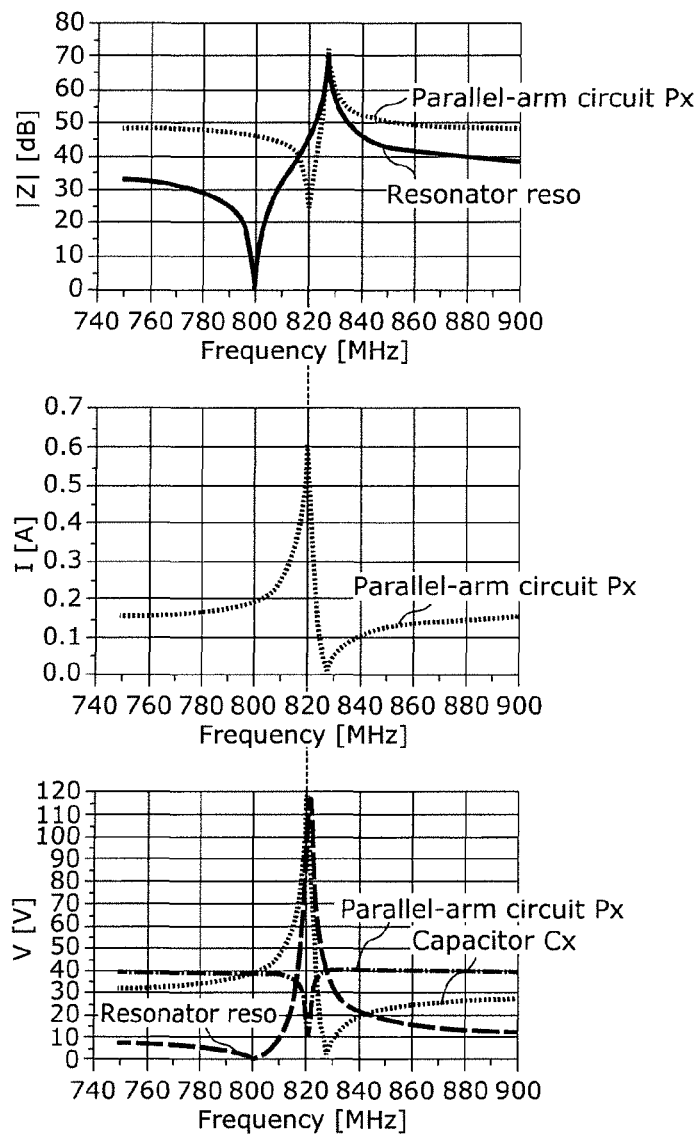
FIG. 5 illustrates graphs showing impedance characteristics, current characteristics, and voltage characteristics of the parallel-arm circuit.

FIG. 4 illustrates an equivalent circuit of parallel-arm circuit Px when a switch is off. FIG. 5 illustrates graphs showing impedance characteristics, current characteristics, and voltage characteristics of parallel-arm circuit Px. In FIG. 4, parallel-arm circuit Px has a configuration in which resonator reso and capacitor Cx are connected in series. Capacitor Cx represents a capacitance component when the switch is off. As illustrated in the top graph in FIG. 5, the resonant frequency of resonant circuit Px is higher than the resonant frequency of resonator reso. As illustrated in the middle graph in FIG. 5, current I that flows through parallel-arm circuit Px is the greatest at the resonant frequency of parallel-arm circuit Px. This is due to the impedance of parallel-arm circuit Px having a local minimum value at the resonant frequency of parallel-arm circuit Px. As illustrated in the bottom graph in FIG. 5, voltage $V_0$ applied to parallel-arm circuit Px has a local minimum value at the resonant frequency of parallel-arm circuit Px, yet (the absolute value of) the voltage applied to capacitor Cx and (the absolute value of) voltage Vr applied to resonator reso have local maximum values at the resonant frequency of parallel-arm circuit Px. Thus, voltage Vc applied to capacitor Cx and a current flowing therethrough are the highest/greatest at the resonant frequency of parallel-arm circuit Px. In other words, the voltage applied to and current flowing through the switch connected in series to resonator reso can be the highest/greatest at the resonant frequency of parallel-arm circuit Px when the switch is off.

Figure 6A:
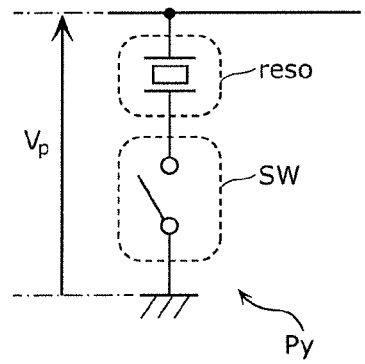
FIG. 6A illustrates a circuit configuration of a parallel-arm circuit.
Figure 6B:
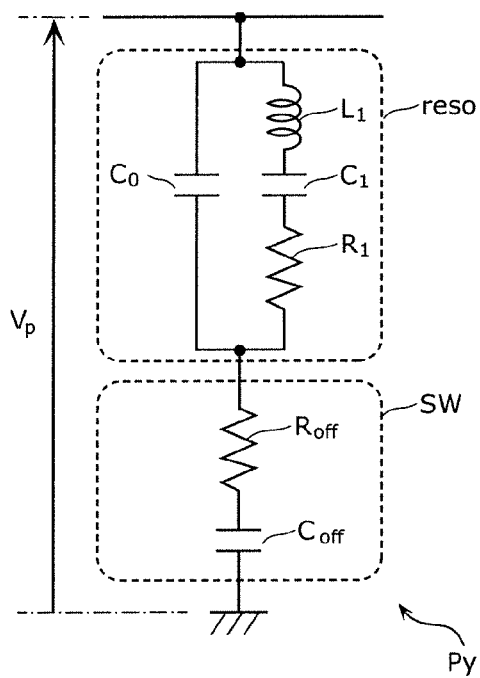
FIG. 6B illustrates an equivalent circuit of the parallel-arm circuit when the switch is off.
Figure 6C:
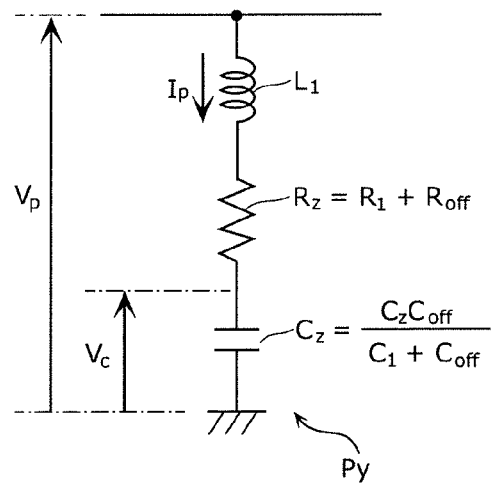
FIG. 6C illustrates an equivalent circuit of the parallel-arm circuit at a resonant frequency thereof when the switch is off.

FIG. 6A illustrates a circuit configuration of parallel-arm circuit Py. FIG. 6B illustrates an equivalent circuit of parallel-arm circuit Py when the switch is off. FIG. 6C illustrates an equivalent circuit of parallel-arm circuit Py at a resonant frequency thereof when the switch is off.

As illustrated in FIG. 6A, parallel-arm circuit Py is a circuit constituted by resonator reso and switch SW connected in series. As illustrated in FIG. 6B, resonator reso is represented by a circuit in which capacitor $C_0$ having electrostatic capacitance $C_0$ of resonator reso is connected in parallel to a circuit constituted by inductor $L_1$ having inductance $L_1$, capacitor $C_1$ having capacitance $C_1$, and resistor $R_1$ having resistance $R_1$ connected in series. Switch SW is represented by a circuit in which off capacitor $C_{off}$ having capacitance $C_{off}$ and resistor $R_{off}$ having resistance $R_1$ that is a resistance component when switch SW is non-conducting are connected in series. Here, an equivalent circuit of parallel-arm circuit Py at the resonant frequency thereof is represented by a circuit in which inductor $L_1$, resistor $R_z$ having resistance $R_z$, and capacitor $C_z$ having capacitance $C_z$ are connected in series as in FIG. 6C. Here, resistance $R_z$ and capacitance $C_z$ are represented by Expression 1 and Expression 2, respectively.

[Math 1]
$$R_Z = R_1 + R_{off} \qquad \text{(Expression 1)}$$

[Math 2]
$$C_Z = \frac{C_1 \cdot C_{off}}{C_1 + C_{off}} \qquad \text{(Expression 2)}$$

Impedance Zp of parallel-arm circuit Py at the resonant frequency of parallel-arm circuit Py is represented by Expression 3 based on the equivalent circuit in FIG. 6C, and current Ip flowing through parallel-arm circuit Py when reference voltage Vp is applied to parallel-arm circuit Py is represented by Expression 4.

[Math 3]

$$Z_p = R_Z + j\omega_r L_1 + \frac{1}{j\omega_r C_Z} \quad \text{(Expression 3)}$$

[Math 4]

$$I_p = \frac{V_p}{R_Z + j\omega L_1 + \frac{1}{j\omega_r C_Z}} \quad \text{(Expression 4)}$$

Here, Expression 5 holds at the resonant frequency of parallel-arm circuit Py.

[Math 5]

$$j\omega_r L_1 = \frac{1}{j\omega_r C_Z} \quad \text{(Expression 5)}$$

Accordingly, current Ipr that flows through parallel-arm circuit Py at the resonant frequency of parallel-arm circuit Py is represented by Expression 6.

[Math 6]

$$I_{pr} = \frac{V_p}{R_Z} \quad \text{(Expression 6)}$$

Voltage Vc applied to capacitor Cz at the resonant frequency of parallel-arm circuit Py is represented by Expression 7.

[Math 7]

$$|V_C| = \left| I_p \frac{1}{j\omega_r C_Z} \right| = I_p \frac{1}{\omega_r C_Z} = \frac{V_p}{\omega_r C_Z R_Z} \quad \text{(Expression 7)}$$

At the resonant frequency of parallel-arm circuit Py, $\omega r = 1/\sqrt{(L_1 C_z)}$ is satisfied, and thus if this is substituted into Expression 7, voltage Vc is as represented by Expression 8.

[Math 8]

$$V_C = I_p \frac{V_p}{\frac{1}{\sqrt{L_1 C_Z}} C_Z R_Z} = \frac{V_p \sqrt{L_1 C_Z}}{C_Z R_Z} = \frac{V_p}{R_Z} \sqrt{\frac{L_1}{C_Z}} \quad \text{(Expression 8)}$$

Note that the sharpness of resonance (Q factor) is represented by Expression 9.

[Math 9]

$$Q = \frac{1}{R_Z} \sqrt{\frac{L_1}{C_Z}} \quad \text{(Expression 9)}$$

From Expressions 8 and 9, voltage Vc is as represented by Expression 10.

[Math 10]

$$V_C = Q \cdot V_p \quad \text{(Expression 10)}$$

Accordingly, Expression 10 shows that voltage Vc applied to capacitor Cz is Q times reference voltage Vp of parallel-arm circuit Py, and a voltage higher than reference voltage Vp is applied to switch SW in parallel-arm circuit Py when switch SW is off.

Figure 6D:
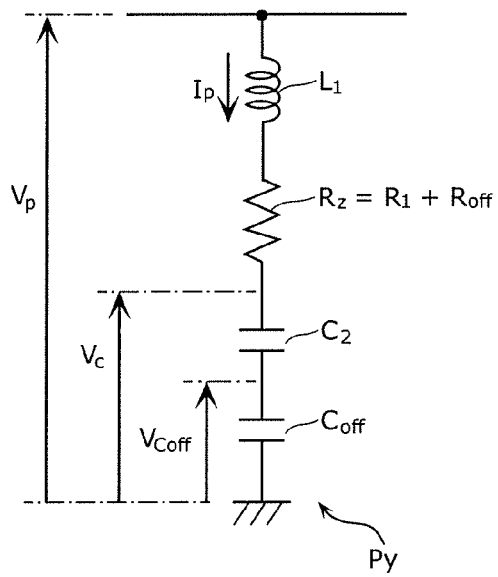
FIG. 6D illustrates an equivalent circuit of the parallel-arm circuit at the resonant frequency thereof when the switch is off.

FIG. 6D illustrates an equivalent circuit of parallel-arm circuit Py at the resonant frequency thereof when switch SW is off. The equivalent circuit illustrated in FIG. 6D is a result of decomposing capacitance $C_z$ into off capacitance $C_{off}$ of switch SW. In this case, voltage $V_{Coff}$ applied to off capacitor $C_{off}$ is represented by Expression 11, and the lower off capacitance $C_{off}$ of switch SW, the lower a voltage applied to off capacitor $C_{off}$ of switch SW. The lower the Q factor at the resonant frequency, the lower the voltage applied to off capacitor $C_{off}$ of switch SW.

[Math 11]

$$V_{Coff} = \frac{C_{off}}{C_Z} V_C = \frac{C_{off}}{C_1 + C_{off}} V_C = \frac{C_{off}}{C_1 + C_{off}} Q \cdot V_p \quad \text{(Expression 11)}$$

Here, consider a circuit in which capacitor $C_{p1}$ having capacitance $C_{p1}$ is connected in parallel to switch SW, based on parallel-arm circuit Py.

Figure 6E:
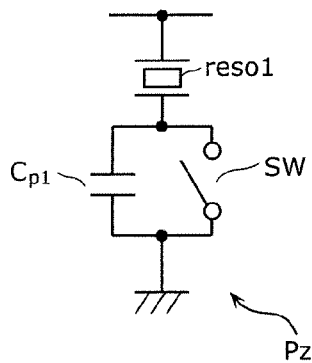
FIG. 6E illustrates a circuit configuration of a parallel-arm circuit.
Figure 6F:
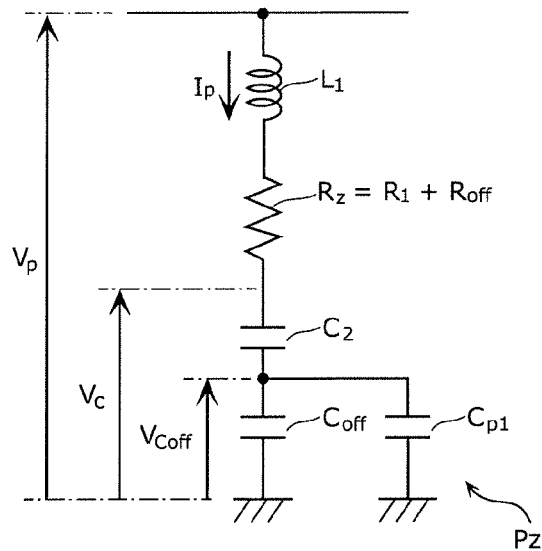
FIG. 6F illustrates an equivalent circuit of the parallel-arm circuit at a resonant frequency thereof when the switch is off.

FIG. 6E illustrates a circuit configuration of parallel-arm circuit Pz. FIG. 6F illustrates an equivalent circuit of parallel-arm circuit Pz at the resonant frequency thereof when switch SW is off.

From the equivalent circuit model of resonator reso illustrated in FIG. 6B, resonant frequency fr and antiresonant frequency fa of resonator reso are represented by Expressions 12 and 13, respectively.

[Math 12]

$$f_a = f_r \sqrt{1 + \frac{C_1}{C_0}} \quad \text{(Expression 12)}$$

[Math 13]

$$f_r = \frac{1}{2\pi \sqrt{L_1 C_1}} \quad \text{(Expression 13)}$$

From a mathematical expression as a result of changing $C_{off}$ in Expression 11 to $(C_{off} + C_{p1})$ and Expressions 12 and 13, voltage $V_{Coff}$ applied to off capacitor $C_{off}$ in parallel-arm circuit Pz is represented by Expression 14.

[Math 14]

$$V_{Coff} = \frac{C_{off} + C_{p1}}{C_0 \left( \left( \frac{f_a}{f_r} \right)^2 - 1 \right) + C_{off} + C_{p1}} Q \cdot V_p \quad \text{(Expression 14)}$$

Expression 14 shows the following with regard to voltage $V_{Coff}$ applied to off capacitor $C_{off}$.

(1) The higher electrostatic capacitance $C_0$ of capacitor $C_0$ in resonator reso, the lower voltage $V_{Coff}$ applied to off capacitor $C_{off}$ in switch SW.
(2) The higher capacitance $C_{p1}$, the lower voltage $V_{Coff}$ applied to off capacitor $C_{off}$ in switch SW.
(3) The smaller the amount of change in frequency of parallel-arm circuit Pz, the lower voltage $V_{Coff}$ applied to off capacitor $C_{off}$ in switch SW.
(4) The greater the fractional band width (fa−fr)/fr of resonator reso, the lower voltage $VC_{off}$ applied to off capacitor $C_{off}$ in switch SW.

In the present embodiment, the magnitude of voltage Vs across switch SW depends on the high-frequency power application direction and the resonant frequency of the parallel-arm resonator. However, as shown by the results of the analysis, the magnitude of voltage Vs across switch SW also depends on electrostatic capacitance of the parallel-arm resonator, equivalent capacitance $C_{p1}$ of switch SW, the amount of change in frequency of the parallel-arm circuit, and the fractional band width of the parallel-arm resonator.

[5. High-Frequency Filter According to Embodiment 1]

Figure 7:
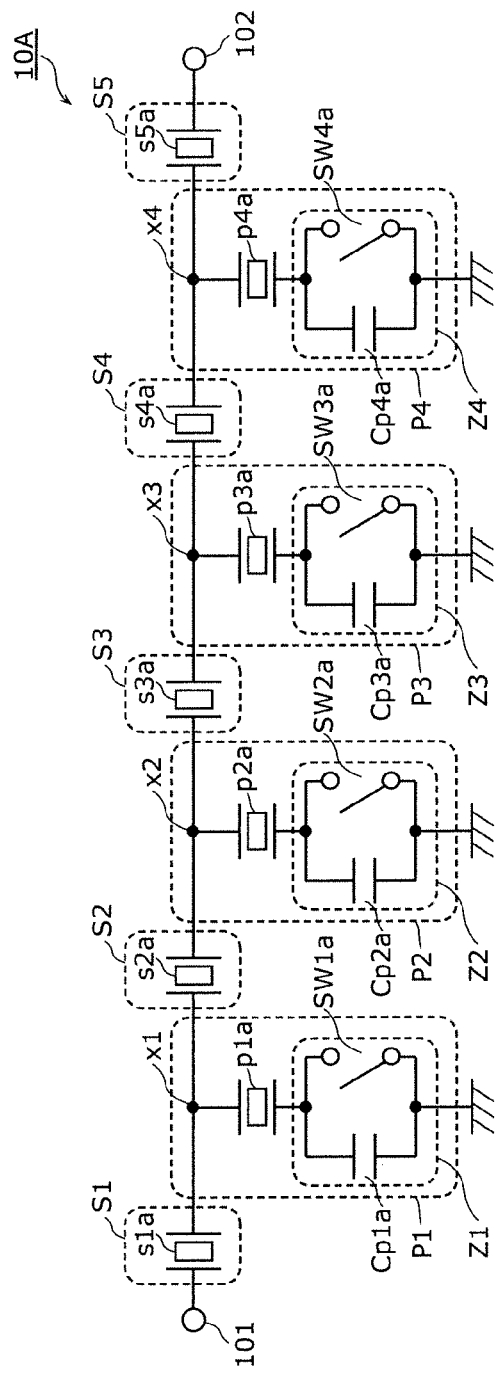
FIG. 7 illustrates a circuit configuration of a filter according to Example 1.

FIG. 7 illustrates a circuit configuration of filter 10A according to Example 1. In filter 10A illustrated in FIG. 7, the number of parallel-arm circuits is different from that of filter 10 according to Embodiment 1. In the following, description of common points of filter 10A according to Example 1 to those of filter 10 according to Embodiment 1 is omitted, and different points are mainly described.

As illustrated in FIG. 7, filter 10A includes series-arm circuits S1, S2, S3, S4, and S5, parallel-arm circuits P1, P2, P3, and P4, and input/output terminals 101 and 102.

Series-arm circuits S1 to S5 are disposed on a path that connects input/output terminal 101 (first input/output terminal) and input/output terminal 102 (second input/output terminal). Series-arm circuits S1, S2, S3, S4, and S5 include series-arm resonators s1a, s2a, s3a, s4a, and s5a, respectively.

Parallel-arm circuit P1 is a first parallel-arm circuit connected to the ground and node x1 (first node) on a path between series-arm circuits S1 and S2. Parallel-arm circuit P2 is connected to the ground and node x2 on a path between series-arm circuits S2 and S3. Parallel-arm circuit P3 is connected to the ground and node x3 on a path between series-arm circuits S3 and S4. Parallel-arm circuit P4 is a second parallel-arm circuit connected to the ground and node x4 (second node) on a path between series-arm circuits S4 and S5.

Parallel-arm circuit P1 includes parallel-arm resonator p1a (first parallel-arm resonator) and switch circuit Z1 connected in series to parallel-arm resonator p1a. Parallel-arm circuit P2 includes parallel-arm resonator p2a, and switch circuit Z2 connected in series to parallel-arm resonator p2a. Parallel-arm circuit P3 includes parallel-arm resonator p3a, and switch circuit Z3 connected in series to parallel-arm resonator p3a. Parallel-arm circuit P4 includes parallel-arm resonator p4a (second parallel-arm resonator), and switch circuit Z4 connected in series to parallel-arm resonator p4a.

Switch circuit Z1 is a first switch circuit that includes capacitor Cp1a and switch SW1a. Switch SW1a is a first switch element connected in parallel to capacitor Cp1a, and including one or more semiconductor elements connected in series. Switch circuit Z2 includes capacitor Cp2a and switch SW2a. Switch SW2a is connected in parallel to capacitor Cp2a, and including one or more semiconductor elements connected in series. Switch circuit Z3 includes capacitor Cp3a and switch SW3a. Switch SW3a is connected in parallel to capacitor Cp3a, and including one or more semiconductor elements connected in series. Switch circuit Z4 is a second switch circuit that includes capacitor Cp4a and switch SW4a. Switch SW4a is a second switch element connected in parallel to capacitor Cp4a, and including one or more semiconductor elements connected in series.

In filter 10A according to this example, switch circuits (Z1 to Z4) each include one of parallel circuits of capacitors (Cp1a to Cp4a) and one of switches (SW1a to SW4a), and thus switching SW1a to SW4a from on to off switches the resonant frequencies of parallel-arm circuits (P1 to P4) to higher frequencies (from Fron to Froff). The passband and the attenuation band of filter 10A are determined by resonant frequencies and antiresonant frequencies of series-arm circuits S1 to S4, and resonant frequencies and antiresonant frequencies of parallel-arm circuits P1 to P4, and thus switching between on and off of switches SW1a to SW4a can change the passband and the attenuation band of filter 10A.

Here, voltage Vs1a across switch SW1a is lower than voltage Vs4a across switch SW4a, and first stack count Ns1a that is the number of one or more semiconductor elements connected in series and included in switch SW1a is lower than second stack count Ns4a that is the number of one or more semiconductor elements connected in series and included in switch SW4a.

The following describes characteristics and advantageous effects of filter 10A according to Example 1, in comparison with Comparative Examples 1 to 3.

Table 1 shows resonator parameters, switch voltages, and insertion losses of a filter according to Comparative Example 1. Table 2 shows resonator parameters, switch voltages, and insertion losses of a filter according to Comparative Example 2. Table 3 shows resonator parameters, switch voltages, and insertion losses of a filter according to Comparative Example 3. Table 4 shows resonator parameters, switch voltages, and insertion losses of filter 10A according to Example 1.

Table 5 shows differences of Example 1 and Comparative Examples 1 to 3. Filter 10A according to Example 1 and the filters according to Comparative Examples 1 to 3 are high-frequency filters having first filter characteristics that Band27-Rx is a first passband and second filter characteristics that Band26-Rx is a second passband, and the first filter characteristics and the second filter characteristics can be switched by switching between on and off of switches.

Figure 8A:
FIG. 8A illustrates graphs showing passing characteristics, impedance characteristics, and switch voltage characteristics of a filter according to Comparative Example 1.
Figure 8A:
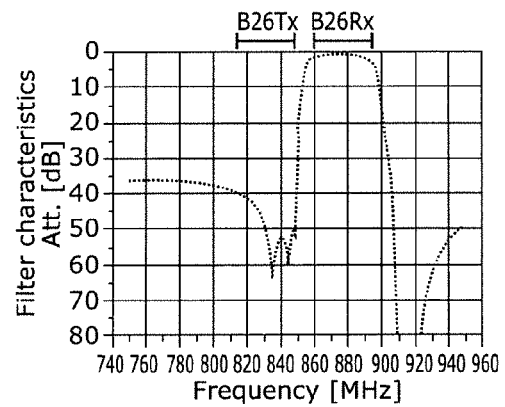
Figure 8A:
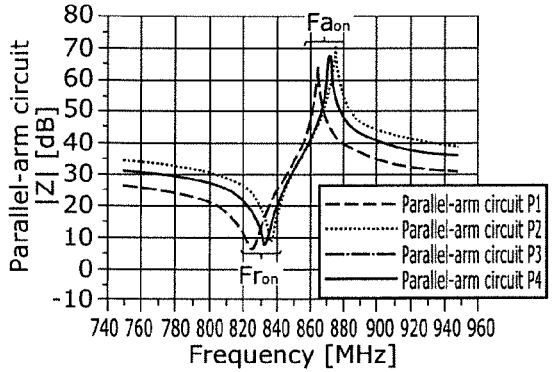
Figure 8A:
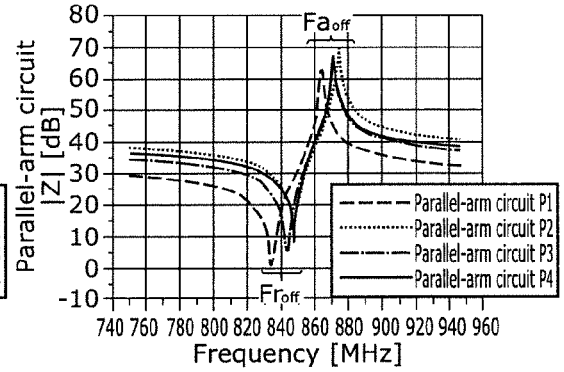
Figure 8A:
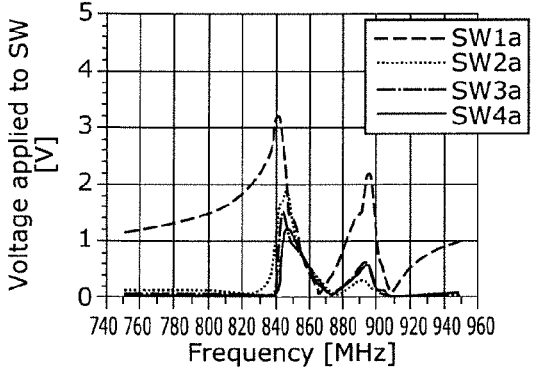
Figure 8A:
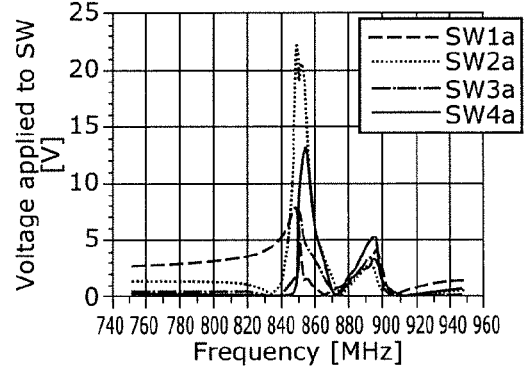
Figure 8B:
FIG. 8B illustrates graphs showing passing characteristics, impedance characteristics, and switch voltage characteristics of a filter according to Comparative Example 2.
Figure 8B:
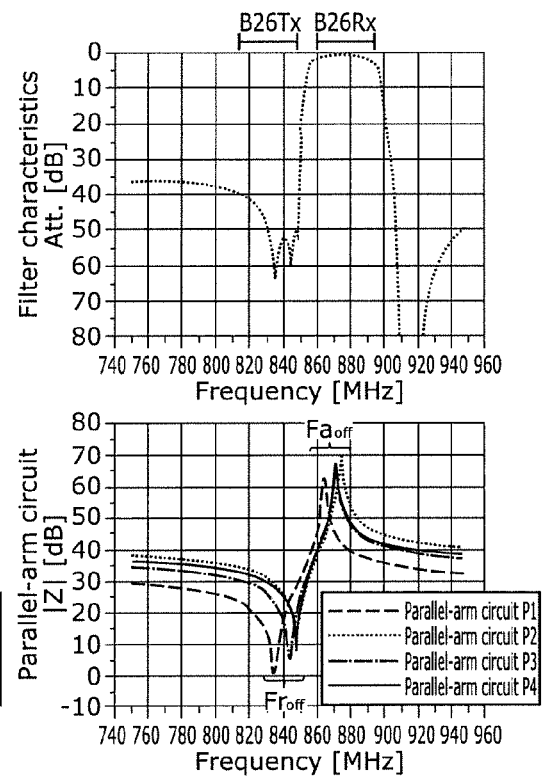
Figure 8B:
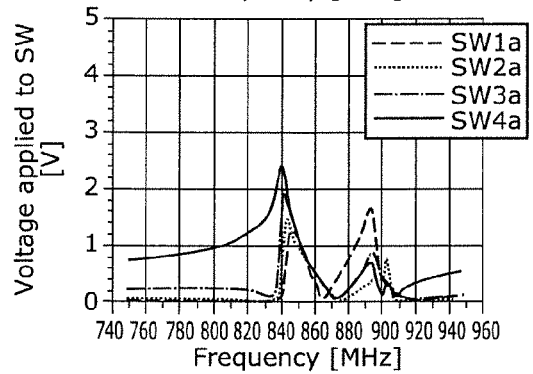
Figure 8B:
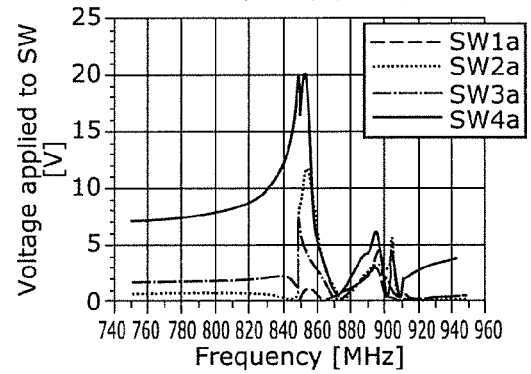
Figure 8C:
FIG. 8C illustrates graphs showing passing characteristics, impedance characteristics, and switch voltage characteristics of a filter according to Comparative Example 3.
Figure 8C:
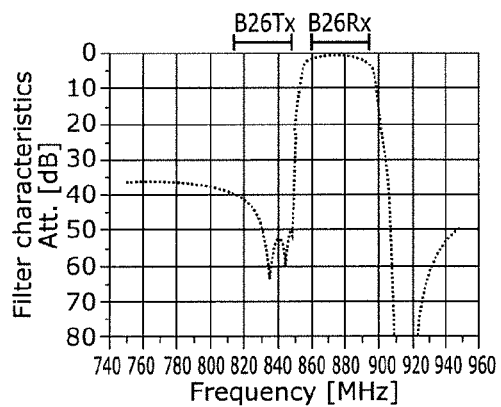
Figure 8C:
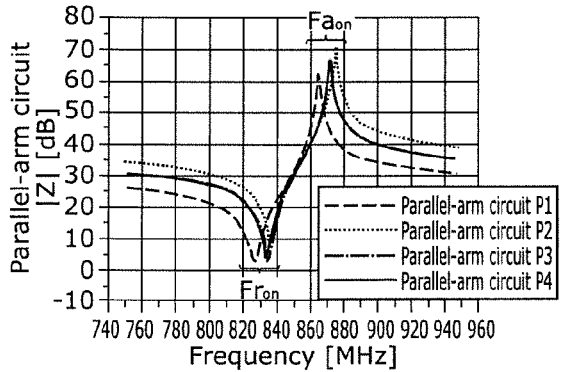
Figure 8C:
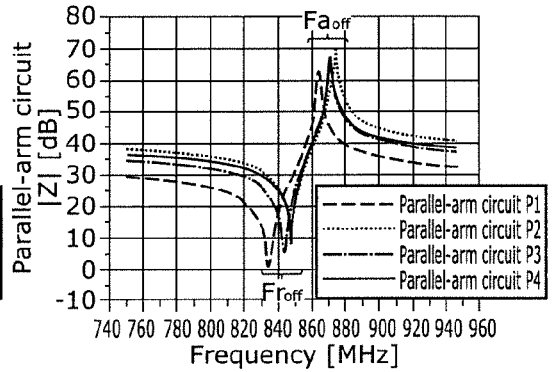
Figure 8C:
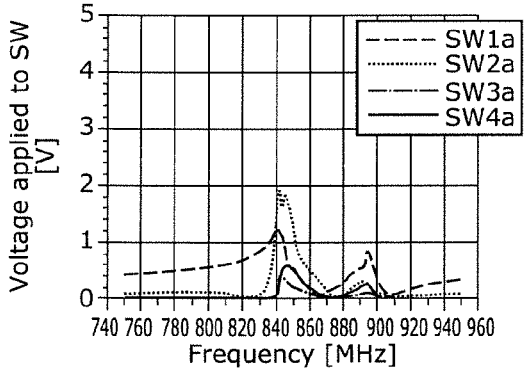
Figure 8C:
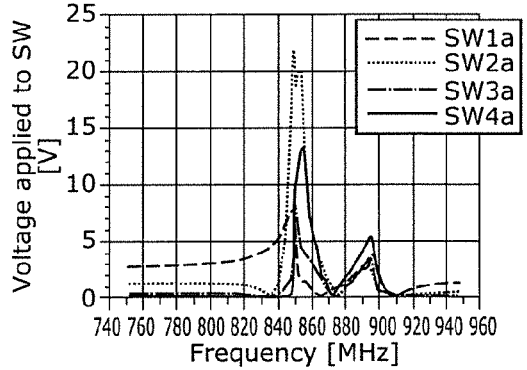
Figure 9:
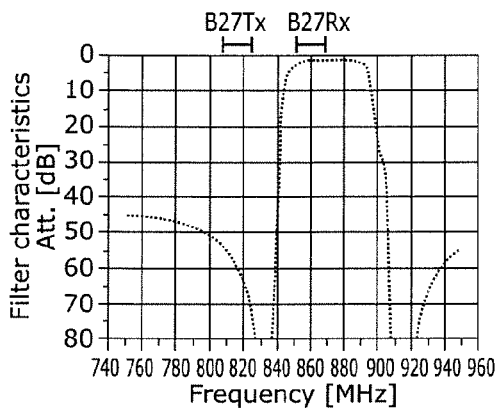
FIG. 9 illustrates graphs showing passing characteristics, impedance characteristics, and switch voltage characteristics of the filter according to Example 1.
Figure 9:
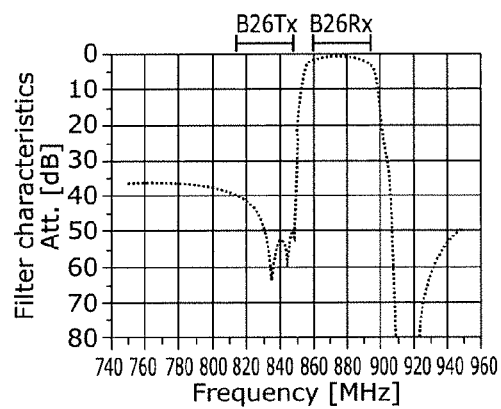
Figure 9:
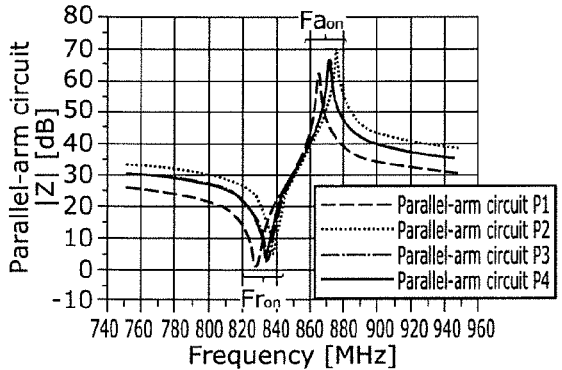
Figure 9:
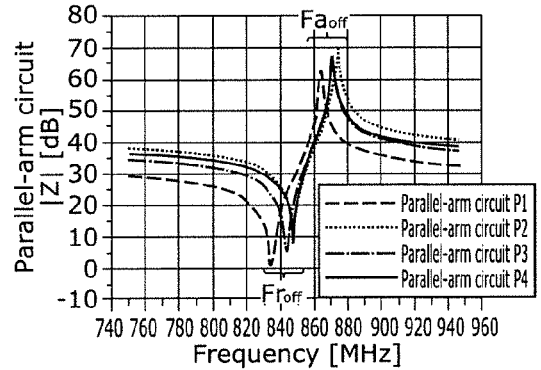
Figure 9:
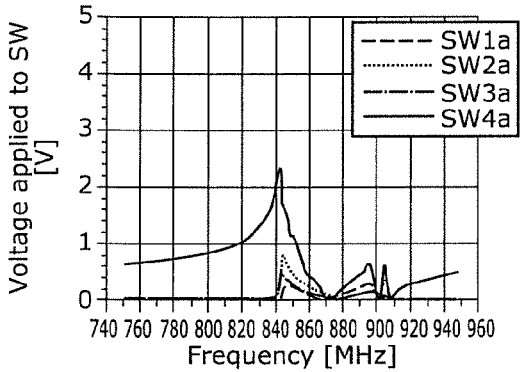
Figure 9:
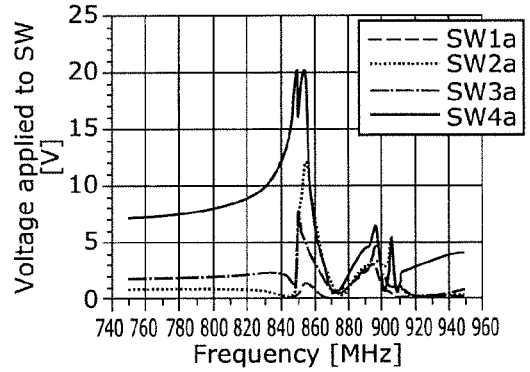

FIG. 8A illustrates graphs showing passing characteristics, impedance characteristics, and switch voltage characteristics of the filter according to Comparative Example 1. FIG. 8B illustrates graphs showing passing characteristics, impedance characteristics, and switch voltage characteristics of the filter according to Comparative Example 2. FIG. 8C illustrates graphs showing passing characteristics, impedance characteristics, and switch voltage characteristics of the filter according to Comparative Example 3. FIG. 9 illustrates graphs showing passing characteristics, impedance characteristics, and switch voltage characteristics of filter 10 according to Example 1.

TABLE 1

| Comp. Ex. 1 | Ns (Ct) | SW | fr1 (MHz) | fa1 (MHz) | Vs @B27 Rx (V) | Vs @B26 Rx (V) | Vs @B27 Tx (V) | Vs @B26 Tx (V) | IL @B27 Rx (dB) | IL @B26 Rx (dB) |
|---|---|---|---|---|---|---|---|---|---|---|
| P-arm ckt P1 | 9 | On | 825 | 865 | 1.24 | | 1.90 | | | |
| | | Off | 835 | 865 | | 2.84 | | 7.61 | | |
| P-arm ckt P2 | 9 | On | 837 | 876 | 1.01 | | 0.09 | | | |
| | | Off | 849 | 876 | | 6.94 | | 20.58 | | |
| P-arm ckt P3 | 9 | On | 833 | 873 | 0.87 | | 0.03 | | | |
| | | Off | 844 | 873 | | 3.39 | | 2.61 | | |
| P-arm ckt P4 | 9 | On | 833 | 872 | 0.96 | | 0.01 | | | |
| | | Off | 848 | 872 | | 7.42 | | 1.60 | | |
| Filter charcs. | | On | | | | | | | 2.42 | |
| | | Off | | | | | | | | 2.504 |

TABLE 2

| Comp. Ex. 2 | Ns (Ct) | SW | fr1 (MHz) | fa1 (MHz) | Vs @B27 Rx (V) | Vs @B26 Rx (V) | Vs @B27 Tx (V) | Vs @B26 Tx (V) | IL @B27 Rx (dB) | IL @B26 Rx (dB) |
|---|---|---|---|---|---|---|---|---|---|---|
| P-arm ckt P1 | 9 | On | 825 | 865 | 1.03 | | 0.02 | | | |
| | | Off | 835 | 865 | | 2.92 | | 0.11 | | |
| P-arm ckt P2 | 9 | On | 837 | 876 | 0.92 | | 0.04 | | | |
| | | Off | 849 | 876 | | 7.98 | | 1.63 | | |
| P-arm ckt P3 | 9 | On | 833 | 873 | 0.98 | | 0.23 | | | |
| | | Off | 844 | 873 | | 3.41 | | 2.83 | | |
| P-arm ckt P4 | 9 | On | 833 | 872 | 1.12 | | 1.26 | | | |
| | | Off | 848 | 872 | | 6.97 | | 19.43 | | |
| Filter charcs. | | On | | | | | | | 2.421 | |
| | | Off | | | | | | | | 2.504 |

TABLE 3

| Comp. Ex. 3 | Ns (Ct) | SW | fr1 (MHz) | fa1 (MHz) | Vs @B27 Rx (V) | Vs @B26 Rx (V) | Vs @B27 Tx (V) | Vs @B26 Tx (V) | IL @B27 Rx (dB) | IL @B26 Rx (dB) |
|---|---|---|---|---|---|---|---|---|---|---|
| P-arm ckt P1 | 3 | On | 827 | 865 | 0.48 | | 0.71 | | | |
| | | Off | 835 | 865 | | 2.85 | | 7.04 | | |
| P-arm ckt P2 | 9 | On | 837 | 876 | 1.02 | | 0.10 | | | |
| | | Off | 849 | 876 | | 6.93 | | 20.64 | | |
| P-arm ckt P3 | 2 | On | 835 | 873 | 0.18 | | 0.01 | | | |
| | | Off | 844 | 873 | | 3.44 | | 2.57 | | |
| P-arm ckt P4 | 4 | On | 834 | 872 | 0.44 | | 0.00 | | | |
| | | Off | 848 | 872 | | 7.81 | | 1.53 | | |
| Filter charcs. | | On | | | | | | | 2.135 | |
| | | Off | | | | | | | | 2.501 |

TABLE 4

| Ex. 1 | Ns (Ct) | SW | fr1 (MHz) | fa1 (MHz) | Vs @B27 Rx (V) | Vs @B26 Rx (V) | Vs @B27 Tx (V) | Vs @B26 Tx (V) | IL @B27 Rx (dB) | IL @B26 Rx (dB) |
|---|---|---|---|---|---|---|---|---|---|---|
| P-arm ckt P1 | 2 | On | 828 | 865 | 0.40 | | 0.01 | | | |
| | | Off | 835 | 865 | | 2.93 | | 0.12 | | |
| P-arm ckt P2 | 4 | On | 838 | 876 | 0.92 | | 0.04 | | | |
| | | Off | 849 | 876 | | 7.97 | | 1.37 | | |
| P-arm ckt P3 | 2 | On | 835 | 873 | 0.21 | | 0.05 | | | |
| | | Off | 844 | 873 | | 3.46 | | 2.47 | | |

TABLE 4-continued

| Ex. 1 | Ns (Ct) | SW | fr1 (MHz) | fa1 (MHz) | Vs @B27 Rx (V) | Vs @B26 Rx (V) | Vs @B27 Tx (V) | Vs @B26 Tx (V) | IL @B27 Rx (dB) | IL @B26 Rx (dB) |
|---|---|---|---|---|---|---|---|---|---|---|
| P-arm ckt P4 | 8 | On<br>Off | 833<br>848 | 872<br>872 | 0.49 | 7.14 | 0.53 | 19.42 | | |
| Filter charcs. | | On<br>Off | | | | | | | 2.088 | 2.501 |

TABLE 5

| | Power applied terminal | Stack count Ns of switch | | |
|---|---|---|---|---|
| Comp. Ex. 1 | I/O terminal 101 | Switch SW1a Stack count Ns1a | = | Switch SW4a Stack count Ns4a |
| Comp. Ex. 2 | I/O terminal 102 | Switch SW1a Stack count Ns1a | = | Switch SW4a Stack count Ns4a |
| Comp. Ex. 3 | I/O terminal 101 | Switch SW1a Stack count Ns1a | < | Switch SW4a Stack count Ns4a |
| Ex. 1 | I/O terminal 102 | Switch SW1a Stack count Ns1a | < | Switch SW4a Stack count Ns4a |

As shown in Tables 1 to 5, filter 10A according to Example 1 and the filters according to Comparative Examples 1 to 3 have substantially the same resonance characteristics (resonant frequencies and antiresonant frequencies). If the stack counts of switches are different, resistance and inductance when the switches are on and capacitance when the switches are off (off capacitance) are different. Accordingly, a resonant frequency when a switch is on is influenced by resistance and inductance of the switch, and an antiresonant frequency when a switch is off is influenced by off capacitance of the switch.

In filter 10A according to Example 1 and the filters according to Comparative Examples 1 to 3, as illustrated in the top left graphs in FIGS. 8A to 8C and 9, when switches SW1a to SW4a are on, first filter characteristics that Band27-Rx (852 to 869 MHz) is a first passband, and Band27-Tx (807 to 824 MHz) is a first attenuation band are achieved. As illustrated in the top right graphs in FIGS. 8A to 8C and 9, when switches SW1a to SW4a are off, second filter characteristics that Band26-Rx (859 to 894 MHz) is a second passband, and Band26-Tx (814 to 849 MHz) is a second attenuation band are achieved. Specifically, filter 10A according to Example 1, and the filters according to Comparative Examples 1 to 3 are frequency-tunable high-frequency filters (tunable filters) that switch between on and off of switches SW1 to SW4a.

Specifically, as illustrated in the middle left graphs in FIGS. 8A to 8C and 9, in parallel-arm circuits P1 to P4, the impedance of each switch is very low (ideally zero), capacitors Cp1a to Cp4a are short-circuited, characteristics of parallel-arm resonators p1a to p4a are dominant, when switches SW1a to SW4a are on. Accordingly, characteristics of parallel-arm circuits P1 to P4 when switches SW1a to SW4a are on are substantially the same as the characteristics of only parallel-arm resonators p1a to p4a.

On the other hand, when switches SW1a to SW4a are off, the impedance of each switch is very high (ideally infinite), and parallel-arm circuits P1 to P4 are circuits each constituted by one of parallel-arm resonators (p1a to p4a) and one of capacitors (Cp1a to Cp4a) connected in series. Thus, as illustrated in the middle right graphs in FIGS. 8A to 8C and 9, resonant frequencies of parallel-arm circuits (P1 to P4) are switched to higher frequencies than resonant frequencies of parallel-arm resonators (p1a to p4a).

Accordingly, switching between the conducting state and the no-conducting state of switches SW1 and SW2 can change the frequency of the attenuation pole on the passband low-frequency side, so as to switch between the first filter characteristics and the second filter characteristics.

Here, voltages V1a to V4a across switches SW1a to SW4a in the passband and the attenuation band are to be evaluated.

High electric power is not applied to a signal having a frequency in the passband of a receiving filter, yet in a multiplexer that includes a transmission filter such as a duplexer, high electric power is applied to a signal having a frequency in the attenuation band of the receiving filter, and thus it is important to ensure power durability also for the receiving filter. The below-mentioned examples describe a transmission filter and a TDD filter, and only a passband is to be considered in such cases. Yet such filters may be used as receiver filters, and thus evaluation is made for both the passband and the attenuation band.

5.1 Example 1 & Comparative Example 3 vs. Comparative Examples 1 & 2

In Comparative Examples 1 and 2, stack count Ns1 of switch element SW1a closer to input/output terminal 101 and stack count Ns2 of switch SW4a closer to input/output terminal 102 are made the same (see Tables 1 and 2) in order to achieve withstand voltages of switches SW1a to SW4a against applied power (+36 dBm).

On the other hand, in Comparative Example 3 and Example 1, the stack counts are determined according to voltages applied to switches SW1a to SW4a due to the application of power (+36 dBm) (see Tables 3 and 4).

In Comparative Examples 1 and 2, stack count Ns is high, and thus passband insertion loss when switches SW1a to SW4a are on is great (2.421 dB: see Tables 1 and 2). In contrast, in Comparative Example 3 and Example 1, stack count Ns is low, and thus passband insertion loss when switches SW1a to SW4a are on is lower (2.135 dB: see Table 3, 2.088 dB: see Table 4). This is due to a decrease in the resistance of the switches in the on state.

5.2 Example 1 vs. Comparative Example 3

In Comparative Example 3, power is applied through input/output terminal 101, whereas in Example 1, power is applied through input/output terminal 102.

When switches SW1a to SW4a are on, the switches have minute resistance components and minute inductor components and thus have low impedance, so that a high voltage is not applied to the switches. On the other hand, when switches SW1a to SW4a are off, the switches have off capacitance components and have extremely high impedance, so that a high voltage is applied to the switches. Accordingly, stack count Ns of semiconductor elements included in each switch is determined by applied voltage Vs across the switch when the switch is off.

In Comparative Example 3, when switches SW1a to SW4a are off, a total of voltages Vs across the switches is 31.78 V (additional value of Vs@B26Tx in Table 3). In contrast, in Example 1, when switches SW1a to SW4a are off, a total of voltages Vs across the switches is 28.37 V (additional value of Vs@B26Tx in Table 4). Specifically, a total of stack counts Ns of the switches in Example 1 can be made lower than that in Comparative Example 3. Accordingly, in Example 1, while ensuring power durability properties that filter 10A is to have, reduction in size of the filter and passband insertion loss when the switches are on can be achieved.

As illustrated in Tables 3 and 4 and the middle and bottom graphs in FIGS. 8C and 9, if resonant frequencies Froff of the parallel-arm circuits when the switches are off are low, voltage Vs across each switch tends to be low. However, in Comparative Example 3 in which power is applied through input/output terminal 101 closer to parallel-arm circuit P1 having lower resonant frequency Froff, power is distributed to other parallel-arm circuits P2 to P4 so that a total of voltages applied to the switches is increased. Thus, in Example 1 in which power is applied through input/output terminal 102 closer to parallel-arm circuit P4 having higher resonant frequency Froff, stack count Ns4a of switch SW4a increases, yet a total of stack counts Ns of the switches can be decreased. A total stack count is 18 in Comparative Example 3 (Table 3), whereas a total stack count is 16 in Example 1 (Table 4). Thus, in Example 1, resonant frequency Froff of parallel-arm circuit P1 when switch SW1 is off is lower than the resonant frequency of parallel-arm circuit P4 when switch SW4 is off. The lower resonant frequency Froff of a parallel-arm circuit when a switch is off is, the lower a voltage across the switch is. Accordingly, the stack count of a switch included in a parallel-arm circuit having low resonant frequency Froff can be decreased, and reduction in size and passband insertion loss when the switch is on can be achieved.

In Example 1, stack count Ns4a of switch SW4a is high, and thus the resistance of switch SW4a in the on state is high. To address this, the resistance of switch SW4a in the on state can be reduced by increasing gate width W4a of the semiconductor elements (FETs) of switch SW4a. Specifically, stack count Ns1a of switch SW1a is made lower than stack count Ns4a of switch SW4a, and furthermore gate width W4a of switch SW4a is made greater than gate width W1a of switch SW1a, thus ensuring power durability properties that filter 10A is to have, and also achieving reduction in size of the filter and passband insertion loss when the switches are on.

Note that gate width W4a of switch SW4a being greater than gate width W1a of switch SW1a means the gate width of each of one or more FETs included in switch SW4a being greater than the gate width of at least one of the one or more FETs included in switch SW1a. Note that in the following, with regard to a "gate width of a switch", the gate width of an FET included in the switch may be simply referred to as a "gate width of the switch". Also in the subsequent examples, gate width WX of switch X being greater than gate width WY of switch Y means the gate width of each of one or more FETs included in switch X being greater than the gate width of at least one of the one or more FETs included in switch Y.

5.3 Example of Configuration of High-Frequency Filter According to Example 1

Figure 10:
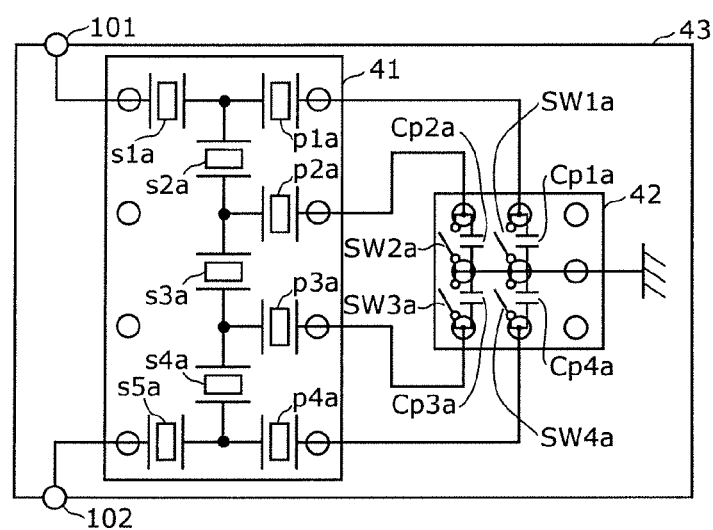
FIG. 10 is a plan view illustrating a structure of the filter according to Example 1.

FIG. 10 is a plan view illustrating a structure of filter 10A according to Example 1. Series-arm resonators s1a to s5a and parallel-arm resonators p1a to p4a are surface acoustic wave resonators each including an interdigital transducer (IDT) electrode, are formed on piezoelectric substrate 41, and are formed in a single package. Switches SW1a to SW4a and capacitor Cp1a to Cp4a are formed in a package different from the package in which series-arm resonator s1a to s5a and parallel-arm resonator p1a to p4a are formed. These two packages are mounted on wiring board 43, and are connected by lines formed on wiring board 43.

In this configuration, capacitors Cp1a to Cp4a are formed in the package in which the switches are formed, yet when capacitors Cp1a to Cp4a are formed using pectinate capacitance electrodes or a metal injection molded (MIM) capacitance electrodes, capacitors Cp1a to Cp4a may be formed on substrate 41 on which the resonators are formed. Note that in the viewpoint of the size reduction, capacitors Cp1a to Cp4a are preferably formed in the package in which the switches are formed. That is because if capacitors Cp1a to Cp4a are formed in a package that includes the resonators, the package needs to have more terminals, which results in an increase in the size of the package.

In the example of this configuration, the switch circuit that includes the capacitors and the switches is disposed on the ground side, out of the node side on a path that connects input/output terminals 101 and 102 and the ground side. In contrast, if the switch circuit is disposed on the node side, both the package that includes the resonators and the package that includes the switches need to have more terminals, which results in an increase in the size of the filter. From this viewpoint, filter 10A can be miniaturized by disposing the switch circuit closer to the ground than the parallel-arm resonators are, out of the node side and the ground side.

According to filter 10A according to Example 1 as stated above:
(1) In a configuration in which voltage V1a across switch SW1a is lower than voltage V4a across switch SW4a, by making stack count Ns1 of switch SW1a lower than stack count Ns4 of switch SW4a, power durability that filter 10A is to have is ensured, and furthermore reduction in size of filter 10A and passband insertion loss when the switches are conducting can be achieved.
(2) The frequency of the attenuation pole on the passband low-frequency side can be switched (changed) to another frequency by switching between the conducting and non-conducting states of the switches.
(3) By making gate width W4a of switch SW4a greater than gate width W1a of switch SW1a, passband insertion loss when the switches are conducting can be reduced.
(4) Filter 10A can be miniaturized by disposing the switch circuit closer to the ground than the parallel-arm resonators are, out of the node side and the ground side.

[6. High-Frequency Filter According to Example 2]

Figure 11:
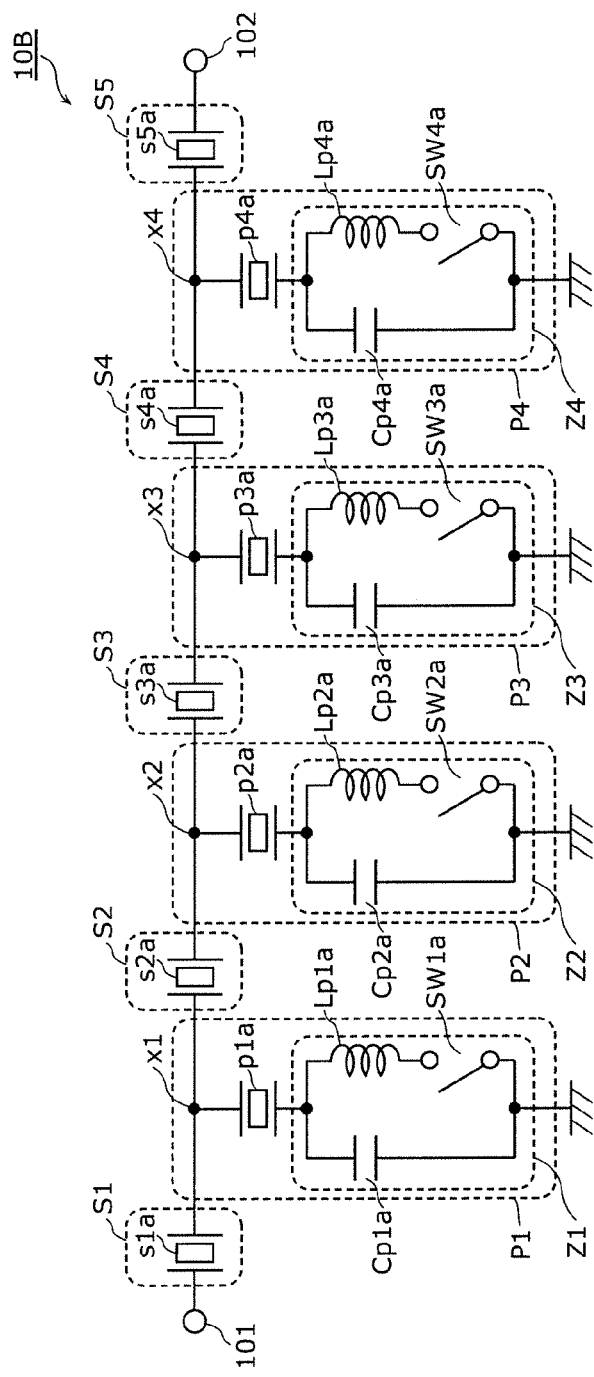
FIG. 11 illustrates a circuit configuration of a filter according to Example 2.

FIG. 11 illustrates a circuit configuration of filter 10B according to Example 2. Filter 10B illustrated in FIG. 11 is different from filter 10A according to Example 1 in the configuration of the switch circuit. In the following, description of the common points of filter 10B according to Example 2 to those of filter 10A according to Example 1 is omitted, and different points are mainly described.

As illustrated in FIG. 11, filter 10B includes series-arm circuits S1, S2, S3, S4, and S5, parallel-arm circuits P1, P2, P3, and P4, and input/output terminals 101 and 102.

Parallel-arm circuit P1 includes parallel-arm resonator p1a (first parallel-arm resonator), and switch circuit Z1 connected in series to parallel-arm resonator p1a. Parallel-arm circuit P2 includes parallel-arm resonator p2a, and switch circuit Z2 connected in series to parallel-arm resonator p2a. Parallel-arm circuit P3 includes parallel-arm resonator p3a, and switch circuit Z3 connected in series to parallel-arm resonator p3a. Parallel-arm circuit P4 includes parallel-arm resonator p4a (second parallel-arm resonator), and switch circuit Z4 connected in series to parallel-arm resonator p4a.

Switch circuit Z1 includes a first switch circuit that includes capacitor Cp1a (first capacitor), switch SW1a (first switch element), and inductor Lp1a (first inductor). Inductor Lp1a is connected in series to switch SW1a, and a circuit constituted by inductor Lp1a and switch SW1a connected in series is connected in parallel to capacitor Cp1a. Switch circuit Z2 includes capacitor Cp2a, switch SW2a, and inductor Lp2a. Inductor Lp2a is connected in series to switch SW2a, and a circuit constituted by inductor Lp2a and switch SW2a connected in series is connected in parallel to capacitor Cp2a. Switch circuit Z3 includes capacitor Cp3a, switch SW3a, and inductor Lp3a. Inductor Lp3a is connected in series to switch SW3a, and a circuit constituted by inductor Lp3a and switch SW3a connected in series is connected in parallel to capacitor Cp3a. Switch circuit Z4 is a second switch circuit that includes capacitor Cp4a (second capacitor), switch SW4a (second switch element), and inductor Lp4a (second inductor). Inductor Lp4a is connected in series to switch SW4a, and a circuit constituted by inductor Lp4a and switch SW4a connected in series is connected in parallel to capacitor Cp4a.

In filter 10B according to this example, switch circuits (Z1 to Z4) each include a parallel circuit in which one of capacitors (Cp1a to Cp4a) is connected in parallel to a series circuit of one of switches (SW1a to SW4a) and one of inductors (Lp1a to Lp4a), and thus the resonant frequencies of parallel-arm circuits (P1 to P4) are switched to higher frequencies (from Fron to Froff) by switching switches SW1a to SW4a from on to off. When switches SW1a to SW4a are on, inductors (Lp1a to Lp4a) connected in series to the switches can locate resonant frequencies Fron of the parallel-arm circuits that are the resonant frequencies when switches SW1a to SW4a are on, at lower frequencies than resonant frequencies of the parallel-arm resonators (p1a to p4a). Accordingly, by switching between on and off of switches SW1a to SW4a, the range in which the frequency of the attenuation pole on the passband low-frequency side can be changed can be made greater than the range of filter 10A according to Example 1. Note that when switches SW1a to SW4a are off, the circuit configuration of filter 10B is the same as that of filter 10A according to Example 1.

Here, voltage Vs1a across switch SW1a is lower than voltage Vs4a across switch SW4a, and first stack count Ns1a that is the number of one or more semiconductor elements connected in series and included in switch SW1a is lower than second stack count Ns4a that is the number of one or more semiconductor elements connected in series and included in switch SW4a. This ensures power durability that filter 10B is to have and also achieves reduction in size of filter 10B and passband insertion loss when the switches are conducting.

Figure 12:
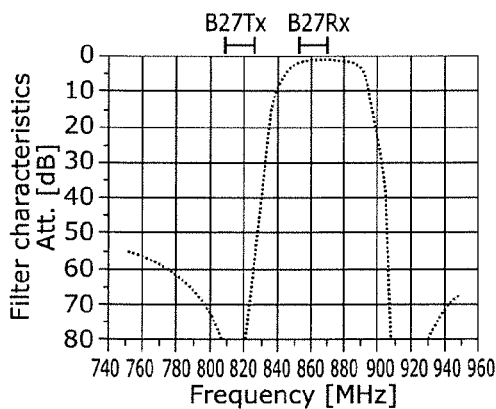
FIG. 12 illustrates graphs showing passing characteristics, impedance characteristics, and switch voltage characteristics of the filter according to Example 2.
Figure 12:
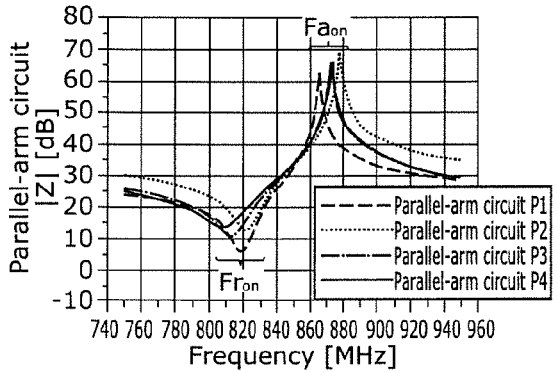
Figure 12:
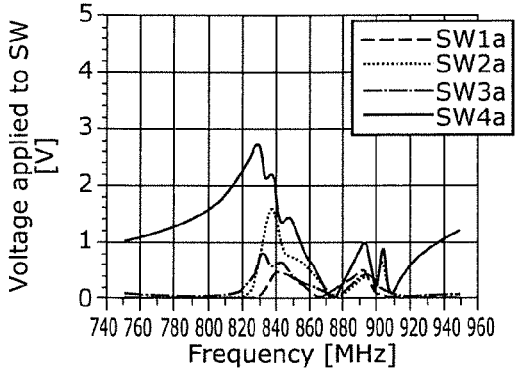
Figure 12:
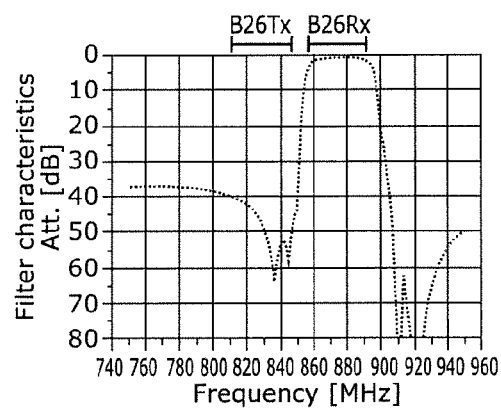
Figure 12:
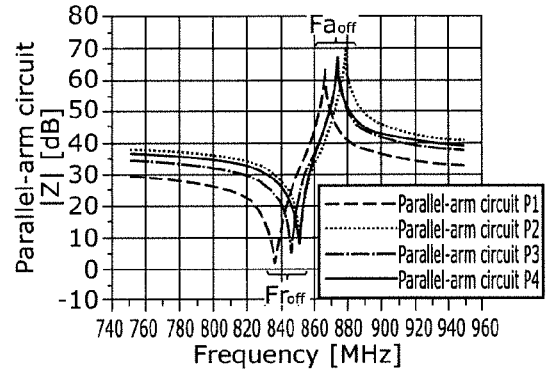
Figure 12:
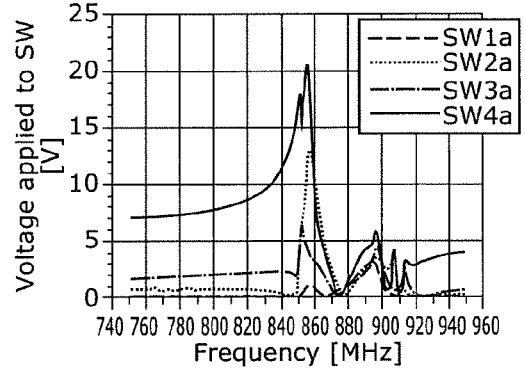

Table 6 illustrates resonator parameters, switch voltages, and insertion losses of filter 10B according to Example 2. FIG. 12 illustrates graphs showing passing characteristics, impedance characteristics, and switch voltage characteristics of filter 10B according to Example 2.

TABLE 6

| Ex. 2 | Ns (Ct) | SW | fr1 (MHz) | fa1 (MHz) | Vs @B27 Rx (V) | Vs @B26 Rx (V) | Vs @B27 Tx (V) | Vs @B26 Tx (V) | IL @B27 Rx (dB) | IL @B26 Rx (dB) |
|---|---|---|---|---|---|---|---|---|---|---|
| P-arm ckt P1 | 2 | On | 820 | 866 | 0.33 | | 3.29 | | | |
| | | Off | 836 | 866 | | 2.86 | | 0.11 | | |
| P-arm ckt P2 | 5 | On | 822 | 878 | 0.70 | | 0.09 | | | |
| | | Off | 851 | 878 | | 11.16 | | 0.74 | | |
| P-arm ckt P3 | 2 | On | 813 | 873 | 0.37 | | 0.26 | | | |
| | | Off | 845 | 873 | | 3.28 | | 1.98 | | |
| P-arm ckt P4 | 7 | On | 808 | 874 | 1.25 | | 2.44 | | | |
| | | Off | 850 | 874 | | 11.11 | | 16.05 | | |
| Filter charcs. | | On | | | | | | | 2.239 | |
| | | Off | | | | | | | | 2.396 |

As illustrated in the top left graph in FIG. 12, when switches SW1a to SW4a are on, filter 10B according to Example 2 has first filter characteristics that Band27-Rx is a first passband, and Band27-Tx is a first attenuation band. Further, as illustrated in the top right graph in FIG. 12, when switches SW1a to SW4a are off, filter 10B has second filter characteristics that Band26-Rx is a second passband, and Band26-Tx is a second attenuation band.

Parallel-arm circuits P1 to P4 are circuits in each of which one of the parallel-arm resonators (p1a to p4a) is connected in series to a circuit constituted by one of the inductors (Lp1a to Lp4a) and one of the capacitors (Cp1a to Cp4a) connected in parallel.

Specifically, as illustrated in the middle left graph in FIG. 12, when switches SW1a to SW4a are on in parallel-arm circuits P1 to P4, capacitors Cp1a to Cp4a are short-circuited, so that parallel-arm circuits P1 to P4 are circuits in each of which one of the parallel-arm resonators (p1a to p4a) is connected in series to a circuit constituted by one of the inductors (Lp1a to Lp4a) and one of the capacitors (Cp1a to Cp4a) connected in parallel. The frequencies at which the circuits each constituted by one of the inductors (Lp1a to Lp4a) and one of the capacitors (Cp1a to Cp4a) connected in parallel have the local maximum impedance are designed to be higher than the resonant frequencies of the parallel-arm resonators (p1a to p4a), and the circuits each constituted by one of the inductors (Lp1a to Lp4a) and one of the capacitors (Cp1a to Cp4a) connected in parallel have inductive impedance at the resonant frequencies of the parallel-arm resonators (p1a to p4a). (Thus, the circuits function as inductors.) Accordingly, resonant frequencies Fron of the parallel-arm circuits are located at lower frequencies than the resonant frequencies of the parallel-arm resonators (p1a to p4a).

On the other hand, when switches SW1a to SW4a are off, the impedance of each switch is very high (ideally infinite), and parallel-arm circuits P1 to P4 are each constituted by one of the parallel-arm resonators (p1a to p4a) and one of the capacitors (Cp1a to Cp4a) connected in series. Thus, as illustrated in the middle right graph in FIG. 12, resonant frequencies Froff of the parallel-arm circuits are switched to be higher frequencies than the resonant frequencies of the parallel-arm resonators (p1a to p4a).

Accordingly, switching between on and off of switches SW1a to SW4a can change the frequency of the attenuation pole on the passband low-frequency side, and switch between the first filter characteristics and the second filter characteristics.

Figure 13A:
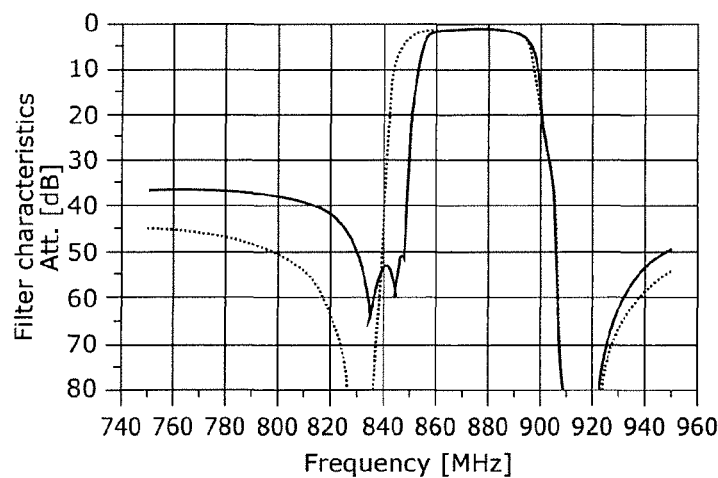
FIG. 13A is a graph showing passing characteristics of the filter according to Example 1.
Figure 13B:
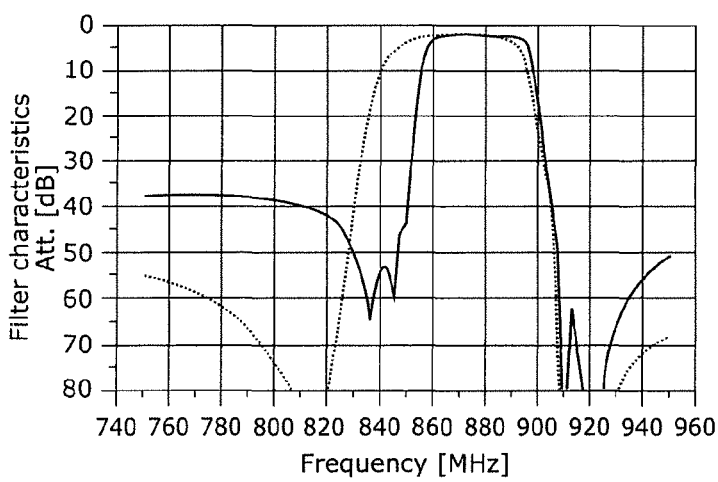
FIG. 13B is a graph showing passing characteristics of the filter according to Example 2.

FIG. 13A is a graph showing passing characteristics of filter 10A according to Example 1. FIG. 13B is a graph showing passing characteristics of filter 10B according to Example 2. FIGS. 13A and 13B show changes in passing characteristics of filters 10A and 10B caused by switching between on and off of switches SW1a to SW4a, respectively. As described above, filter 10B according to Example 2 can further increase, using the inductors (Lp1a to Lp4a) connected to the switches (SW1a to SW4a) in series, the range in which the frequency of the attenuation pole on the passband low-frequency side can be changed, as compared with filter 10A according to Example 2. Accordingly, as illustrated in FIGS. 13A and 13B, filter 10B can ensure a greater frequency changeable range of the passband than that of filter 10A.

[7. High-Frequency Filter According to Example 3]

Figure 14A:
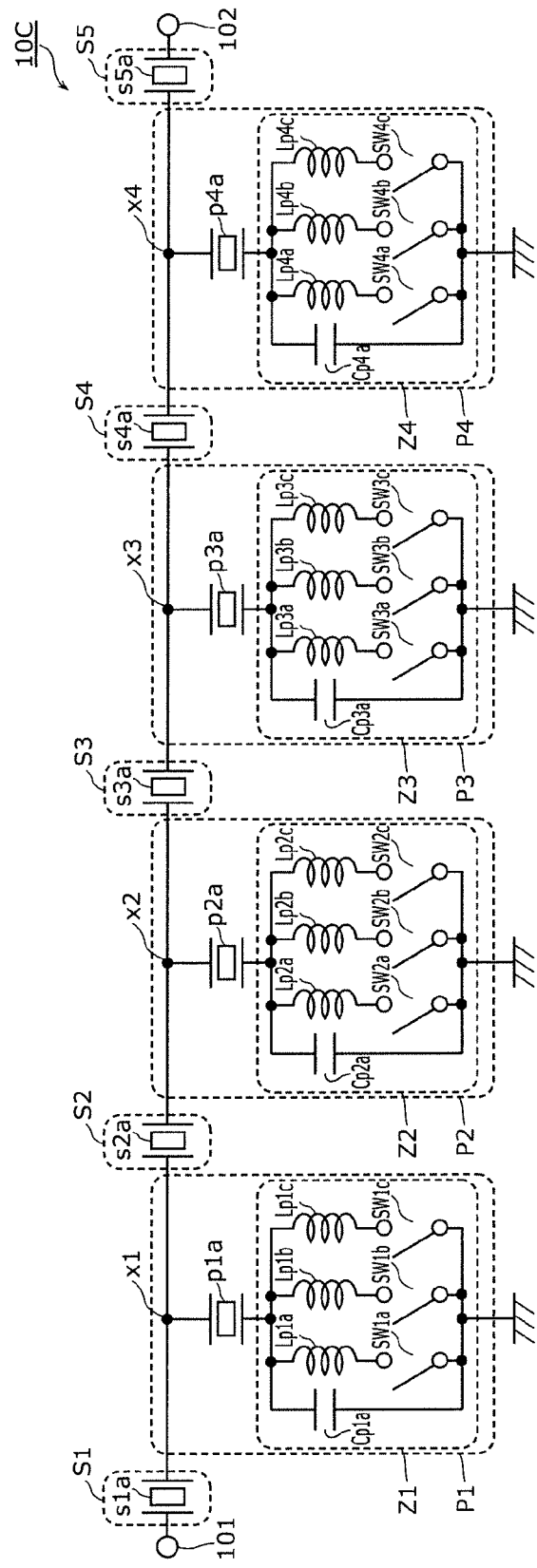
FIG. 14A illustrates a circuit configuration of a filter according to Example 3.

FIG. 14A illustrates a circuit configuration of filter 10C according to Example 3. Filter 10C illustrated FIG. 14A is different from filter 10B according to Example 2 in a switch circuit configuration. More specifically, in each switch circuit, circuits each constituted by a switch and an inductor connected in series are connected in parallel to a capacitor. In the following, description of the common points of filter 10C according to Example 3 to those of filter 10B according to Example 2 is omitted, and different points are mainly described.

As illustrated in FIG. 14A, filter 10C includes series-arm circuits S1, S2, S3, S4, and S5, parallel-arm circuits P1, P2, P3, and P4, and input/output terminals 101 and 102.

Parallel-arm circuit P1 includes parallel-arm resonator p1a (first parallel-arm resonator), and switch circuit Z1 connected in series to parallel-arm resonator p1a. Parallel-arm circuit P2 includes parallel-arm resonator p2a, and switch circuit Z2 connected in series to parallel-arm resonator p2a. Parallel-arm circuit P3 includes parallel-arm resonator p3a, and switch circuit Z3 connected in series to parallel-arm resonator p3a. Parallel-arm circuit P4 includes parallel-arm resonator p4a (second parallel-arm resonator), and switch circuit Z4 connected in series to parallel-arm resonator p4a.

Switch circuit Z1 is a first switch circuit that includes capacitor Cp1a (first capacitor), switches SW1a, SW1b, and SW1c (first switch elements), and inductors Lp1a, Lp1b, and Lp1c (first inductors). Inductor Lp1a is connected in series to switch SW1a, and a circuit constituted by inductor Lp1a and switch SW1a connected in series is connected in parallel to capacitor Cp1a. Inductor Lp1b is connected in series to switch SW1b, and a circuit constituted by inductor Lp1b and switch SW1b connected in series is connected in parallel to capacitor Cp1a. Inductor Lp1c is connected in series to switch SW1c, and a circuit constituted by inductor Lp1c and switch SW1c connected in series is connected in parallel to capacitor Cp1a. Inductors Lp1a, Lp1b, and Lp1c have different inductance values.

Switch circuit Z2 includes capacitor Cp2a, switches SW2a, SW2b, and SW2c, and inductors Lp2a, Lp2b and Lp2c. Inductor Lp2a is connected in series to switch SW2a, and a circuit constituted by inductor Lp2a and switch SW2a connected in series is connected in parallel to capacitor Cp2a. Inductor Lp2b is connected in series to switch SW2b, and a circuit constituted by inductor Lp2b and switch SW2b connected in series is connected in parallel to capacitor Cp2a. Inductor Lp2c is connected in series to switch SW2c, and a circuit constituted by inductor Lp2c and switch SW2c connected in series is connected in parallel to capacitor Cp2a. Inductors Lp2a, Lp2b, and Lp2c have different inductance values.

Switch circuit Z3 includes capacitor Cp3a, switches SW3a, SW3b, and SW3c, and inductors Lp3a, Lp3b and Lp3c. Inductor Lp3a is connected in series to switch SW3a, and a circuit constituted by inductor Lp3a and switch SW3a connected in series is connected in parallel to capacitor Cp3a. Inductor Lp3b is connected in series to switch SW3b, and a circuit constituted by inductor Lp3b and switch SW3b connected in series is connected in parallel to capacitor Cp3a. Inductor Lp3c is connected in series to switch SW3c, and a circuit constituted by inductor Lp3c and switch SW3c connected in series is connected in parallel to capacitor Cp3a. Inductors Lp3a, Lp3b, and Lp3c have different inductance values.

Switch circuit Z4 is a second switch circuit that includes capacitor Cp4a (second capacitor), switches SW4a, SW4b, and SW4c (second switch elements), and inductors Lp4a, Lp4b, and Lp4c (second inductors). Inductor Lp4a is connected in series to switch SW4a, and a circuit constituted by inductor Lp4a and switch SW4a connected in series is connected in parallel to capacitor Cp4a. Inductor Lp4b is connected in series to switch SW4b, and a circuit constituted by inductor Lp4b and switch SW4b connected in series is connected in parallel to capacitor Cp4a. Inductor Lp4c is connected in series to switch SW4c, and a circuit constituted by inductor Lp4c and switch SW4c connected in series is connected in parallel to capacitor Cp4a. Inductors Lp4a, Lp4b, and Lp4c have different inductance values.

Here, voltage Vs1a across switch SW1a, voltage Vs1b across switch SW1b, and voltage Vs1c across switch SW1c are lower than voltage Vs4a across switch SW4a, voltage Vs4b across switch SW4b, and voltage Vs4c across switch SW4c. In this configuration, stack count Ns1a of switch SW1a, stack count Ns1b of switch SW1b, and stack count Ns1c of switch SW1c are lower than stack count Ns4a of switch SW4a, stack count Ns4b of switch SW4b, and stack count Ns4c of switch SW4c. This ensures power durability that filter 10C is to have and also achieves reduction in size of filter 10C and passband insertion loss when the switches are conducting.

Figure 14B:
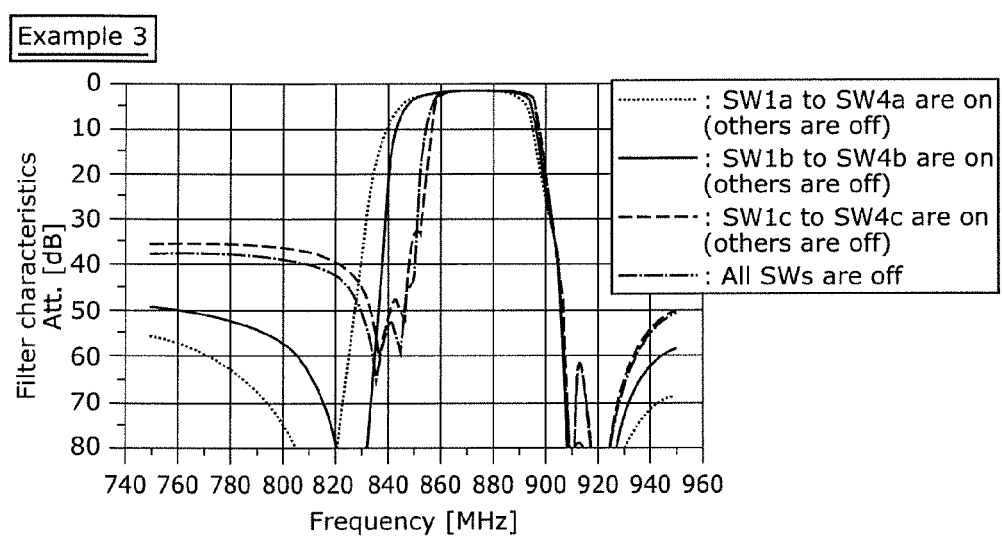
FIG. 14B is a graph showing passing characteristics of the filter according to Example 3.

FIG. 14B is a graph showing passing characteristics of filter 10A according to Example 3. In filter 10C according to this example, in each of the switch circuits (Z1 to Z4), circuits each constituted by a switch and an inductor connected in series are connected in parallel to a capacitor. In this configuration, individually switching between a conducting state and a non-conducting state of three switches in each switch circuit can increase a range in which a frequency of the attenuation pole on the passband low-frequency side is changed, and furthermore finely change the frequency of the attenuation pole, as illustrated in FIG. 14B.

Note that in Example 3, three inductors included in one switch circuit have different inductance values, yet may have the same inductance value. This also can change the inductance value of a switch circuit by changing the number of switches in the conducting state. Also, when a plurality of switches are conducting, the Q factors of the inductors can be improved, and a plurality of switches are provided in parallel. Thus, the Q factors of the resonant frequencies of the parallel-arm circuits can be increased, and the loss of the high-frequency filter can be reduced.

[8. High-Frequency Filter According to Example 4]

Figure 15:
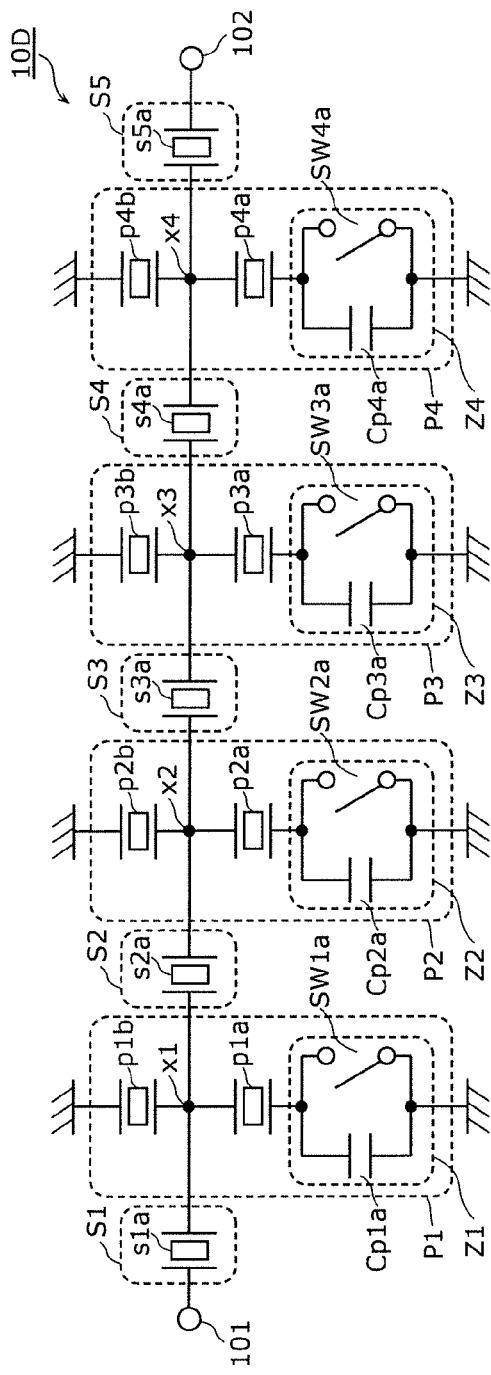
FIG. 15 illustrates a circuit configuration of a filter according to Example 4.

FIG. 15 illustrates a circuit configuration of filter 10D according to Example 4. Filter 10D illustrated in FIG. 15 is different from filter 10A according to Example 1 in a configuration of a parallel-arm circuit. More specifically, one parallel-arm circuit includes two parallel-arm resonators. In the following, description of the common points of filter 10D according to Example 4 to those of filter 10A according to Example 1 is omitted, and different points are mainly described.

As illustrated in FIG. 15, filter 10D includes series-arm circuits S1, S2, S3, S4, and S5, parallel-arm circuits P1, P2, P3, and P4, and input/output terminals 101 and 102.

Parallel-arm circuit P1 is a first parallel-arm circuit connected to the ground and node x1 (first node) on a path between series-arm circuits S1 and S2. Parallel-arm circuit P2 is connected to the ground and node x2 on a path between series-arm circuits S2 and S3. Parallel-arm circuit P3 is connected to the ground and node X3 on a path between series-arm circuits S3 and S4. Parallel-arm circuit P4 is a second parallel-arms circuit connected to the ground and node x4 (second node) on a path between series-arm circuits S4 and S5.

Parallel-arm circuit P1 includes parallel-arm resonator p1a (first parallel-arm resonator), parallel-arm resonator p1b (third parallel-arm resonator), and switch circuit Z1 connected in series to parallel-arm resonator p1a. Parallel-arm resonator p1b and a circuit constituted by parallel-arm resonator p1a and switch circuit Z1 connected in series are connected in parallel between node x1 and the ground.

Parallel-arm circuit P2 includes parallel-arm resonators p2a and p2b, and switch circuit Z2 connected in series to parallel-arm resonator p2a. Parallel-arm resonator p2b and a circuit constituted by parallel-arm resonator p2a and switch circuit Z2 connected in series are connected in parallel between node x2 and the ground.

Parallel-arm circuit P3 includes parallel-arm resonators p3a and p3b, and switch circuit Z3 connected in series to parallel-arm resonator p3a. Parallel-arm resonator p3b and a circuit constituted by parallel-arm resonator p3a and switch circuit Z3 connected in series are connected in parallel between node x3 and the ground.

Parallel-arm circuit P4 includes parallel-arm resonator p4a (second parallel-arm resonator), parallel-arm resonator p4b (fourth parallel-arm resonator), and switch circuit Z4 connected in series to parallel-arm resonator p4a. Parallel-arm resonator p4b and a circuit constituted by parallel-arm resonator p4a and switch circuit Z4 connected in series are connected in parallel between node x4 and the ground.

Here, resonant frequency frp1a of parallel-arm resonator p1a is lower than resonant frequency frp1b of parallel-arm resonator p1b, and antiresonant frequency fap1a of parallel-arm resonator p1a is lower than antiresonant frequency fap1b of parallel-arm resonator p1b. Resonant frequency frp4a of parallel-arm resonator p4a is lower than resonant frequency frp4b of parallel-arm resonator p4b, and antiresonant frequency fap4a of parallel-arm resonator p4a is lower than antiresonant frequency fap4b of parallel-arm resonator p4b. Resonant frequency frp2a of parallel-arm resonator p2a is lower than resonant frequency frp2b of parallel-arm resonator p2b, and antiresonant frequency fap2a of parallel-arm resonator p2a is lower than antiresonant frequency fap2b of parallel-arm resonator p2b. Resonant frequency frp3a of parallel-arm resonator p3a is lower than resonant frequency frp3b of parallel-arm resonator p3b, and antiresonant frequency fap3a of parallel-arm resonator p3a is lower than antiresonant frequency fap3b of parallel-arm resonator p3b.

Voltage Vs1a across switch SW1a is lower than voltage Vs4a across switch SW4a, and first stack count Ns1a that is the number of one or more semiconductor elements connected in series and included in switch SW1a is lower than second stack count Ns4a that is the number of one or more semiconductor elements connected in series and included in switch SW4a.

Switch circuits Z1 to Z4 according to this example have the same circuit configuration as that of switch circuits Z1 to Z4 according to Example 1, and thus a description of the circuit configuration is omitted.

Figure 16:
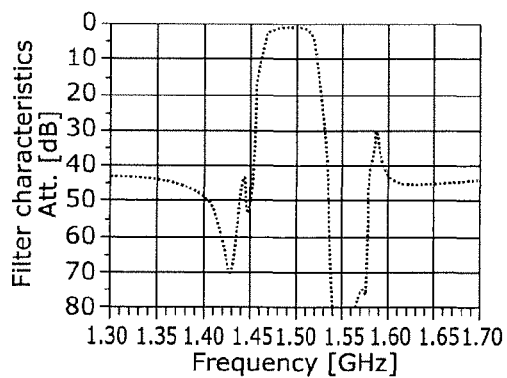
FIG. 16 illustrates graphs showing passing characteristics, impedance characteristics, and switch voltage characteristics of a filter according to Comparative Example 4.
Figure 16:
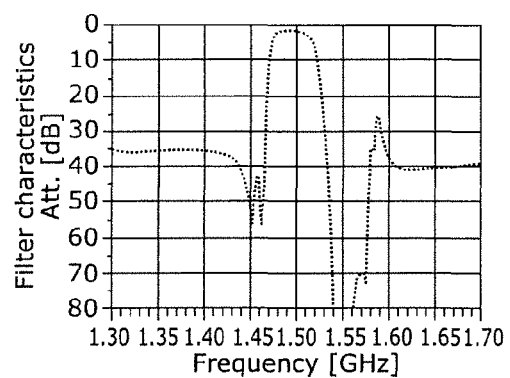
Figure 16:
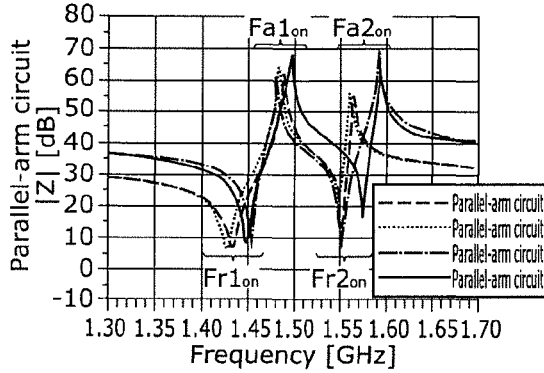
Figure 16:
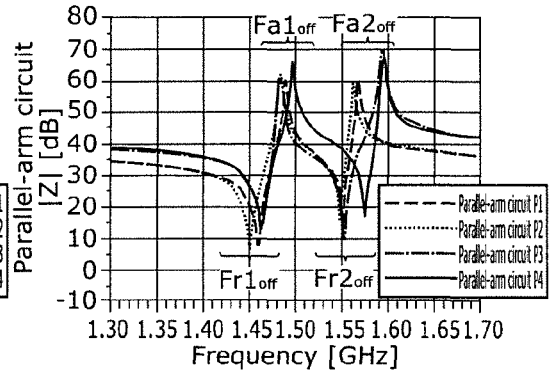
Figure 16:
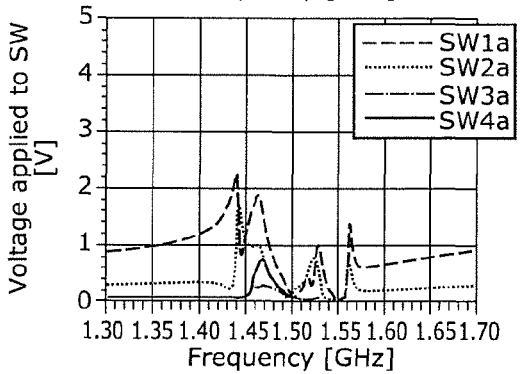
Figure 16:
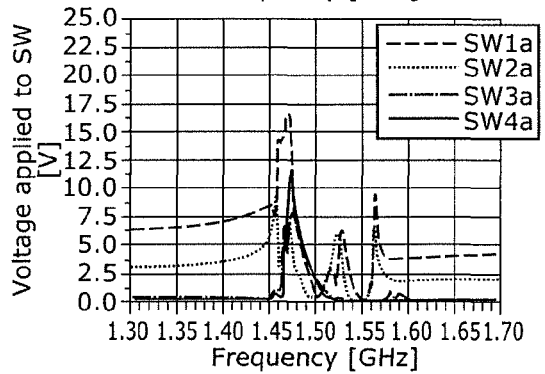
Figure 17:
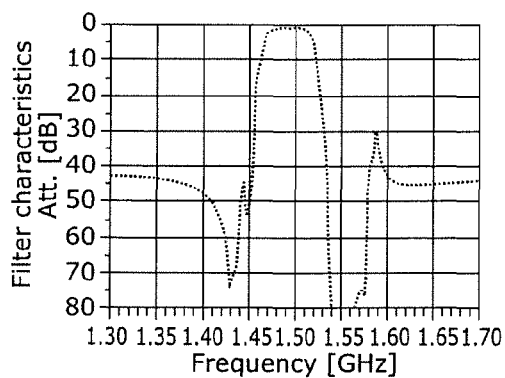
FIG. 17 illustrates graphs showing passing characteristics, impedance characteristics, and switch voltage characteristics of the filter according to Example 4.
Figure 17:
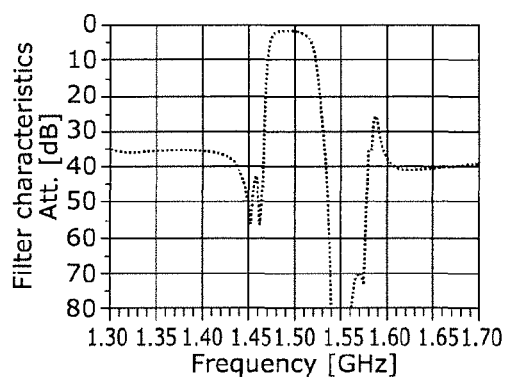
Figure 17:
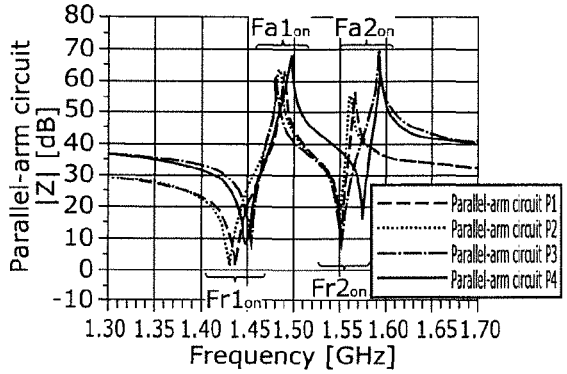
Figure 17:
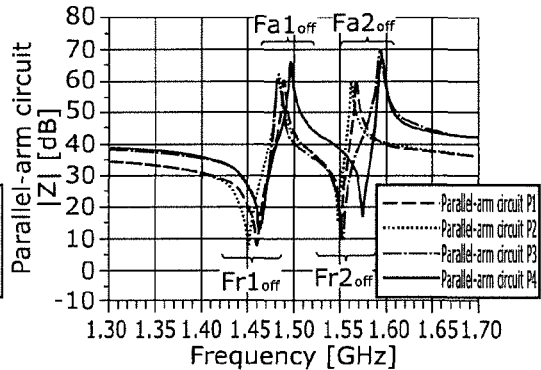
Figure 17:
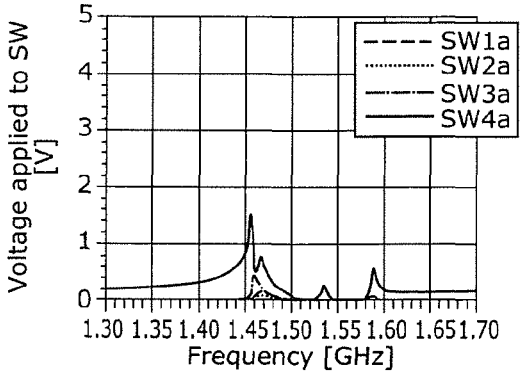
Figure 17:
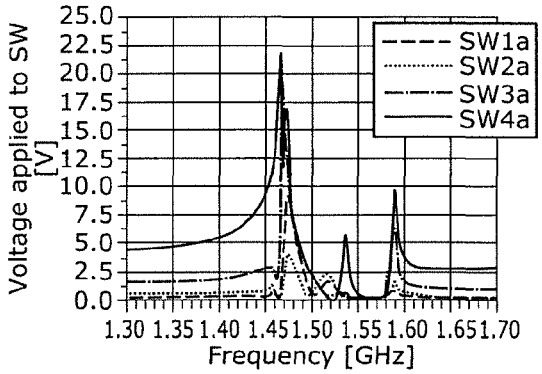

FIG. 16 illustrates graphs showing passing characteristics, impedance characteristics, and switch voltage characteristics of the filter according to Comparative Example 4. FIG. 17 illustrates graphs showing passing characteristics, impedance characteristics, and switch voltage characteristics of filter 10D according to Example 4.

First, impedance characteristics of parallel-arm circuits P1 to P4 are to be described, using in particular parallel-arm circuit P1 as an example. When switch SW1a is on, switch SW1a short-circuits capacitor Cp1a, and the impedance characteristics of parallel-arm circuit P1 are not influenced by capacitor Cp1a. Specifically, in this case, combined characteristics (characteristics of parallel-arm circuit P1 shown by the middle left graph in FIG. 16 and by the middle left graph in FIG. 17) of two parallel-arm resonators (parallel-arm resonators p1a and p1b) are impedance characteristics of parallel-arm circuit P1.

Specifically, when switch SW1a is on, parallel-arm circuit P1 has impedance characteristics as follows. Parallel-arm circuit P1 has two resonant frequencies Fr1on and Fr2on (at this time, the following are satisfied: Fr1on=resonant frequency frp1a of parallel-arm resonator p1a, and Fr2on=resonant frequency frp1b of parallel-arm resonator p1b). Specifically, impedance of parallel-arm circuit P1 has a local minimum value at resonant frequency frp1a of parallel-arm resonator p1a, and a local minimum value at resonant frequency frp1b of parallel-arm resonator p1b.

Parallel-arm circuit P1 has two antiresonant frequencies Fa1on and Fa2on (at this time, the following are all satisfied: Fr1on<Fa1on<Fr2on<Fa2on; Fa1on<antiresonant frequency fap1a of parallel-arm resonator p1a; and Fa2on<antiresonant frequency fap1b of parallel-arm resonator p1b). Specifically, impedance of parallel-arm circuit P1 has a local maximum value at a frequency between resonant frequency frp1a of parallel-arm resonator p1a and resonant frequency frp1b of parallel-arm resonator p1b, and a local maximum value at a frequency between antiresonant frequency fap1a of parallel-arm resonator p1a and antiresonant frequency fap1b of parallel-arm resonator p1b.

Here, the reason for Fa1on<fap1a being satisfied is that parallel-arm resonator p1b connected in parallel to parallel-arm resonator p1a operates as a parallel capacitor, in a frequency band near antiresonant frequency fap1a of parallel-arm resonator p1a. The reason for Fa2on<fap1b being satisfied is that parallel-arm resonator p1a connected in parallel to parallel-arm resonator p1b operates as a parallel capacitor, in a frequency band near antiresonant frequency fap1b of parallel-arm resonator p1b.

When configuring a band pass filter using a ladder filter structure, antiresonant frequency Fa1on of parallel-arm circuit P1 and resonant frequency frs1a of series-arm resonator s1a are brought close to each other. Accordingly, when switch SW1a is on, a frequency region near resonant frequency Fr1on at which the impedance of parallel-arm circuit P1 approaches 0 is a low-frequency stop band. If the frequency is higher than resonant frequency Fr1on, the impedance of parallel-arm circuit P1 is high at a frequency near antiresonant frequency Fa1on, and the impedance of series-arm resonator s1a approaches 0 at a frequency near resonant frequency frs. Accordingly, frequency regions near antiresonant frequency Fa1on and resonant frequency frs1a are passbands for signals. Furthermore, if the frequency is increased so as to be near resonant frequency Fr2on and antiresonant frequency fas1a, the impedance of series-arm resonator s1a and the impedance of parallel-arm circuit P1 approach 0, which provides a high-frequency stop band.

Specifically, when switch SW1a is on, filter 10D has first filter characteristics that a passband is determined by antiresonant frequency Fa1on and resonant frequency frs1a, the pole (attenuation pole) on the passband low-frequency side is determined by resonant frequency Fr1on, and the pole (attenuation pole) on the passband high-frequency side is determined by resonant frequency Fr2on and antiresonant frequency fas1a.

On the other hand, when switch SW1a is off, switch SW1a does not short-circuit capacitor Cp1a, and thus the impedance characteristics of parallel-arm circuit P1 are influenced by capacitor Cp1a. Specifically, in this case, combined characteristics (combined characteristics of parallel-arm circuit P1 as shown by the middle right graph in FIG. 16 and by the middle right graph in FIG. 17) of two parallel-arm resonators (parallel-arm resonators p1a and p1b) and capacitor Cp1a connected in series to parallel-arm resonator p1a are the impedance characteristics of parallel-arm circuit P1.

Specifically, when switch SW1a is off, parallel-arm circuit P1 has the following impedance characteristics. Parallel-arm circuit P1 has two resonant frequencies Fr1off and Fr2off and two antiresonant frequencies Fa1off and Fa2off (at this time, the following are all satisfied: Fr1off<Fa1off <Fr2off<Fa2off; Fa1off<fap1a; frp1a<Fr1off; and Fa2off<fap1b). Specifically, impedance of parallel-arm circuit P1 has a local minimum value at a frequency higher than resonant frequency frp1a of parallel-arm resonator p1a, and a local minimum value at resonant frequency frp1b of parallel-arm resonator p1b. Impedance of parallel-arm circuit P1 has a local maximum value at a frequency between resonant frequency frp1a of parallel-arm resonator p1a and resonant frequency frp1b of parallel-arm resonator p1b, and a local maximum value at a frequency between antiresonant frequency fap1a of parallel-arm resonator p1a and antiresonant frequency fap1b of parallel-arm resonator p1b.

Here, a reason for Fa1off<fap1a being satisfied is that parallel-arm resonator p1b connected in parallel to parallel-arm resonator p1a operates as a parallel capacitor in a frequency band near antiresonant frequency fap1a of parallel-arm resonator p1a. Further, a reason for frp1a<Fr1off being satisfied is that resonance of parallel-arm resonator p1a and capacitor Cp1a occurs in a frequency band near resonant frequency frp1a of parallel-arm resonator p1a. Further, a reason for Fa2off<fap1b being satisfied is that combined characteristics of parallel-arm resonator p1a and capacitor Cp1a connected in parallel to parallel-arm resonator p1b function as a parallel capacitor.

Specifically, when switch SW1a is off, filter 10D has second filter characteristics that a passband is determined by antiresonant frequency Fa1off and resonant frequency frs1a, the pole (attenuation pole) on the passband low-frequency side is determined by resonant frequency Fr1off, and the pole (attenuation pole) on the passband high-frequency side is determined by resonant frequency Fr2off and antiresonant frequency fas1a.

As illustrated in the middle graphs in FIG. 16 and the middle graphs in FIG. 17, if switches SW1a to SW4a are switched from on to off, impedance characteristics of parallel-arm circuits P1 to P4 are changed as follows. Accordingly, a lower resonant frequency of two resonant frequencies and a lower antiresonant frequency of two antiresonant frequencies of each of parallel-arm circuits P1 to P4 are both switched to be higher frequencies. In this example, only parallel-arm resonator p1a is connected in series to capacitor Cp1a and switch SW1a, and thus the lower resonant frequency of two resonant frequencies is switched from Fr1on to Fr1off to be a higher frequency. Also, the lower antiresonant frequency is switched from Fa1on to Fa1off to be a higher frequency.

Here, lower antiresonant frequencies and lower resonant frequencies of parallel-arm circuits P1 to P4 determine the attenuation slope on the passband low-frequency side of filter 10D, and are all switched to higher frequencies, as described above. Accordingly, as illustrated in the top graphs in FIG. 17, switching switch SW1a from on to off switches passing characteristics of filter 10D to higher-frequency characteristics while the attenuation slope on the passband low-frequency side maintains its steepness. In other words, filter 10D can switch a frequency at the passband low-frequency edge to a higher frequency while switching the attenuation pole on the passband low-frequency side to an attenuation pole at a higher frequency and inhibiting an increase in the insertion loss at the passband low-frequency edge.

The following describes switch characteristics of and advantageous effects yielded by filter 10D according to Example 4, in comparison with Comparative Example 4.

Table 7 shows resonator parameters, switch voltages, and insertion losses of the filter according to Comparative Example 4. Table 8 shows resonator parameters, switch voltages, and insertion losses of filter 10D according to Example 4. Table 9 shows differences between Example 4 and Comparative Example 4.

TABLE 7

| Comp. Ex. 4 | Ns (Ct) | SW | fr1 fa1 (MHz) | fr2 fa2 (MHz) | Vs @B11 Rx (V) | Vs @B21 Rx (V) | Vs @B11 Tx (V) | Vs @B21 Tx (V) | IL @B11 Rx (dB) | IL @B21 Rx (dB) |
|---|---|---|---|---|---|---|---|---|---|---|
| P-arm ckt P1 | 6 | On | 1433 1489 | 1552 1566 | 0.85 | | 2.30 | | | |

TABLE 7-continued

| Comp. Ex. 4 | Ns (Ct) | SW | fr1 fa1 (MHz) | fr2 fa2 (MHz) | Vs @B11 Rx (V) | Vs @B21 Rx (V) | Vs @B11 Tx (V) | Vs @B21 Tx (V) | IL @B11 Rx (dB) | IL @B21 Rx (dB) |
|---|---|---|---|---|---|---|---|---|---|---|
|  |  | Off | 1460 1491 | 1569 1552 |  | 1.44 |  | 14.47 |  |  |
| P-arm ckt P2 | 5 | On | 1428 1484 | 1549 1561 | 0.41 |  | 1.69 |  |  |  |
|  |  | Off | 1452 1485 | 1563 1549 |  | 2.00 |  | 10.09 |  |  |
| P-arm ckt P3 | 1 | On | 1453 1481 | 1553 1593 | 0.10 |  | 0.03 |  |  |  |
|  |  | Off | 1646 1484 | 1595 1553 |  | 2.42 |  | 1.32 |  |  |
| P-arm ckt P4 | 1 | On | 1449 1496 | 1575 1594 | 0.11 |  | 0.01 |  |  |  |
|  |  | Off | 1464 1496 | 1596 1575 |  | 2.25 |  | 0.41 |  |  |
| Filter charcs. |  | On |  |  |  |  |  |  | 1.660 |  |
|  |  | Off |  |  |  |  |  |  |  | 1.928 |

TABLE 8

| Ex. 4 | Ns (Ct) | SW | fr1 fa1 (MHz) | fr2 fa2 (MHz) | Vs @B11 Rx (V) | Vs @B21 Rx (V) | Vs @B11 Tx (V) | Vs @B21 Tx (V) | IL @B11 Rx (dB) | IL @B21 Rx (dB) |
|---|---|---|---|---|---|---|---|---|---|---|
| P-arm ckt P1 | 1 | On | 1437 1489 | 1552 1566 | 0.12 |  | 0.01 |  |  |  |
|  |  | Off | 1460 1491 | 1549 1561 |  | 1.12 |  | 0.99 |  |  |
| P-arm ckt P2 | 1 | On | 1430 1484 | 1549 1561 | 0.07 |  | 0.01 |  |  |  |
|  |  | Off | 1452 1485 | 1549 1563 |  | 1.97 |  | 1.35 |  |  |
| P-arm ckt P3 | 2 | On | 1453 1481 | 1553 1593 | 0.19 |  | 0.06 |  |  |  |
|  |  | Off | 1464 1484 | 1553 1595 |  | 2.56 |  | 2.67 |  |  |
| P-arm ckt P4 | 7 | On | 1447 1496 | 1575 1594 | 0.85 |  | 2.01 |  |  |  |
|  |  | Off | 1464 1498 | 1575 1596 |  | 2.71 |  | 15.96 |  |  |
| Filter charcs. |  | On |  |  |  |  |  |  | 1.633 |  |
|  |  | Off |  |  |  |  |  |  |  | 1.928 |

TABLE 9

|  | Power applied terminal | Stack count Ns of switch |  |
|---|---|---|---|
| Comp. Ex. 4 | I/O terminal 101 | Switch SW1a Stack count Ns1a | < | Switch SW4a Stack count Ns4a |
| Ex. 4 | I/O terminal 102 | Switch SW1a Stack count Ns1a | < | Switch SW4a Stack count Ns4a |

When switches SW1a to SW4a are on, filter 10D according to Example 4 and the filter according to Comparative Example 4 have first filter characteristics that Band11-Rx (1475.9 to 1495.9 MHz) is a first passband, and Band11-Tx (1427.9 to 1447.9 MHz) is a first attenuation band, as illustrated in FIGS. 16 and 17. When switches SW1a to SW4a are off, filter 10D according to Example 4 and the filter according to Comparative Example 4 have second filter characteristics that Band21-Rx (1495.9 to 1510.9 MHz) is a second passband, and Band21-Tx (1447.9 to 1462.9 MHz) is a second attenuation band. Thus, filter 10D according to Example 4 and the filter according to Comparative Example 4 are frequency-tunable high-frequency filters (tunable filters) that switch between filter characteristics according to the switching between on and off of switches SW1a to SW4a.

Here, voltages V1a to V4a across switches SW1a to SW4a in the passband and the attenuation band are to be evaluated.

In Comparative Example 4, power is applied through input/output terminal 101, whereas in Example 4, power is applied through input/output terminal 102.

In Comparative Example 4, a total of voltages Vs across switches SW1a to SW4a when switches SW1a to SW4a are off is 26.29 V (additional value of Vs@B21Tx in Table 7). In contrast, in Example 4, a total of voltages Vs across switches SW1a to SW4a when switches SW1a to SW4a are off is 20.96 V (additional value of Vs@B21Tx in Table 8). Thus, a total of stack counts Ns of the switches in Example 4 can be made lower than that in Comparative Example 4. Accordingly, in Example 4, power durability properties that filter 10D is to have are ensured, and also reduction in size of filter 10D and passband insertion loss when the switches are on can be achieved.

As shown in Tables 7 and 8, and the middle right graphs and the bottom right graphs in FIGS. 16 and 17, if lower resonant frequencies Fr1off of the parallel-arm circuits are low when the switches are off, voltages Vs across the switches tend to be low. However, in Comparative Example 4 in which power is applied through input/output terminal 101 closer to parallel-arm circuit P1 having lower resonant frequency Fr1off, power is distributed to other parallel-arm circuits P2 to P4, and thus a total of voltages applied to the switches is high. Accordingly, in Example 4 in which power is applied through input/output terminal 102 closer to parallel-arm circuit P4 having higher resonant frequency Fr1off, stack count Ns4a of switch SW4a increases, yet a total of stack counts Ns of the switches can be decreased. In Comparative Example 4 (Table 7), a total stack count is 14, whereas in Example 4 (Table 8), a total stack count is 11.

In Example 4, stack count Ns4a of switch SW4a is high, and thus the resistance of switch SW4a in the on state is high. To address this, the resistance of switch SW4a in the on state can be decreased by increasing gate width W4a of the semiconductor elements (FETs) of switch SW4a. Specifically, stack count Ns1a of switch SW1a is made lower than stack count Ns4a of switch SW4a, and gate width W4a of switch SW4a is made greater than gate width W1a of switch SW1a, thus ensuring power durability that filter 10D is to have, and also achieving reduction in size of filter 10D and passband insertion loss when the switches are on.

According to filter 10D according to Example 4 as described above:
(1) In a configuration in which voltage V1a across switch SW1a is lower than voltage V4a across switch SW4a, stack count Ns1 of switch SW1a is made lower than stack count Ns4 of switch SW4a, thus ensuring power durability that filter 10D is to have, and also achieving reduction in size of filter 10D and passband insertion loss when the switches are conducting.
(2) By switching between the conducting and non-conducting states of a switch, the frequency of the attenuation pole on the passband low-frequency side can be changed without increasing the insertion loss at the passband low-frequency edge.
(3) Passband insertion loss when a switch is conducting can be reduced by making gate width W4a of switch SW4a greater than gate width W1a of switch SW1a.

[9. High-Frequency Filter According to Example 5]

Figure 18:
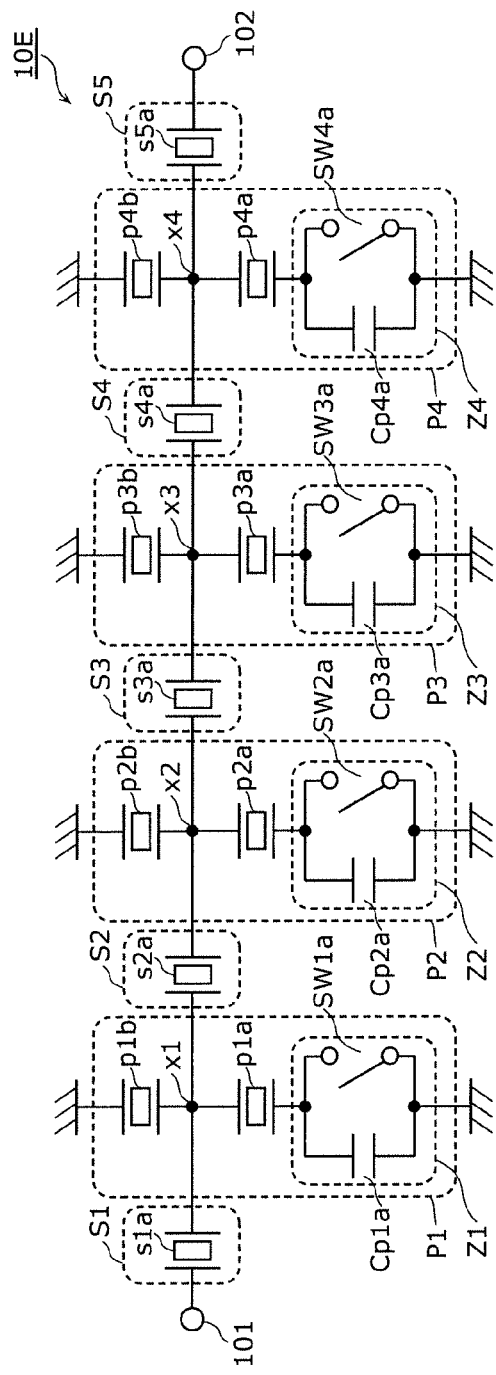
FIG. 18 illustrates a circuit configuration of a filter according to Example 5.

FIG. 18 illustrates a circuit configuration of filter 10E according to Example 5. Filter 10E illustrated in FIG. 18 is different from filter 10A according to Example 1 in the configuration of a parallel-arm circuit. More specifically, one parallel-arm circuit includes two parallel-arm resonators. Filter 10E according to this example is different from filter 10D according to Example 4 in only resonance characteristics of two parallel-arm resonators included in a parallel-arm circuit. In the following, description of the common points of filter 10E according to Example 5 to those of filter 10A according to Example 1 and filter 10D according to Example 4 is omitted, and different points are mainly described.

As illustrated in FIG. 18, filter 10E includes series-arm circuits S1, S2, S3, S4, and S5, parallel-arm circuits P1, P2, P3, and P4, and input/output terminals 101 and 102.

Here, resonant frequency frp1a of parallel-arm resonator p1a is higher than resonant frequency frp1b of parallel-arm resonator p1b, and antiresonant frequency fap1a of parallel-arm resonator p1a is higher than antiresonant frequency fap1b of parallel-arm resonator p1b. Resonant frequency frp4a of parallel-arm resonator p4a is higher than resonant frequency frp4b of parallel-arm resonator p4b, and antiresonant frequency fap4a of parallel-arm resonator p4a is higher than antiresonant frequency fap4b of parallel-arm resonator p4b. Resonant frequency frp2a of parallel-arm resonator p2a is higher than resonant frequency frp2b of parallel-arm resonator p2b, and antiresonant frequency fap2a of parallel-arm resonator p2a is higher than antiresonant frequency fap2b of parallel-arm resonator p2b. Resonant frequency frp3a of parallel-arm resonator p3a is higher than resonant frequency frp3b of parallel-arm resonator p3b, and antiresonant frequency fap3a of parallel-arm resonator p3a is higher than antiresonant frequency fap3b of parallel-arm resonator p3b.

Voltage Vs1a across switch SW1a is lower than voltage Vs4a across switch SW4a, and first stack count Ns1a that is the number of one or more semiconductor elements connected in series and included in switch SW1a is lower than second stack count Ns4a that is the number of one or more semiconductor elements connected in series and included in switch SW4a.

Figure 19:
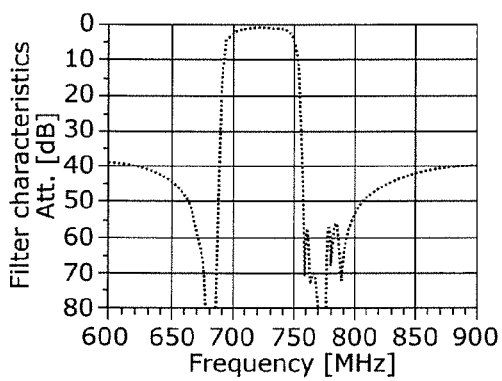
FIG. 19 illustrates graphs showing passing characteristics, impedance characteristics, and switch voltage characteristics of a filter according to Comparative Example 5.
Figure 19:
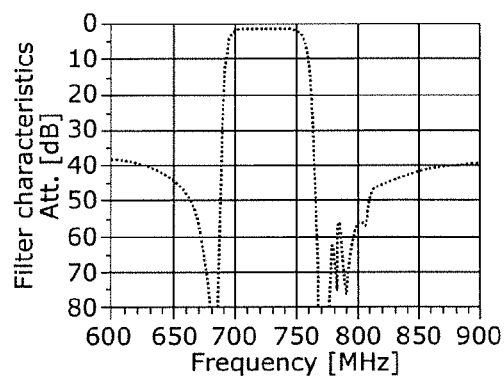
Figure 19:
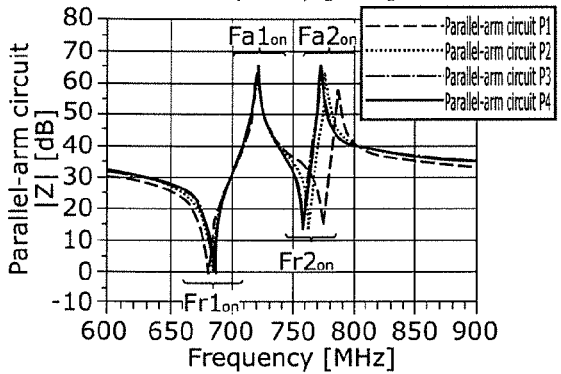
Figure 19:
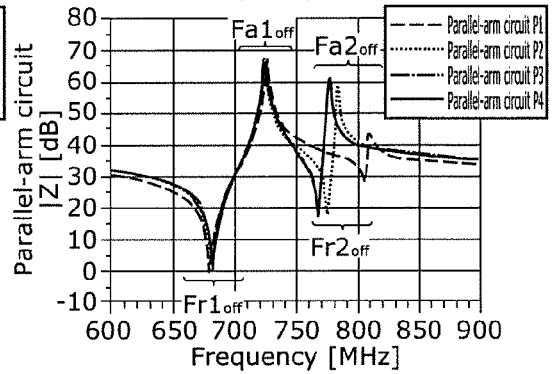
Figure 19:
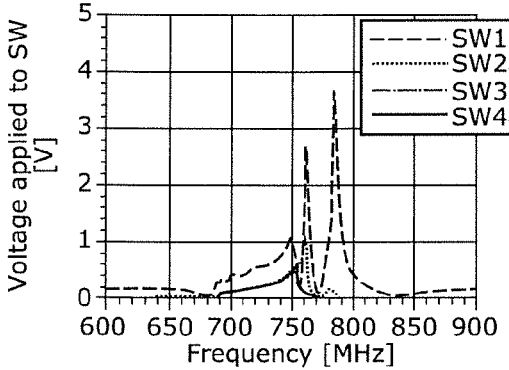
Figure 19:
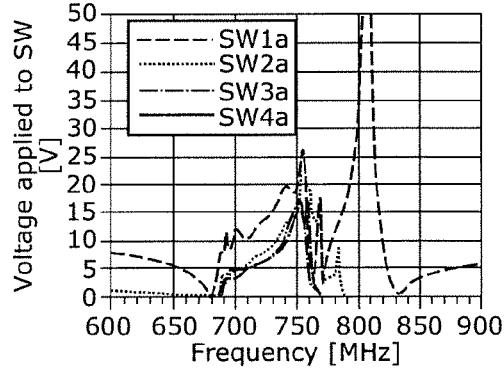
Figure 20:
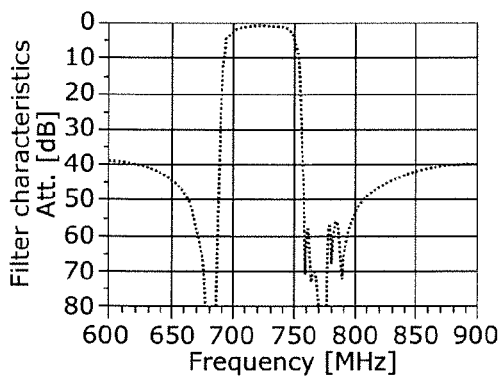
FIG. 20 illustrates graphs showing passing characteristics, impedance characteristics, and switch voltage characteristics of the filter according to Example 5.
Figure 20:
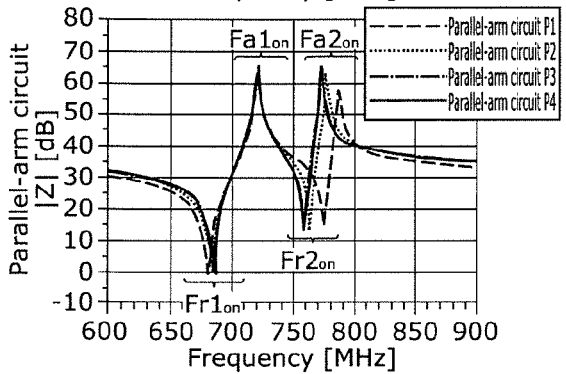
Figure 20:
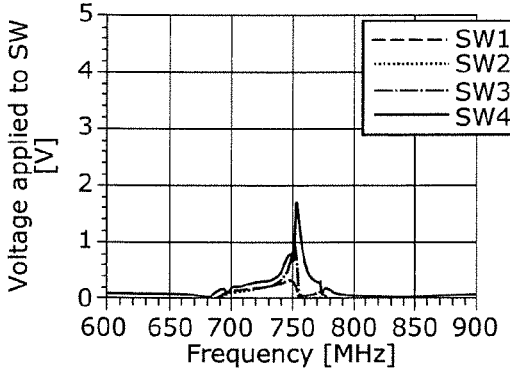
Figure 20:
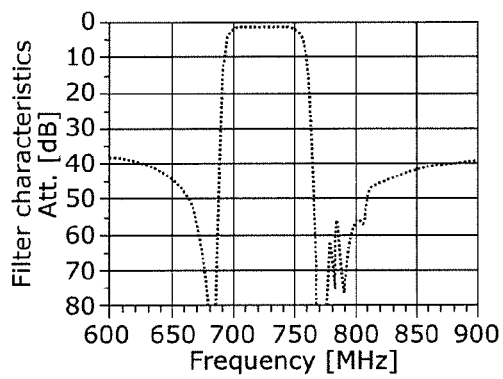
Figure 20:
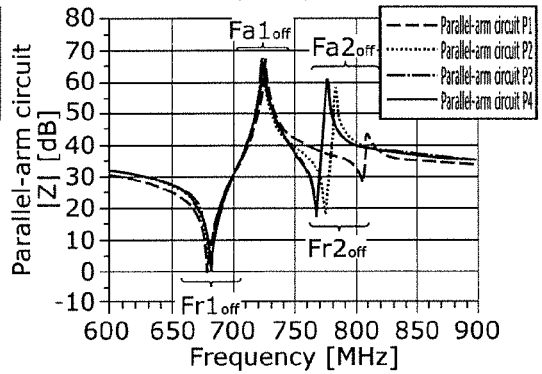
Figure 20:
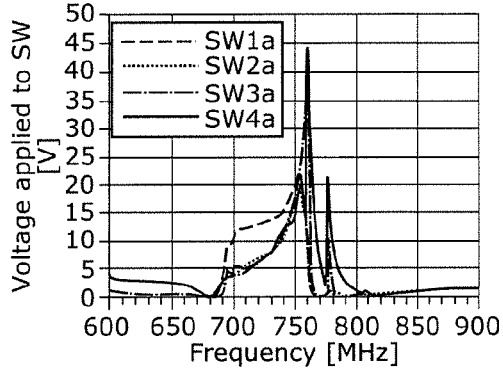

FIG. 19 illustrates graphs showing passing characteristics, impedance characteristics, and switch voltage characteristics of a filter according to Comparative Example 5. FIG. 20 illustrates graphs showing passing characteristics, impedance characteristics, and switch voltage characteristics of filter 10E according to Example 5.

First, impedance characteristics of parallel-arm circuits P1 to P4 are described using parallel-arm circuit P1 in particular as an example. When switch SW1a is on, switch SW1a short-circuits capacitor Cp1a, and impedance characteristics of parallel-arm circuit P1 are not influenced by capacitor Cp1a. Thus, in this case, combined characteristics (characteristics of parallel-arm circuit P1 shown by the middle left graph in FIG. 19 and by the middle left graph in FIG. 20) of two parallel-arm resonators (parallel-arm resonators p1a and p1b) are impedance characteristics of parallel-arm circuit P1.

Specifically, when switch SW1a is on, parallel-arm circuit P1 has impedance characteristics as follows. Parallel-arm circuit P1 has two resonant frequencies Fr1on and Fr2on (at this time, the following are satisfied: Fr1on=resonant frequency frp1b of parallel-arm resonator p1b, and Fr2on=resonant frequency frp1a of parallel-arm resonator p1a). Impedance of parallel-arm circuit P1 has a local minimum value at resonant frequency frp1b of parallel-arm resonator p1b, and a local minimum value at resonant frequency frp1a of parallel-arm resonator p1a.

Parallel-arm circuit P1 has two antiresonant frequencies Fa1on and Fa2on (at this time, the following are all satisfied: Fr1on<Fa1on<Fr2on<Fa2on; Fa1on<antiresonant frequency fap1b of parallel-arm resonator p1b; and Fa2on<antiresonant frequency fap1a of parallel-arm resonator p1a). Specifically, impedance of parallel-arm circuit P1 has a local maximum value at a frequency between resonant frequency frp1b of parallel-arm resonator p1b and resonant frequency frp1a of parallel-arm resonator p1a, and a local maximum value at a frequency between antiresonant frequency fap1b of parallel-arm resonator p1b and antiresonant frequency fap1a of parallel-arm resonator p1a.

Here, a reason for Fa1on<fap1b being satisfied is that parallel-arm resonator p1a connected in parallel to parallel-arm resonator p1b operates as a parallel capacitor in a frequency band near antiresonant frequency fap1b of parallel-arm resonator p1b. Further, a reason for Fa2on<fap1a being satisfied is that parallel-arm resonator p1b connected in parallel to parallel-arm resonator p1a operates as a parallel capacitor in a frequency band near antiresonant frequency $fap1a$ of parallel-arm resonator p1a.

When configuring a band pass filter using a ladder filter structure, antiresonant frequency Fa1on of parallel-arm circuit P1 and resonant frequency frs1a of series-arm resonator s1a are brought close to each other. Accordingly, when switch SW1a is on, a frequency region near resonant frequency Fr1on at which the impedance of parallel-arm circuit P1 approaches 0 is a low-frequency stop band. If the frequency is higher than resonant frequency Fr1on, the impedance of parallel-arm circuit P1 is high at a frequency near antiresonant frequency Fa1on, and the impedance of series-arm resonator s1a approaches 0 at a frequency near resonant frequency frs. This provides a passband for signals near antiresonant frequency Fa1on and resonant frequency frs1a. Furthermore, if the frequency is increased so as to be near resonant frequency Fr2on and antiresonant frequency fas1a, the impedance of series-arm resonator s1a is increased and the impedance of parallel-arm circuit P1 approaches 0, which provides a high frequency stop band.

Specifically, when switch SW1a is on, filter 10E has first filter characteristics that a passband is determined by antiresonant frequency Fa1on and resonant frequency frs1a, the pole (attenuation pole) on the passband low-frequency side is determined by resonant frequency Fr1on, and the pole (attenuation pole) on the passband high-frequency side is determined by resonant frequency Fr2on and antiresonant frequency fas1a.

On the other hand, when switch SW1a is off, switch SW1a does not short-circuit capacitor Cp1a, and thus the impedance characteristics of parallel-arm circuit P1 are influenced by capacitor Cp1a. Specifically, in this case, combined characteristics (combined characteristics of parallel-arm circuit P1 shown by the middle right graph in FIG. 20) of two parallel-arm resonators (parallel-arm resonators p1b and p1a) and capacitor Cp1a connected in series to parallel-arm resonator p1a are impedance characteristics of parallel-arm circuit P1.

Specifically, when switch SW1a is off, parallel-arm circuit P1 has impedance characteristics as follows. Parallel-arm circuit P1 has two resonant frequencies Fr1off and Fr2off, and two antiresonant frequencies Fa1off and Fa2off (at this time, the following are all satisfied: Fr1off<Fa1off <Fr2off<Fa2off; Fa1off<fap1b; frp1a<Fr2off; and Fa2off<fap1a). Specifically, impedance of parallel-arm circuit P1 has a local minimum value at a frequency higher than resonant frequency frp1b of parallel-arm resonator p1b, and a local minimum value at a frequency higher than resonant frequency frp1a of parallel-arm resonator p1a. Impedance of parallel-arm circuit P1 has a local maximum value at a frequency between resonant frequency frp1b of parallel-arm resonator p1b and resonant frequency frp1a of parallel-arm resonator p1a, and a local maximum value at a frequency between antiresonant frequency fap1b of parallel-arm resonator p1b and antiresonant frequency fap1a of parallel-arm resonator p1a.

Here, a reason for Fa1off<fap1b being satisfied is that parallel-arm resonator p1a connected in parallel to parallel-arm resonator p1b operates as a parallel capacitor in a frequency band near antiresonant frequency fap1b of parallel-arm resonator p1b. Further, a reason for frp1b<Fr1off being satisfied is that resonance of parallel-arm resonator p1b and capacitor Cp1a occurs in a frequency band near resonant frequency frp1b of parallel-arm resonator p1b. Further, a reason for Fa2off<fap1a being satisfied is that combined characteristics of parallel-arm resonator p1b and capacitor Cp1a connected in parallel to parallel-arm resonator p1a function as a parallel capacitor.

Specifically, when switch SW1a is off, filter 10E has second filter characteristics that a passband is determined by antiresonant frequency Fa1off and resonant frequency frs1a, the pole (attenuation pole) on the passband low-frequency side is determined by resonant frequency Fr1off, and the pole (attenuation pole) on the passband high-frequency side is determined by resonant frequency Fr2off and antiresonant frequency fas1a.

As illustrated in the middle graphs in FIG. 20, if switches SW1a to SW4a are switched from on to off, impedance characteristics of parallel-arm circuits P1 to P4 are changed as follows. Specifically, a higher resonant frequency of two resonant frequencies and a higher antiresonant frequency of two antiresonant frequencies of each of parallel-arm circuits P1 to P4 are both switched to be higher frequencies. In this example, only parallel-arm resonator p1a is connected in series to capacitor Cp1a and switch SW1a, and thus a higher resonant frequency of two resonant frequencies is switched from Fr2on to Fr2off to be a higher frequency. Further, a lower antiresonant frequency is switched from Fa2on to Fa2off to be a higher frequency.

Here, higher antiresonant frequencies and higher resonant frequencies of parallel-arm circuits P1 to P4 determine attenuation slopes on the passband high-frequency side of filter 10E, and are all switched to higher frequencies, as described above. Accordingly, as illustrated in the top graphs in FIG. 20, switching switch SW1a from on to off switches passing characteristics of filter 10E to higher-frequency passing characteristics while the attenuation slope on the passband high-frequency side maintains its steepness. In other words, filter 10E can switch a frequency at the passband high-frequency edge to a higher frequency while switching the attenuation pole on a passband high-frequency side to an attenuation pole at a higher frequency and inhibiting an increase in the insertion loss at the passband high-frequency edge.

The following describes switch characteristics of and advantageous effects yielded by filter 10E according to Example 5, in comparison with Comparative Example 5.

Table 10 shows resonator parameters, switch voltages, and insertion losses of a filter according to Comparative Example 5. Table 11 shows resonator parameters, switch voltages, and insertion losses of filter 10E according to Example 5. Table 12 shows differences between Example 5 and Comparative Example 5.

TABLE 10

| Comp. Ex. 5 | Ns (Ct) | SW | fr1 fa1 (MHz) | fr2 fa2 (MHz) | Vs @B28a Tx (V) | Vs @B28b Tx (V) | Vs @B28a Rx (V) | Vs @B28b Rx (V) | IL @B11 Rx (dB) | IL @B21 Rx (dB) |
|---|---|---|---|---|---|---|---|---|---|---|
| P-arm ckt P1 | 18 | On | 681 721 | 776 788 | 0.56 | | 3.74 | | | |

TABLE 10-continued

| Comp. Ex. 5 | Ns (Ct) | SW | fr1 fa1 (MHz) | fr2 fa2 (MHz) | Vs @B28a Tx (V) | Vs @B28b Tx (V) | Vs @B28a Rx (V) | Vs @B28b Rx (V) | IL @B11 Rx (dB) | IL @B21 Rx (dB) |
|---|---|---|---|---|---|---|---|---|---|---|
| | | Off | 681 728 | 806 810 | | 19.59 | | 43.30 | | |
| P-arm ckt P2 | 6 | On | 683 722 | 764 778 | 0.19 | | 1.05 | | | |
| | | Off | 683 726 | 776 785 | | 14.01 | | 8.89 | | |
| P-arm ckt P3 | 6 | On | 685 722 | 759 774 | 0.22 | | 0.14 | | | |
| | | Off | 685 726 | 769 779 | | 14.85 | | 0.90 | | |
| P-arm ckt P4 | 6 | On | 683 721 | 759 773 | 0.20 | | 0.01 | | | |
| | | Off | 683 725 | 769 778 | | 12.67 | | 0.13 | | |
| Filter charcs. | | On | | | | | | | 1.500 | |
| | | Off | | | | | | | | 1.323 |

TABLE 11

| Ex. 5 | Ns (Ct) | SW | fr1 fa1 (MHz) | fr2 fa2 (MHz) | Vs @B28a Tx (V) | Vs @B28b Tx (V) | Vs @B28a Rx (V) | Vs @B28b Rx (V) | IL @B11 Rx (dB) | IL @B21 Rx (dB) |
|---|---|---|---|---|---|---|---|---|---|---|
| P-arm ckt P1 | 7 | On | 681 721 | 776 788 | 0.21 | | 0.01 | | | |
| | | Off | 681 728 | 806 810 | | 17.40 | | 0.27 | | |
| P-arm ckt P2 | 6 | On | 683 722 | 764 778 | 0.20 | | 0.02 | | | |
| | | Off | 683 726 | 776 785 | | 14.20 | | 1.74 | | |
| P-arm ckt P3 | 6 | On | 685 722 | 759 774 | 0.20 | | 0.13 | | | |
| | | Off | 685 726 | 769 779 | | 14.09 | | 12.98 | | |
| P-arm ckt P4 | 9 | On | 683 721 | 759 773 | 0.29 | | 0.83 | | | |
| | | Off | 683 725 | 769 778 | | 12.95 | | 22.34 | | |
| Filter charcs. | | On | | | | | | | 1.494 | |
| | | Off | | | | | | | | 1.323 |

TABLE 12

| | Power applied terminal | Stack count Ns of switch | |
|---|---|---|---|
| Comp. Ex. 5 | I/O terminal 101 | Switch SW1a Stack count Ns1a | < Switch SW4a Stack count Ns4a |
| Ex. 5 | I/O terminal 102 | Switch SW1a Stack count Ns1a | < Switch SW4a Stack count Ns4a |

When switches SW1a to SW4a are on, filter 10E according to Example 5 and the filter according to Comparative Example 5 have first filter characteristics that Band28a-Tx (703 to 733 MHz) is a first passband, and Band28a-Rx (758 to 788 MHz) is a first attenuation band, as illustrated in FIGS. 19 and 20. When switches SW1a to SW4a are off, filter 10E according to Example 5 and the filter according to Comparative Example 5 have second filter characteristics that Band28b-Tx (773 to 803 MHz) is a second passband, and Band28b-Rx (718 to 748 MHz) is a second attenuation band. Thus, filter 10E according to Example 5 and the filter according to Comparative Example 5 are frequency-tunable high-frequency filters (tunable filters) that switch between filter characteristics according to the switching between on and off of switches SW1a to SW4a.

Here, voltages V1a to V4a across switches SW1a to SW4a in the passband and the attenuation band are to be evaluated.

In Comparative Example 5, power is applied through input/output terminal 101, whereas in Example 5, power is applied through input/output terminal 102.

In Comparative Example 5, a total of voltages Vs across switches SW1a to SW4a when switches SW1a to SW4a are off is 53.22 V (additional value of Vs@B28bRx in Table 10). In contrast, in Example 5, a total of voltages Vs across switches SW1a to SW4a when switches SW1a to SW4a are off is 37.32 V (additional value of Vs@B28bRx in Table 11). Specifically, a total of stack counts Ns of the switches in Example 5 can be made lower than that in Example 5. Thus, according to Example 5, power durability properties that filter 10E is to have are ensured, and also reduction in size of filter 10E and passband insertion loss when the switches are on can be achieved.

As shown in Tables 10 and 11 and the middle right graphs and the bottom right graphs in FIGS. 19 and 20, if lower resonant frequencies Fr2off of parallel-arm circuits are high when the switches are off, voltages Vs across the switches tend to be low. However, in Comparative Example 5 in which power is applied through input/output terminal 101 closer to parallel-arm circuit P1 having higher resonant frequency Fr2off, power is distributed to other parallel-arm circuits P2 to P4, and a total of voltages applied to the switches is increased. Accordingly, in Example 5 in which power is applied through input/output terminal 102 closer to parallel-arm circuit P4 having lower resonant frequency Fr2off, stack count Ns4a of switch SW4a increases, yet a total of stack counts Ns of the switches can be decreased. In Comparative Example 5 (Table 10), a total stack count is 36, whereas in Example 5 (Table 11), a total stack count is 28.

In Example 5, stack count Ns4a of switch SW4a is high, and thus the resistance of switch SW4a in the on state is high. To address this, the resistance of switch SW4a in the on state can be decreased by increasing gate width W4a of the semiconductor elements (FETs) of switch SW4a. Specifically, stack count Ns1a of switch SW1a is made lower than stack count Ns4a of switch SW4a, and gate width W4a of switch SW4a is made greater than gate width W1a of switch SW1a, thus ensuring power durability properties that filter 10E is to have and also achieving reduction in size of filter 10E and passband insertion loss when the switches are on.

According to filter 10E according to Example 5 as described above:
(1) In a configuration in which voltage V1a across switch SW1a is lower than voltage V4a across switch SW4a, stack count Ns1 of switch SW1a is made lower than stack count Ns4 of switch SW4a, thus ensuring power durability that filter 10E is to have, and also achieving reduction in size of filter 10E and passband insertion loss when the switches are conducting.
(2) Switching between the conducting and non-conducting states of a switch can change the frequency of the attenuation pole on the passband high-frequency side without increasing the insertion loss at the passband high-frequency edge.
(3) Passband insertion loss when a switch is conducting can be reduced by making gate width W4a of switch SW4a greater than gate width W1a of switch SW1a.

[10. High-Frequency Filter According to Example 6]

Figure 21:
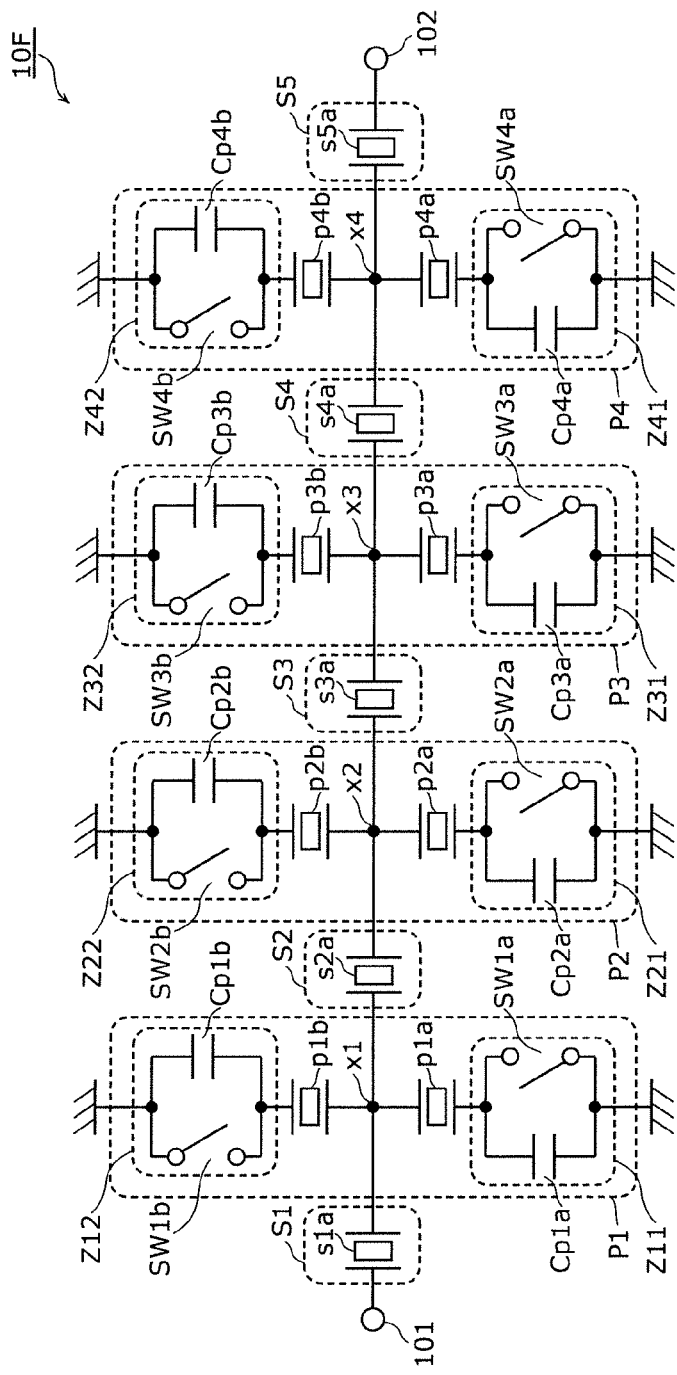
FIG. 21 illustrates a circuit configuration of a filter according to Example 6.

FIG. 21 illustrates a circuit configuration of filter 10F according to Example 6. Filter 10F illustrated in FIG. 21 is different from filter 10A according to Example 1, filter 10D according to Example 4, and filter 10E according to Example 5 in the configurations of parallel-arm circuits. More specifically, a single parallel-arm circuit includes two parallel-arm resonators and two switch circuits, and includes two circuits each constituted by a parallel-arm resonator and a switch circuit connected in series, and the two circuits are connected in parallel. In the following, description of the common points of Filter 10F according to Example 6 to those of filter 10A according to Example 1, filter 10D according to Example 4, and filter 10E according to Example 5 is omitted, and different points are mainly described.

As illustrated in FIG. 21, filter 10F includes series-arm circuits S1, S2, S3, S4, and S5, parallel-arm circuits P1, P2, P3, and P4, and input/output terminals 101 and 102.

Parallel-arm circuit P1 includes parallel-arm resonator p1a (first parallel-arm resonator), parallel-arm resonator p1b (third parallel-arm resonator), switch circuit Z11 (first switch circuit) connected in series to parallel-arm resonator p1a, and switch circuit Z12 (third switch circuit) connected in series to parallel-arm resonator p1b. The circuit constituted by parallel-arm resonator p1a and switch circuit Z11 connected in series, and the circuit constituted by parallel-arm resonator p1b and switch circuit Z12 connected in series are connected in parallel between node x1 and the ground.

Parallel-arm circuit P2 includes parallel-arm resonators p2a and p2b, switch circuit Z21 connected in series to parallel-arm resonator p2a, and switch circuit Z22 connected in series to parallel-arm resonator p2b. The circuit constituted by parallel-arm resonator p2a and switch circuit Z21 connected in series, and the circuit constituted by parallel-arm resonator p2b and switch circuit Z22 connected in series are connected in parallel between node x2 and the ground.

Parallel-arm circuit P3 includes parallel-arm resonators p3a and p32b, switch circuit Z31 connected in series to parallel-arm resonator p3a, and switch circuit Z32 connected in series to parallel-arm resonator p3b. The circuit constituted by parallel-arm resonator p3a and switch circuit Z31 connected in series, and the circuit constituted by parallel-arm resonator p3b and switch circuit Z32 connected in series are connected in parallel between node x3 and the ground.

Parallel-arm circuit P4 includes parallel-arm resonator p4a (second parallel-arm resonator), parallel-arm resonator p4b (fourth parallel-arm resonator), switch circuit Z41 (second switch circuit) connected in series to parallel-arm resonator p4a, and switch circuit Z42 (fourth switch circuit) connected in series to parallel-arm resonator p4b. The circuit constituted by parallel-arm resonator p4a and switch circuit Z41 connected in series, and the circuit constituted by parallel-arm resonator p4b and switch circuit Z42 connected in series are connected in parallel between node x4 and the ground.

Switch circuit Z11 is a first switch circuit that includes capacitor Cp1a (first capacitor), and switch SW1a (first switch element). Switch SW1a is connected in parallel to capacitor Cp1a. Switch circuit Z12 is a third switch circuit that includes capacitor Cp1b (third capacitor) and switch SW1b (third switch element). Switch SW1b is connected in parallel to capacitor Cp1b.

Switch circuit Z21 includes capacitor Cp2a and switch SW2a. Switch SW2a is connected in parallel to capacitor Cp2a. Switch circuit Z22 includes capacitor Cp2b and switch SW2b. Switch SW2b is connected in parallel to capacitor Cp2b.

Switch circuit Z31 includes capacitor Cp3a and switch SW3a. Switch SW3a is connected in parallel to capacitor Cp3a. Switch circuit Z32 includes capacitor Cp3b and switch SW3b. Switch SW3b is connected in parallel to capacitor Cp3b.

Switch circuit Z41 is a second switch circuit that includes capacitor Cp4a (second capacitor) and switch SW4a (second switch element). Switch SW4a is connected in parallel to capacitor Cp4a. Switch circuit Z42 is a fourth switch circuit that includes capacitor Cp4b (fourth capacitor) and switch SW4b (fourth switch element). Switch SW4b is connected in parallel to capacitor Cp4b.

Table 13 shows resonance parameters of filter 10F according to Example 6.

TABLE 13

| Comp. Ex. 6 | | Fr (MHz) | Fa (MHz) | ES Cap $C_0$ (pF) |
|---|---|---|---|---|
| Series-arm circuit S1 | s1a | 715 | 747 | 5.348 |

TABLE 13-continued

| Comp. Ex. 6 | | Fr (MHz) | Fa (MHz) | ES Cap $C_0$ (pF) |
|---|---|---|---|---|
| Series-arm circuit S2 | s2a | 733 | 766 | 2.791 |
| Series-arm circuit S3 | s3a | 717 | 749 | 2.329 |
| Series-arm circuit S4 | s4a | 725 | 758 | 2.135 |
| Series-arm circuit S5 | s5a | 719 | 751 | 4.560 |
| Parallel-arm circuit P1 | p1a | 678 | 709 | 4.560 |
| | p1b | 783 | 818 | 0.557 |
| | Cp1a | — | — | 2.624 |
| | Cp1b | — | — | 0.911 |
| Parallel-arm circuit P2 | p2a | 675 | 705 | 4.168 |
| | p2b | 767 | 802 | 0.506 |
| | Cp2a | — | — | 5.679 |
| | Cp2b | — | — | 1.870 |
| Parallel-arm circuit P3 | p3a | 679 | 710 | 4.197 |
| | p3b | 760 | 794 | 0.500 |
| | Cp3a | — | — | 4.419 |
| | Cp3b | — | — | 2.637 |
| Parallel-arm circuit P4 | p4a | 680 | 711 | 4.137 |
| | p4b | 760 | 794 | 0.500 |
| | Cp4a | — | — | 3.227 |
| | Cp4b | — | — | 3.834 |

As illustrated in Table 13, resonant frequency frp1a of parallel-arm resonator p1a is lower than resonant frequency frp1b of parallel-arm resonator p1b, and antiresonant frequency fap1a of parallel-arm resonator p1a is lower than antiresonant frequency fap1b of parallel-arm resonator p1b. Resonant frequency frp4a of parallel-arm resonator p4a is lower than resonant frequency frp4b of parallel-arm resonator p4b, and antiresonant frequency fap4a of parallel-arm resonator p4a is lower than antiresonant frequency fap4b of parallel-arm resonator p4b. Resonant frequency frp2a of parallel-arm resonator p2a is lower than resonant frequency frp2b of parallel-arm resonator p2b, and antiresonant frequency fap2a of parallel-arm resonator p2a is lower than antiresonant frequency fap2b of parallel-arm resonator p2b. Resonant frequency frp3a of parallel-arm resonator p3a is lower than resonant frequency frp3b of parallel-arm resonator p3b, and antiresonant frequency fap3a of parallel-arm resonator p3a is lower than antiresonant frequency fap3b of parallel-arm resonator p3b.

Voltage Vs1a across switch SW1a is lower than voltage Vs4a across switch SW4a, and voltage Vs1b across switch SW1b is lower than voltage Vs4b across switch SW4b. In this configuration, first stack count Ns1a that is the number of one or more semiconductor elements connected in series and included in switch SW1a is lower than second stack count Ns4a that is the number of one or more semiconductor elements connected in series and included in switch SW4a. First stack count Ns1b that is the number of one or more semiconductor elements connected in series and included in switch SW1b is lower than second stack count Ns4b that is the number of one or more semiconductor elements connected in series and included in switch SW4b.

Figure 22:
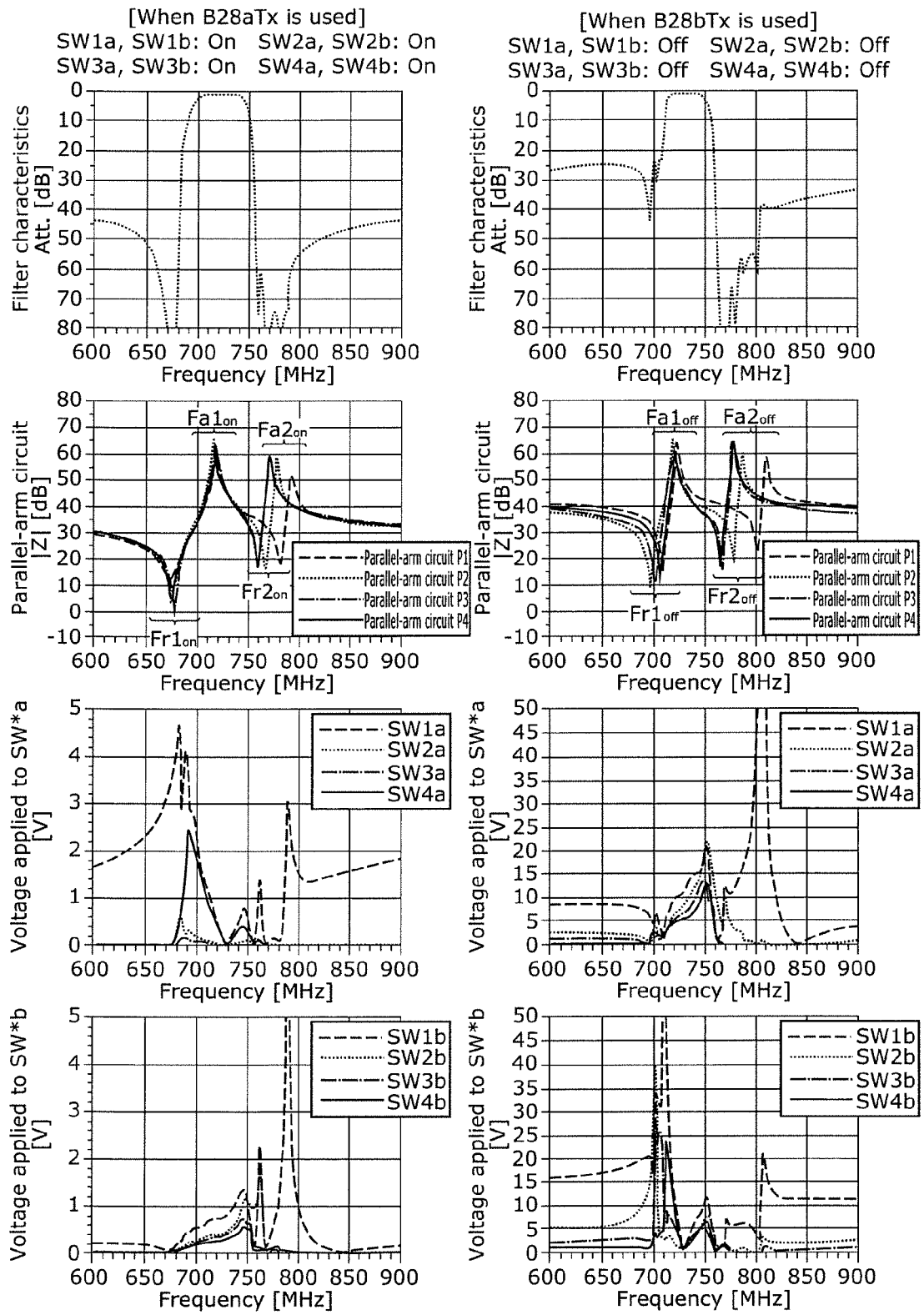
FIG. 22 illustrates graphs showing passing characteristics, impedance characteristics, and switch voltage characteristics of a filter according to Comparative Example 6.
Figure 23:
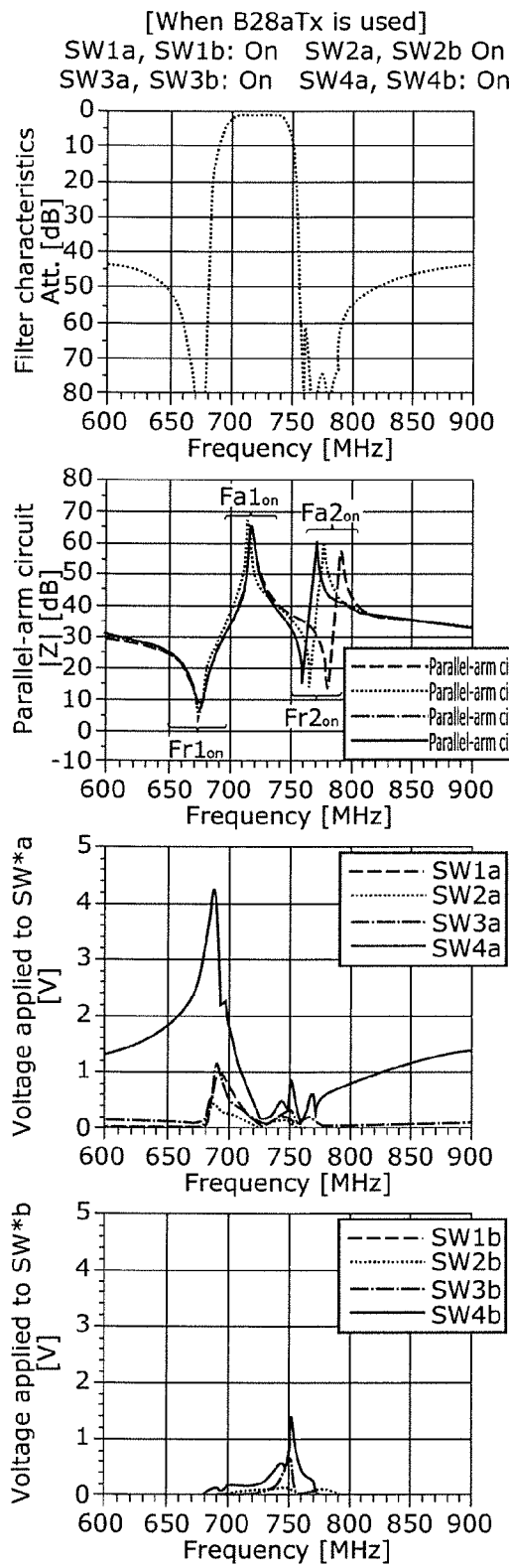
FIG. 23 illustrates graphs showing passing characteristics, impedance characteristics, and switch voltage characteristics of the filter according to Example 6.
Figure 23:
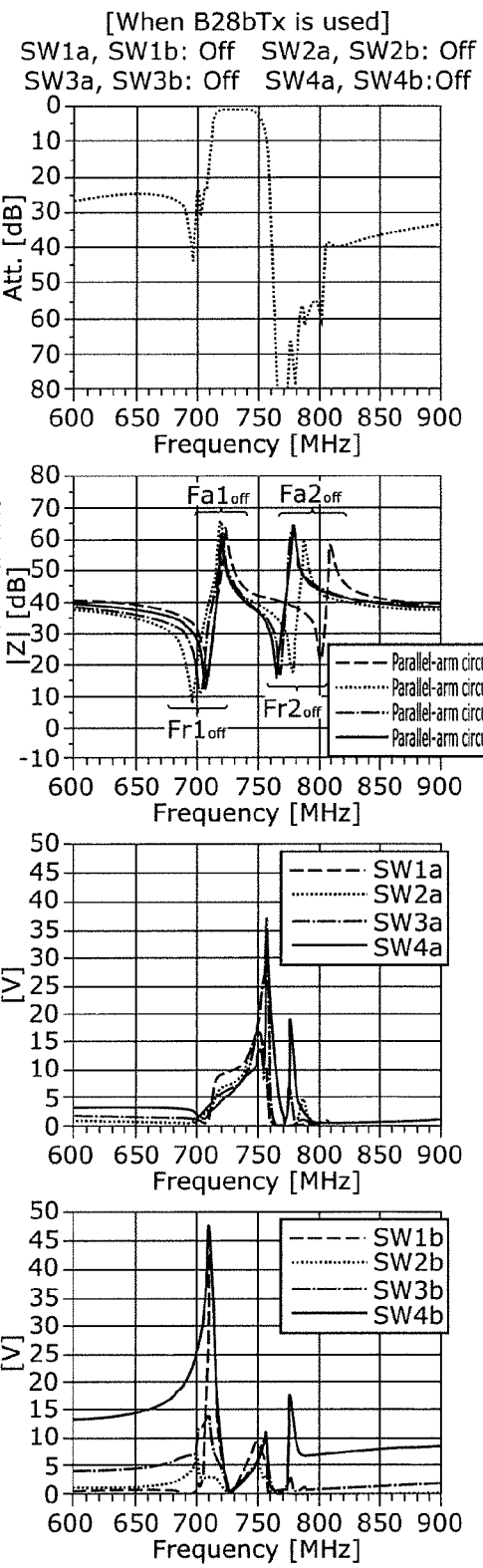

FIG. 22 illustrates graphs showing passing characteristics, impedance characteristics, and switch voltage characteristics of a filter according to Comparative Example 6. FIG. 23 illustrates graphs showing passing characteristics, impedance characteristics, and switch voltage characteristics of filter 10F according to Example 6.

As illustrated in the middle graphs in FIG. 22 and the middle graphs in FIG. 23, if switches SW1a to SW4a are switched from on to off, impedance characteristics of parallel-arm circuits P1 to P4 are changed as follows. Specifically, a lower resonant frequency of two resonant frequencies and a lower antiresonant frequency of two antiresonant frequencies of each of parallel-arm circuits P1 to P4 are both switched to higher frequencies. In this example, only parallel-arm resonator p1a is connected in series to capacitor Cp1a and switch SW1a, and thus the lower resonant frequency of two resonant frequencies is switched from Fr1on to Fr1off to be a higher frequency. The lower antiresonant frequency is switched from Fa1on to Fa1off to be a higher frequency.

Here, lower antiresonant frequencies and lower resonant frequencies of parallel-arm circuits P1 to P4 determine attenuation slopes on the passband low-frequency side of filter 10F, and are all switched to higher frequencies, as described above. Accordingly, as illustrated in the top graphs in FIG. 23, switching switch SW1a from on to off switches passing characteristics of filter 10F to higher-frequency characteristics while the attenuation slope on the passband low-frequency side maintains its steepness. In other words, filter 10F can switch a frequency at the passband low-frequency edge to a higher frequency while switching the frequency of the attenuation pole on the passband low-frequency side to a higher frequency and inhibiting an increase in the insertion loss at the passband low-frequency edge.

As illustrated in the second graphs from the top in FIGS. 22 and 23, if switches SW1b to SW4b are switched from on to off, impedance characteristics of parallel-arm circuits P1 to P4 are changed as follows. Specifically, a higher resonant frequency of two resonant frequencies and a higher antiresonant frequency of two antiresonant frequencies of each of parallel-arm circuits P1 to P4 are both switched to higher frequencies. In this example, only parallel-arm resonator p1b is connected in series to capacitor Cp1b and switch SW1b, and thus the higher resonant frequency of two resonant frequencies is switched from Fr2on to Fr2off to be a higher frequency. Also, the lower antiresonant frequency is switched from Fa2on to Fa2off to be a higher frequency.

Here, higher antiresonant frequencies and higher resonant frequencies of parallel-arm circuits P1 to P4 determine the attenuation slope on the passband high-frequency side of filter 10F, and are all switched to higher frequencies, as described above. Accordingly, as illustrated in the top graphs in FIGS. 22 and 23, switching switch SW1b from on to off switches passing characteristics of filter 10F to higher-frequency passing characteristics a while the attenuation slope on the passband high-frequency side maintains its steepness. In other words, filter 10F can switch a frequency at the passband high-frequency edge to a higher frequency while switching the frequency of the attenuation pole on the passband high-frequency side to a higher frequency and inhibiting an increase in the insertion loss at the passband high-frequency edge.

Thus, with regard to passing characteristics of filter 10F, switching switches SW1a to SW4a from on to off and switching switches SW1b to SW4b from on to off switch the passband to a higher-frequency passband a while the attenuation slope on the passband low-frequency side maintains its steepness and the attenuation slope on the passband high-frequency side maintains its steepness. In other words, in filter 10F, switching switches SW1a to SW4a from on to off can switch the passband to a higher-frequency passband while switching the frequency of the attenuation pole on the passband low-frequency side to a higher frequency, switching the frequency of the attenuation pole on the passband high-frequency side to a higher frequency, and inhibiting an increase in insertion loss at a passband low-frequency edge.

On the other hand, switching switches SW1b to SW4b from off to on can switch the passband to a lower-frequency passband while switching the frequency of the attenuation pole on the passband low-frequency side to a lower frequency, switching the frequency of the attenuation pole on the passband high-frequency side to a lower frequency, and inhibiting an increase in the insertion loss at the passband high-frequency edge.

The following describes switch characteristics of and advantageous effects yielded by filter 10F according to Example 6, in comparison with Comparative Example 6.

Table 14 shows resonator parameters, switch voltages, and insertion losses of a filter according to Comparative Example 6. Table 15 shows resonator parameters, switch voltages, and insertion losses of filter 10F according to Example 6. Table 16 shows differences between Example 6 and Comparative Example 6.

TABLE 16

| Comp. Ex. 6 | Power applied terminal | Stack count Ns of switch | | |
|---|---|---|---|---|
| Comp. Ex. 6 | I/O terminal 101 | Switch SW1a Stack count Ns1a | < | Switch SW4a Stack count Ns4a |
| | | Switch SW1b Stack count Ns1b | < | Switch SW4b Stack count Ns4b |
| Ex. 6 | I/O terminal 102 | Switch SW1a Stack count Ns1a | < | Switch SW4a Stack count Ns4a |
| | | Switch SW1b Stack count Ns1b | < | Switch SW4b Stack count Ns4b |

When switches SW1a to SW4a and switches SW1b to SW4b are on, filter 10F according to Example 6 and the filter according to Comparative Example 6 have first filter characteristics that Band28a-Tx (703 to 733 MHz) is a first

TABLE 14

| Comp. Ex. 6 | Ns (Ct) | SW | fr1 (MHz) | fa1 (MHz) | fr2 (MHz) | fa2 (MHz) | Vs @B28a Tx (V) | Vs @B28b Tx (V) | Vs @B28a Rx (V) | Vs @B28b Rx (V) | Vs @DTV (V) | IL @B28a Tx (dB) | IL @B28b Tx (dB) |
|---|---|---|---|---|---|---|---|---|---|---|---|---|---|
| Parallel-arm circuit P1 | 22 | SW1aOn | 674 | 719 | 782 | 792 | 1.87 | — | 2.23 | — | — | — | — |
| | 29 | SW1bOn | | | | | 0.85 | — | 5.16 | — | — | — | — |
| | 22 | SW1aOff | 710 | 724 | 802 | 811 | — | 14.76 | — | 6.21 | 53.55 | — | — |
| | 29 | SW1bOff | | | | | — | 16.37 | — | 72.37 | 8.48 | — | — |
| Parallel-arm circuit P2 | 3 | SW2aOn | 675 | 716 | 767 | 778 | 0.16 | — | 0.09 | — | — | — | — |
| | 16 | SW2bOn | | | | | 0.51 | — | 1.74 | — | — | — | — |
| | 3 | SW2aOff | 697 | 720 | 779 | 788 | — | 5.37 | — | 0.96 | 39.75 | — | — |
| | 16 | SW2bOff | | | | | — | 14.90 | — | 6.13 | 6.01 | — | — |
| Parallel-arm circuit P3 | 1 | SW3aOn | 679 | 718 | 759 | 772 | 0.07 | — | 0.00 | — | — | — | — |
| | 13 | SW3bOn | | | | | 0.44 | — | 0.15 | — | — | — | — |
| | 1 | SW3aOff | 703 | 722 | 769 | 780 | — | 6.62 | — | 0.40 | 32.00 | — | — |
| | 13 | SW3bOff | | | | | — | 13.82 | — | 0.33 | 2.43 | — | — |
| Parallel-arm circuit P4 | 1 | SW4aOn | 679 | 719 | 759 | 771 | 0.09 | — | 0.00 | — | — | — | — |
| | 9 | SW4bOn | | | | | 0.30 | — | 0.01 | — | — | — | — |
| | 1 | SW4aOff | 708 | 723 | 765 | 779 | — | 11.58 | — | 0.07 | 21.53 | — | — |
| | 9 | SW4bOff | | | | | — | 10.65 | — | 0.06 | 0.31 | — | — |
| Filter charcs. | | | | | | | | | | | | 1.692 | |
| | | | | | | | | | | | | | 1.532 |

TABLE 15

| Ex. 6 | Ns (Ct) | SW | fr1 (MHz) | fa1 (MHz) | fr2 (MHz) | fa2 (MHz) | Vs @B28a Tx (V) | Vs @B28b Tx (V) | Vs @B28a Rx (V) | Vs @B28b Rx (V) | Vs @DTV (V) | IL @B28a Tx (dB) | IL @B28b Tx (dB) |
|---|---|---|---|---|---|---|---|---|---|---|---|---|---|
| Parallel-arm circuit P1 | 8 | SW1aOn | 677 | 719 | 783 | 793 | 0.65 | — | 0.00 | — | — | — | — |
| | 1 | SW1bOn | | | | | 0.03 | — | 0.00 | — | — | — | — |
| | 8 | SW1aOff | 676 | 719 | 759 | 771 | — | 14.67 | — | 0.05 | 21.91 | — | — |
| | 1 | SW1bOff | | | | | — | 15.59 | — | 0.83 | 0.68 | — | — |
| Parallel-arm circuit P2 | 4 | SW2aOn | 675 | 716 | 767 | 778 | 0.21 | — | 0.01 | — | — | — | — |
| | 3 | SW2bOn | | | | | 0.09 | — | 0.00 | — | — | — | — |
| | 4 | SW2aOff | 697 | 720 | 779 | 788 | — | 5.31 | — | 1.90 | 7.85 | — | — |
| | 3 | SW2bOff | | | | | — | 14.72 | — | 7.57 | 2.66 | — | — |
| Parallel-arm circuit P3 | 6 | SW3aOn | 678 | 718 | 760 | 772 | 0.44 | — | 0.15 | — | — | — | — |
| | 4 | SW3bOn | | | | | 0.13 | — | 0.11 | — | — | — | — |
| | 6 | SW3aOff | 703 | 722 | 769 | 780 | — | 6.48 | — | 3.76 | 13.75 | — | — |
| | 4 | SW3bOff | | | | | — | 14.11 | — | 7.57 | 2.66 | — | — |
| Parallel-arm circuit P4 | 18 | SW4aOn | 676 | 719 | 7.59 | 771 | 1.58 | — | 0.70 | — | — | — | — |
| | 8 | SW4bOn | | | | | 0.28 | — | 0.62 | — | — | — | — |
| | 18 | SW4aOff | 708 | 723 | 766 | 779 | — | 11.11 | — | 19.06 | 44.37 | — | — |
| | 8 | SW4bOff | | | | | — | 11.02 | — | 19.98 | 3.14 | — | — |
| Filter charcs. | | | | | | | | | | | | 1.548 | |
| | | | | | | | | | | | | | 1.532 | passband, and Band28a-Rx (758 to 788 MHz) is a first attenuation band, as illustrated in FIGS. 22 and 23. When switches SW1a to SW4a and switches SW1b to SW4b are off, filter 10F according to Example 6 and the filter according to Comparative Example 6 have second filter characteristics that Band28b-Tx (773 to 803 MHz) is a second passband, and Band28b-Rx (718 to 748 MHz) and the digital television (DTV) band (470 to 710 MHz) are second attenuation bands. Thus, filter 10F according to Example 6 and the filter according to Comparative Example 6 are frequency-tunable high-frequency filters (tunable filters) that switch between filter characteristics according to the switching between on and off of switches SW1a to SW4a and switches SW1b to SW4b.

Here, voltages V1a to V4a across switches SW1a to SW4a and voltages V1b to V4b across switches SW1b to SW4b in the passband and the attenuation band are to be evaluated.

In Comparative Example 6, power is applied through input/output terminal 101, whereas in Example 6, power is applied through input/output terminal 102.

In Comparative Example 6, when switches SW1a to SW4a and switches SW1b to SW4b are off, a total of voltages Vs across the switches is 164.04 V (additional value of Vs@DTV in Table 14). In contrast, in Example 6, a total of voltages Vs across switches SW1a to SW4a and switches SW1b to SW4b when the switches are off is 96.72 V (additional value of Vs@DTV in Table 15). Specifically, a total of stack counts Ns of the switches in Example 6 can be made lower than that in Example 6. Thus, according to Example 6, power durability properties that filter 10F is to have are ensured, and also reduction in size of filter 10F and passband insertion loss when the switches are on can be achieved.

As shown in Tables 14 and 15 and the third graphs from the top and the bottom right graphs in FIGS. 22 and 23, if lower resonant frequency Fr1off and higher resonant frequency Fr2off of a parallel-arm circuit when the switches are off is high, voltage Vs across each switch tends to be low. However, in Comparative Example 6 in which power is applied through input/output terminal 101 closer to parallel-arm circuit P1 having higher resonant frequencies Fr1off and Fr2off, power is distributed to other parallel-arm circuits P2 to P4, and a total of voltages applied to the switches is increased. Accordingly, in Example 6 in which power is applied through input/output terminal 102 closer to parallel-arm circuit P4 having lower resonant frequencies Fr1off and Fr2off, stack counts Ns4a and Ns4b of switches SW4a and SW4b increase, yet a total of stack counts Ns of each switch can be decreased. In Comparative Example 6 (Table 14), a total stack count is 168, whereas in Example 6 (Table 15), a total stack count is 104.

In Example 6, the stack counts of switches SW4a and SW4b are high, and thus the resistance of switches SW4a and SW4b in the on state is high. In contrast, the resistance of switches SW4a and SW4b in the on state can be reduced by increasing gate width W4a of semiconductor elements (FETs) of switch SW4a and gate width W4b of semiconductor elements (FETs) of switch SW4b. Specifically, power durability properties that filter 10F is to have are ensured and also reduction in size of filter 10F and passband insertion loss when the switches are on can be achieved by making stack count Ns1a of switch SW1a lower than stack count Ns4a of switch SW4a, making stack count Ns1b of switch SW1b lower than stack count Ns4b of switch SW4b, making gate width W4a of switch SW4a greater than gate width W1a of switch SW1a, and making gate width W4b of switch SW4b greater than gate width W1b of switch SW1b.

According to filter 10F according to Example 6 as described above:

(1) In a configuration in which voltage V1a across switch SW1a is lower than voltage V4a across switch SW4a, and voltage V1ib across switch SW1b is lower than voltage V4b across switch SW4b, power durability that filter 10F is to have is ensured, and also reduction in size of filter 10F and passband insertion loss when the switches are conducting can be achieved by making stack count Ns1a of switch SW1a lower than stack count Ns4a of switch SW4a, and making stack count Ns1b of switch SW1b lower than stack count Ns4b of switch SW4b.

(2) Switching between the conducting and non-conducting states of switches can change the frequency of the attenuation pole on the passband low-frequency side, and the frequency of the attenuation pole on the passband high-frequency side, without increasing the insertion losses at the passband edges.

(3) Passband insertion loss when switches are conducting can be reduced by making gate width W4a of switch SW4a greater than gate width W1a of switch SW1a, and making gate width W4b of switch SW4b greater than gate width W1b of switch SW1b.

Embodiment 2

The filters described in Embodiment 1 above and the examples thereof are applicable to a multiplexer and a high-frequency front-end circuit for a system in which a large number of bands are used. In view of this, in the present embodiment, such a multiplexer, such a high-frequency front-end circuit, and a communication device are to be described.

Figure 24:
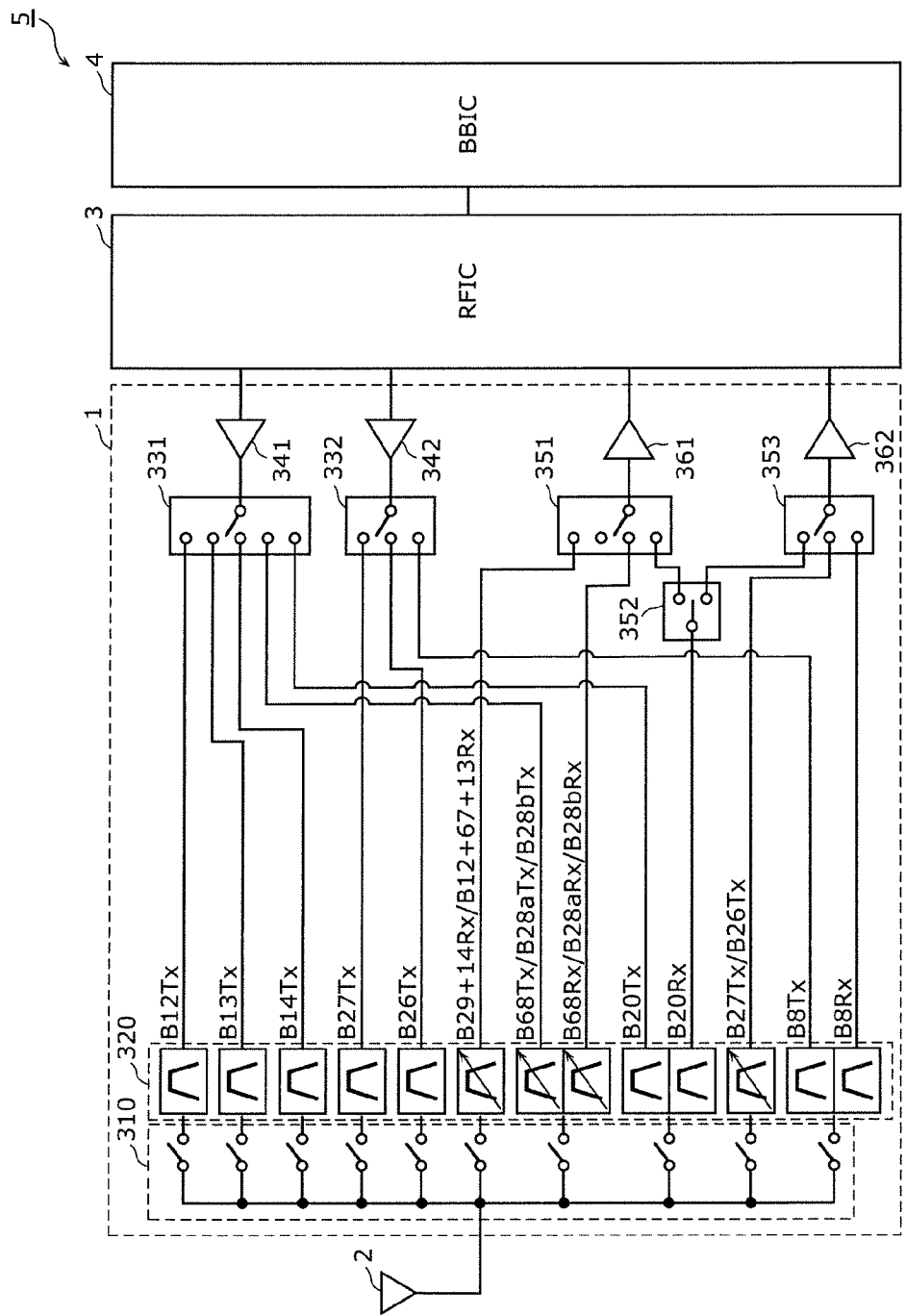
FIG. 24 is a configuration diagram of a communication device according to Embodiment 2.

FIG. 24 is a configuration diagram of communication device 5 according to Embodiment 2.

As illustrated in FIG. 24, communication device 5 includes switch group 310 that includes a plurality of switches, filter group 320 that includes a plurality of filters, transmitter switches 331 and 332, receiver switches 351, 352, and 353, transmission amplifier circuits 341 and 342, receiving amplifier circuits 361 and 362, radio frequency (RF) signal processing circuit (RFIC) 3, baseband signal processing circuit (baseband integrated circuit (BBIC)) 4, and antenna element 2.

Switch group 310 connects antenna element 2 and a signal path for a predetermined band, according to a control signal from a controller (not illustrated), and includes a plurality of single-pole single-throw (SPST) switches, for example. Note that not only one signal path but also a plurality of signal paths may be connected to antenna element 2. Specifically, communication device 5 may support carrier aggregation.

Filter group 320 includes a plurality of filters (including a duplexer) having the following passbands, for example. Specifically, such bands include (i) the transmission band of Band 12, (ii) the transmission band of Band 13, (iii) the transmission band of Band 14, (iv) the transmission band of Band 27, (v) the transmission band of Band 26, (vi) the receiving bands of Band 29 and Band 14 or of Band 12, Band 67, and Band 13, (vii-Tx) the transmission band of Band 68, Band 28a, or Band 28b, (vii-Rx) the receiving band of Band 68, Band 28a, or Band 28b, (viii-Tx) the transmission band of Band 20, (viii-Rx) the receiving band of Band 20, (ix-Tx) the transmission band of Band 27 or Band 26, (x-Tx) the transmission band of Band 8, and (x-Rx) the receiving band of Band 8.

Transmitter switch 331 is a switch circuit that includes a plurality of selection terminals connected to a plurality of transmitter signal paths on a low band side where the center frequency of filter group 320 is low, and a common terminal connected to transmission amplifier circuit 341. Transmitter switch 332 is a switch circuit that includes a plurality of selection terminals connected to a plurality of transmitter signal paths on a high band side where the center frequency of filter group 320 is high, and a common terminal connected to transmission amplifier circuit 342. Transmitter switches 331 and 332 are switch circuits that are disposed upstream from filter group 320 (here, upstream of the transmitter signal paths), and the connected states of which are changed according to control signals from the controller (not illustrated). Accordingly, high-frequency signals (here, high-frequency signals to be transmitted) amplified by transmission amplifier circuits 341 and 342 are output to antenna element 2 through predetermined filters of filter group 320.

Receiver switch 351 is a switch circuit that includes a plurality of selection terminals connected to a plurality of receiver signal paths on the low band side, and a common terminal connected to receiving amplifier circuit 361. Receiver switch 352 is a switch circuit that includes a common terminal connected to a receiver signal path for a predetermined band (here, Band 20), and two selection terminals connected to one of the selection terminals of receiver switch 351 and one of the selection terminals of receiver switch 353. Receiver switch 353 is a switch circuit that includes a plurality of selection terminals connected to a plurality of receiver signal paths on the high band side, and a common terminal connected to receiving amplifier circuit 362. Receiver switches 351 to 353 are disposed downstream from filter group 320 (here, downstream of the receiver signal paths), and the connected states thereof are changed according to control signals from the controller (not illustrated). Accordingly, high-frequency signals (here, high-frequency signals received) input to antenna element 2 are amplified by receiving amplifier circuits 361 and 362 after passing through predetermined filters of filter group 320, and are output to an RF signal processing circuit (RFIC). Note that an RF signal processing circuit (RFIC) for a low band and an RF signal processing circuit (RFIC) for a high band may be individually disposed.

Transmission amplifier circuit 341 is a power amplifier that amplifies power of a low-band high-frequency signal to be transmitted, and transmission amplifier circuit 342 is a power amplifier that amplifies power of a high-band high-frequency signal to be transmitted.

Receiving amplifier circuit 361 is a low-noise amplifier that amplifies power of a low-band high frequency signal received, and receiving amplifier circuit 362 is a low-noise amplifier that amplifies power of a high-band high frequency signal received.

RF signal processing circuit (RFIC) 3 processes high-frequency signals transmitted and received by antenna element 2. Specifically, RF signal processing circuit (RFIC) 3 processes a high-frequency signal (here, a high-frequency signal received) input through a receiver signal path from antenna element 2 by down-conversion, for instance, and outputs a received signal generated by being processed to baseband signal processing circuit (BBIC) 4. RF signal processing circuit (RFIC) 3 processes a signal to be transmitted input from baseband signal processing circuit (BBIC) 4 by up-conversion, for instance, and outputs a high-frequency signal (here, a high-frequency signal to be transmitted) generated by being processed to a transmitter signal path.

Communication device 5 having such a configuration includes the filter(s) according to any one of Embodiment 1 and the examples thereof, as at least one of (vi) a filter having passbands that are receiving bands of Band 29 and Band 14 or of Band 12, Band 67, and Band 13, (vii-Tx) a filter having a passband that is a transmission band of Band 68, Band 28a, or Band 28b, (vii-Rx) a filter having a passband that is a receiving band of Band 68, Band 28a, or Band 28b, and (ix-Tx) a filter having a passband that is a transmission band of Band 27 or Band 26. Specifically, the filter(s) switch(es) between frequency ranges of the passbands and between frequency ranges of the attenuation bands, according to control signals.

Note that high frequency front-end circuit 1 includes switch group 310, filter group 320, transmitter switches 331 and 332, receiver switches 351, 352, and 353, transmission amplifier circuits 341 and 342, receiving amplifier circuits 361 and 362, and the controller, out of the elements of communication device 300. Switch group 310 and filter group 320 are included in a multiplexer. Note that the multiplexer according to the present disclosure may have a configuration in which filter group 320 may be connected to a common terminal through switch group 310 as in the present embodiment, or a plurality of filters according to Embodiment 1 are directly connected to a common terminal.

Here, although not illustrated in FIG. 21, the controller may be included in the RF signal processing circuit (RFIC) or constitute a switch IC together with, for instance, the switches that the controller controls.

High-frequency front-end circuit 1 and communication device 5 having the above configuration include the filter(s) according to Embodiment 1 above and the examples thereof, and thus are a high-performance circuit and a high-performance device that can ensure power durability that the circuit and the device are to have, and further achieve reduction in size of the circuit/device and passband insertion loss when the switches are on. Further, the number of filters can be reduced as compared with the case of disposing a filter for each band, and thus the circuit/device can be miniaturized.

High-frequency front-end circuit 1 according to the present embodiment includes transmitter switches 331 and 332 and receiver switches 351 to 353 (switch circuits) disposed upstream/downstream of filter group 320 (high-frequency filters). Accordingly, portions of signal paths through which high-frequency signals are transmitted can be shared. Thus, for example, transmission amplifier circuits 341 and 342 or receiving amplifier circuits 361 and 362 (amplifier circuits) for high-frequency filters can be shared. Consequently, the high-frequency front-end circuit can be miniaturized, and cost therefor can be reduced.

Note that it is sufficient if at least one of transmitter switches 331 and 332 and at least one of receiver switches 351 to 353 are included. Further, the number of transmitter switches 331 and 332 and the number of receiver switches 351 to 353 are not limited to the numbers described above, and for example, one transmitter switch and one receiver switch may be included. Also, the numbers of selection terminals of a transmitter switch and a receiver switch are not limited to the numbers as in the present embodiment, and the transmitter switch and the receiver switch may each include two selection terminals.

Other Embodiments

The above has described the high-frequency filter, the multiplexer, the high-frequency front-end circuit, and the communication device according to the present disclosure, using Embodiments 1 and 2, yet the present disclosure is not limited to the above embodiments. The present disclosure also encompasses another embodiment achieved by combining arbitrary elements in the above embodiments, variations as a result of adding, to the embodiments, various modifications that may be conceived by those skilled in the art without departing from the scope of the present disclosure, and various devices that include the high-frequency filter, the multiplexer, the high-frequency front-end circuit, and the communication device according to the present disclosure.

For example, it is sufficient if two or more parallel-arm circuits are included, and five or more parallel-arm circuits may be included.

Each of the series-arm resonators and the parallel-arm resonators described above may not be limited to a single resonator, but may be achieved by a plurality of split resonators obtained by splitting one resonator.

For example, the controller may be disposed outside RF signal processing circuit (RFIC) 3, and may be disposed in high-frequency front-end circuit 1, for example. Specifically, the configuration of high-frequency front-end circuit 1 is not limited to the configuration described above, and may include a high-frequency filter that includes a frequency-tunable circuit, and a controller that controls on and off of a switch element of the frequency-tunable circuit. High-frequency front-end circuit 1 having such a configuration can switch between frequency ranges of the passband according to a frequency specification that the circuit is to have, while inhibiting an increase in the insertion loss at a passband edge.

The high-frequency filter that includes the switch circuit as described above may be for time division duplex (TDD).

For example, in high-frequency front-end circuit 1 or communication device 5, an inductor or a capacitor may be connected between elements. Note that the inductor may be a line inductor achieved by a line that connects elements.

Note that with regard to the configuration of the switch elements, the configuration of at least one transistor may be different from the configuration of another transistor. Stated differently, in each switch element, transistors may not have the same gate width, but may have different gate widths.

Even the configuration that includes such a switch element yields similar advantageous effects to those as described the above, by satisfying the relation of the gate width described above.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a small filter, a small multiplexer, a small front-end circuit, and a small communication device that are applicable to a multi-band system.

The invention claimed is:

1. A radio frequency filter, comprising:
a series-arm circuit disposed on a path that connects a first input/output terminal and a second input/output terminal;
a first parallel-arm circuit connected to a ground and a first node on the path, between the first input/output terminal and the series-arm circuit, the first parallel-arm circuit including a first parallel-arm resonator, and a first switch circuit connected in series to the first parallel arm resonator; and
a second parallel-arm circuit connected to the ground and a second node on the path, between the series-arm circuit and the second input/output terminal, the second parallel-arm circuit including a second parallel-arm resonator, and a second switch circuit connected in series to the second parallel-arm resonator, wherein
the first switch circuit includes a first switch element that includes one or more semiconductor elements connected in series,
the second switch circuit includes a second switch element that includes one or more semiconductor elements connected in series, and
a first stack count that is a total number of the one or more semiconductor elements connected in series and included in the first switch element is lower than a second stack count that is a total number of the one or more semiconductor elements connected in series and included in the second switch.

2. The radio frequency filter of claim 1, wherein
a voltage across the first switch element is lower than a voltage across the second switch element,
the voltage across the first switch element is dependent on a resonant frequency of the first parallel-arm resonator, and a radio frequency power application direction that indicates which of the first input/output terminal and the second input/output terminal radio frequency power is applied through, and
the voltage across the second switch element is dependent on a resonant frequency of the second parallel-arm resonator and the radio frequency power application direction.

3. The radio frequency filter of claim 1, wherein
the one or more semiconductor elements included in the first switch element are one or more transistors,
the one or more semiconductor elements included in the second switch element are one or more transistors, and
a gate width of each of the one or more transistors included in the second switch element is greater than a gate width of at least one of the one or more transistors included in the first switch element.

4. The radio frequency filter of claim 1, wherein
radio frequency power is applied to the radio frequency filter through the second input/output terminal.

5. The radio frequency filter of claim 1, wherein
the first switch circuit further includes a first capacitor connected in parallel to the first switch element, and
the second switch circuit further includes a second capacitor connected in parallel to the second switch element.

6. The radio frequency filter of claim 1, wherein
the first switch circuit further includes:
a first inductor connected in series to the first switch element; and
a first capacitor connected in parallel to a circuit constituted by the first inductor and the first switch element connected in series, and
the second switch circuit further includes:
a second inductor connected in series to the second switch element; and a second capacitor connected in parallel to a circuit constituted by the second inductor and the second switch element connected in series.

7. The radio frequency filter of claim 6, wherein the first switch circuit includes a plurality of circuits each of which is the circuit constituted by the first inductor and the first switch element connected in series, and the second switch circuit includes a plurality of circuits each of which is the circuit constituted by the second inductor and the second switch element connected in series.

8. The radio frequency filter of claim 5, wherein a resonant frequency of the first parallel-arm circuit under a condition that the first switch element is non-conducting is lower than a resonant frequency of the second parallel-arm circuit under a condition that the second switch element is non-conducting.

9. The radio frequency filter of claim 1, wherein the first parallel-arm circuit further includes a third parallel-arm resonator connected in parallel to a circuit constituted by the first parallel-arm resonator and the first switch circuit connected in series, the second parallel-arm circuit further includes a fourth parallel-arm resonator connected in parallel to a circuit constituted by the second parallel-arm resonator and the second switch circuit connected in series, a resonant frequency of the first parallel-arm resonator is lower than a resonant frequency of the third parallel-arm resonator, an antiresonant frequency of the first parallel-arm resonator is lower than an antiresonant frequency of the third parallel-arm resonator, a resonant frequency of the second parallel-arm resonator is lower than a resonant frequency of the fourth parallel-arm resonator, and an antiresonant frequency of the second parallel-arm resonator is lower than an antiresonant frequency of the fourth parallel-arm resonator.

10. The radio frequency filter of claim 9, wherein a resonant frequency of the first parallel-arm circuit under a condition that the first switch element is non-conducting is lower than a resonant frequency of the second parallel-arm circuit under a condition that the second switch element is non-conducting.

11. The radio frequency filter of claim 1, wherein the first parallel-arm circuit further includes a third parallel-arm resonator connected in parallel to a circuit constituted by the first parallel-arm resonator and the first switch circuit connected in series, the second parallel-arm circuit further includes a fourth parallel-arm resonator connected in parallel to a circuit constituted by the second parallel-arm resonator and the second switch circuit connected in series, a resonant frequency of the first parallel-arm resonator is higher than a resonant frequency of the third parallel-arm resonator, an antiresonant frequency of the first parallel-arm resonator is higher than an antiresonant frequency of the third parallel-arm resonator, a resonant frequency of the second parallel-arm resonator is higher than a resonant frequency of the fourth parallel-arm resonator, and an antiresonant frequency of the second parallel-arm resonator is higher than an antiresonant frequency of the fourth parallel-arm resonator.

12. The radio frequency filter of claim 11, wherein a resonant frequency of the first parallel-arm circuit under a condition that the first switch element is non-conducting is higher than a resonant frequency of the second parallel-arm circuit under a condition that the second switch element is non-conducting.

13. The radio frequency filter of claim 1, wherein the first parallel-arm circuit further includes:
a third parallel-arm resonator; and
a third switch circuit connected in series to the third parallel-arm resonator,
the second parallel-arm circuit further includes:
a fourth parallel-arm resonator; and
a fourth switch circuit connected in series to the fourth parallel-arm resonator,
the third switch circuit includes:
a third capacitor; and
a third switch element that is connected to the third capacitor, and includes one or more semiconductor elements connected in series,
the fourth switch circuit includes:
a fourth capacitor; and
a fourth switch element that is connected to the fourth capacitor, and includes one or more semiconductor elements connected in series,
an impedance of the third switch circuit is changed by switching between a conducting state and a non-conducting state of the third switch element,
an impedance of the fourth switch circuit is changed by switching between a conducting state and a non-conducting state of the fourth switch element,
a circuit constituted by the first parallel-arm resonator and the first switch circuit connected in series and a circuit constituted by the third parallel-arm resonator and the third switch circuit connected in series are connected in parallel, and
a circuit constituted by the second parallel-arm resonator and the second switch circuit connected in series and a circuit constituted by the fourth parallel-arm resonator and the fourth switch circuit connected in series are connected in parallel.

14. The radio frequency filter of claim 13, wherein a lower one of resonant frequencies of the first parallel-arm circuit under a condition that the first switch element is non-conducting is lower than a higher one of resonant frequencies of the second parallel-arm circuit under a condition that the second switch element is non-conducting,
a resonant frequency of the first parallel-arm resonator is lower than a resonant frequency of the third parallel-arm resonator,
an antiresonant frequency of the first parallel-arm resonator is lower than an antiresonant frequency of the third parallel-arm resonator,
a resonant frequency of the second parallel-arm resonator is lower than a resonant frequency of the fourth parallel-arm resonator,
an antiresonant frequency of the second parallel-arm resonator is lower than an antiresonant frequency of the fourth parallel-arm resonator,
a higher one of resonant frequencies of the first parallel-arm circuit under a condition that the third switch element is non-conducting is lower than a higher one of resonant frequencies of the second parallel-arm circuit under a condition that the fourth switch element is non-conducting, and
a third stack count that is a total number of the one or more semiconductor elements connected in series and included in the third switch element is lower than a fourth stack count that is a total number of the one or more semiconductor elements connected in series and included in the fourth switch element.

15. The radio frequency filter of claim 13, wherein
the one or more semiconductor elements included in the third switch element are one or more transistors,
the one or more semiconductor elements included in the fourth switch element are one or more transistors, and
a gate width of each of the one or more transistors included in the fourth switch element is greater than a gate width of at least one of the one or more transistors included in the third switch element.

16. The radio frequency filter according to claim 1, wherein
the radio frequency filter has a ladder filter structure that includes:
two or more series-arm circuits each of which is the series-arm circuit; and
three or more parallel-arm circuits that include the first parallel-arm circuit and the second parallel-arm circuit, and
each of the three or more parallel-arm circuits includes:
a parallel-arm resonator; and
a switch circuit that includes a switch element.

17. A multiplexer, comprising:
a plurality of radio frequency filters that each include:
a series-arm circuit disposed on a path that connects a first input/output terminal and a second input/output terminal;
a first parallel-arm circuit connected to a ground and a first node on the path, between the first input/output terminal and the series-arm circuit, the first parallel-arm circuit including a first parallel-arm resonator, and a first switch circuit connected in series to the first parallel arm resonator; and
a second parallel-arm circuit connected to the ground and a second node on the path, between the series-arm circuit and the second input/output terminal, the second parallel-arm circuit including a second parallel-arm resonator, and a second switch circuit connected in series to the second parallel-arm resonator, wherein
the first switch circuit includes a first switch element that includes one or more semiconductor elements connected in series,
the second switch circuit includes a second switch element that includes one or more semiconductor elements connected in series, and
a first stack count that is a total number of the one or more semiconductor elements connected in series and included in the first switch element is lower than a second stack count that is a total number of the one or more semiconductor elements connected in series and included in the second switch, wherein input terminals or output terminals of the plurality of filters are directly or indirectly connected to a common terminal.

18. Circuitry for processing a radio-frequency signal, the circuitry comprising:
one or more radio frequency filters, the one or more radio frequency filters each comprising
a series-arm circuit disposed on a path that connects a first input/output terminal and a second input/output terminal;
a first parallel-arm circuit connected to a ground and a first node on the path, between the first input/output terminal and the series-arm circuit, the first parallel-arm circuit including a first parallel-arm resonator, and a first switch circuit connected in series to the first parallel arm resonator; and
a second parallel-arm circuit connected to the ground and a second node on the path, between the series-arm circuit and the second input/output terminal, the second parallel-arm circuit including a second parallel-arm resonator, and a second switch circuit connected in series to the second parallel-arm resonator, wherein
the first switch circuit includes a first switch element that includes one or more semiconductor elements connected in series,
the second switch circuit includes a second switch element that includes one or more semiconductor elements connected in series, and
a first stack count that is a total number of the one or more semiconductor elements connected in series and included in the first switch element is lower than a second stack count that is a total number of the one or more semiconductor elements connected in series and included in the second switch; and
an amplifier circuit directly or indirectly connected to the one or more radio frequency filters.

19. The circuitry of claim 18, wherein
the amplifier circuit is a power amplifier that amplifies a radio frequency signal to be transmitted, and
the radio frequency signal amplified by the power amplifier is input through an input terminal of the one or more radio frequency filters.

20. The circuitry of claim 18, comprising:
a radio-frequency (RF) signal processing circuit that processes a radio frequency signal to be transmitted by an antenna element, and a radio frequency signal received by the antenna element, wherein
the radio frequency signals between the antenna element and the RF signal processing circuit are conveyed by at least by the one or radio frequency filters and the amplifier.

* * * * *